(12) United States Patent
van Dal

(10) Patent No.: US 12,713,688 B2
(45) Date of Patent: Aug. 18, 2026

(54) CFET WITH DIFFERENT CHANNEL MATERIALS FOR NFET AND PFET AND METHODS FOR FORMING THE SAME

(71) Applicant: Taiwan Semiconductor Manufacturing Co., Ltd., Hsinchu (TW)

(72) Inventor: Marcus Johannes Henricus van Dal, Linden (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 524 days.

(21) Appl. No.: 18/321,483

(22) Filed: May 22, 2023

(65) Prior Publication Data

US 2024/0274474 A1 Aug. 15, 2024

Related U.S. Application Data

(60) Provisional application No. 63/484,552, filed on Feb. 13, 2023.

(51) Int. Cl.
*H10D 84/03* (2025.01)
*H10D 84/01* (2025.01)
(Continued)

(52) U.S. Cl.
CPC ....... *H10D 84/038* (2025.01); *H10D 84/0167* (2025.01); *H10D 84/017* (2025.01); (Continued)

(58) Field of Classification Search
CPC ..... H10D 84/85; H10D 84/0186; H10D 88/01
See application file for complete search history.

(56) References Cited

U.S. PATENT DOCUMENTS

2021/0098306 A1 4/2021 Smith et al.
2022/0246742 A1 8/2022 Pal et al.
(Continued)

FOREIGN PATENT DOCUMENTS

TW 202236434 A 9/2022
TW 202236516 A 9/2022
(Continued)

OTHER PUBLICATIONS

Seong Kwang Kim et al., "Heterogeneous 3D Sequential CFET with Ge (110) Nanosheet p-FET on Si (100) bulk n-FET by Direct Wafer Bonding", International Electron Devices Meeting (IEDM), Dec. 3-7, 2022, pp. 471-474.

*Primary Examiner* — Fernando L Toledo
*Assistant Examiner* — Adam S Bowen
(74) *Attorney, Agent, or Firm* — Slater Matsil, LLP

(57) ABSTRACT

A method includes forming a Complimentary Field-Effect Transistor (CFET) including forming an n-type transistor and a p-type transistor overlapping the n-type transistor. The formation of the n-type transistor includes forming a first channel region comprising a first semiconductor material, and forming an n-type source/drain region on a side of, and connecting to, the first channel region. The formation of the p-type transistor includes forming a second channel region comprising a second semiconductor material different from the first semiconductor material, and forming a p-type source/drain region on a side of, and connecting to, the second channel region.

20 Claims, 52 Drawing Sheets

(51) Int. Cl.
*H10D 84/85* (2025.01)
*H10D 88/00* (2025.01)

(52) U.S. Cl.
CPC ....... *H10D 84/0193* (2025.01); *H10D 84/853* (2025.01); *H10D 84/856* (2025.01); *H10D 88/00* (2025.01)

(56) References Cited

U.S. PATENT DOCUMENTS

| | | | | |
|---|---|---|---|---|
| 2022/0285533 | A1 | 9/2022 | Lee et al. | |
| 2022/0293759 | A1 | 9/2022 | Chou et al. | |
| 2024/0021586 | A1* | 1/2024 | Li | H10D 84/85 |

FOREIGN PATENT DOCUMENTS

| | | | |
|---|---|---|---|
| TW | 202247463 | A | 12/2022 |
| WO | 2021061376 | A1 | 4/2021 |

* cited by examiner 28
22'
26'
24'
15
12/13/14
16

CFET WITH DIFFERENT CHANNEL MATERIALS FOR NFET AND PFET AND METHODS FOR FORMING THE SAME

PRIORITY CLAIM AND CROSS-REFERENCE

This application claims the benefit of the following provisionally filed U.S. Patent application: Application No. 63/484,552, filed on Feb. 13, 2023, and entitled "A Si NMOS/Ge PMOS CFET Integration Flow," which application is hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the minimum feature sizes are reduced, however, additional problems arise and should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C through FIGS. 33A, 33B, and 33C illustrate the cross-sectional views of intermediate stages in the formation of a Complementary Field-Effect Transistors (CFETs) in accordance with some embodiments.

DETAILED DESCRIPTION

Figures 1A, 1B, 1C:
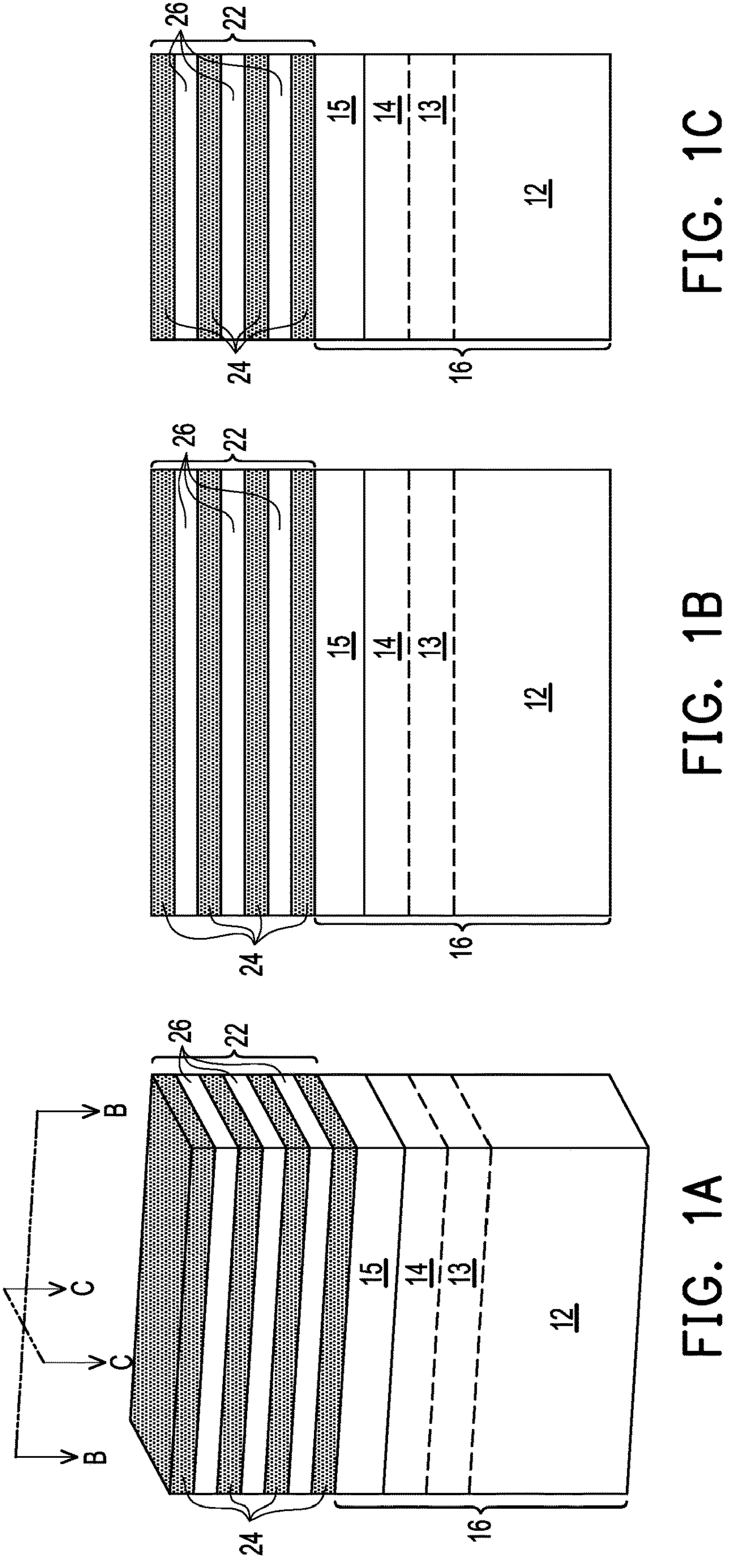

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Complementary Field-Effect Transistor (CFET) structure and the method of forming the same are provided. In accordance with some embodiments of the present disclosure, the CFET includes an n-type FET (NFET) and a p-type FET (PFET), which are formed based on a first channel material and a second channel material, respectively, with the second channel material being different from the first channel material. For example, the channel material of the NFET may be silicon (or silicon germanium with a lower germanium atomic percentage), while the channel material of the PFET may be germanium (or silicon germanium with a higher germanium atomic percentage). The front-end interconnect structures of the NFET and PFET are on the opposite sides of the combined region including the NFET and PFET. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, and 1C illustrate a perspective view and two cross-sectional views of an initial structure. The cross-sectional views shown in FIGS. 1B and 1C are obtained from the cross-sections B-B and C-C, respectively, as shown in FIG. 1A. In subsequent FIGS. 2A, 2B, and 2C through FIGS. 33A, 33B, and 33C, the figures having digits followed by letter "A" illustrate perspective views. The figures having digits followed by letter "B" illustrate the cross-sectional views along a similar cross-section as FIG. 1B, and the figures having digits followed by letter "C" illustrate the cross-sectional views along a similar cross-section as FIG. 1C.

As shown in FIGS. 1A, 1B, and 1C, substrate 16, which is a part of a wafer, is formed. In accordance with some embodiments, substrate 16 comprises bulk substrate 12, silicon-containing dielectric layer 13 over and contacting bulk substrate 12, silicon germanium (SiGe) layer 14 over and contacting silicon-containing dielectric layer 13, silicon-containing dielectric layer 15 over and contacting SiGe layer 14, and dummy semiconductor layer 24 over silicon-containing dielectric layer 15. Dummy semiconductor layer 24 may be formed of SiGe having a germanium atomic percentage in the range between about 10 percent and about 50 percent, while silicon germanium (SiGe) layer 14 may have a higher germanium atomic percentage such as in the range between about 60 percent and about 80 percent. The formation process and the composition of the layers in the corresponding substrate 16 is discussed separately referring to FIGS. 38 through 41.

In accordance with alternative embodiments, the silicon-containing dielectric layer 13 is not formed, and SiGe layer 14 is over and contacting bulk substrate 12 directly. The formation process and the composition of the layers in the corresponding substrate 16 is discussed separately referring to FIGS. 34 through 37. In subsequent figures, the details of substrate 16 are not illustrated, and the portion of substrate 16 underlying silicon-containing dielectric layer 15 is referred to using notation "Dec. 13, 2014."

Figure 42:
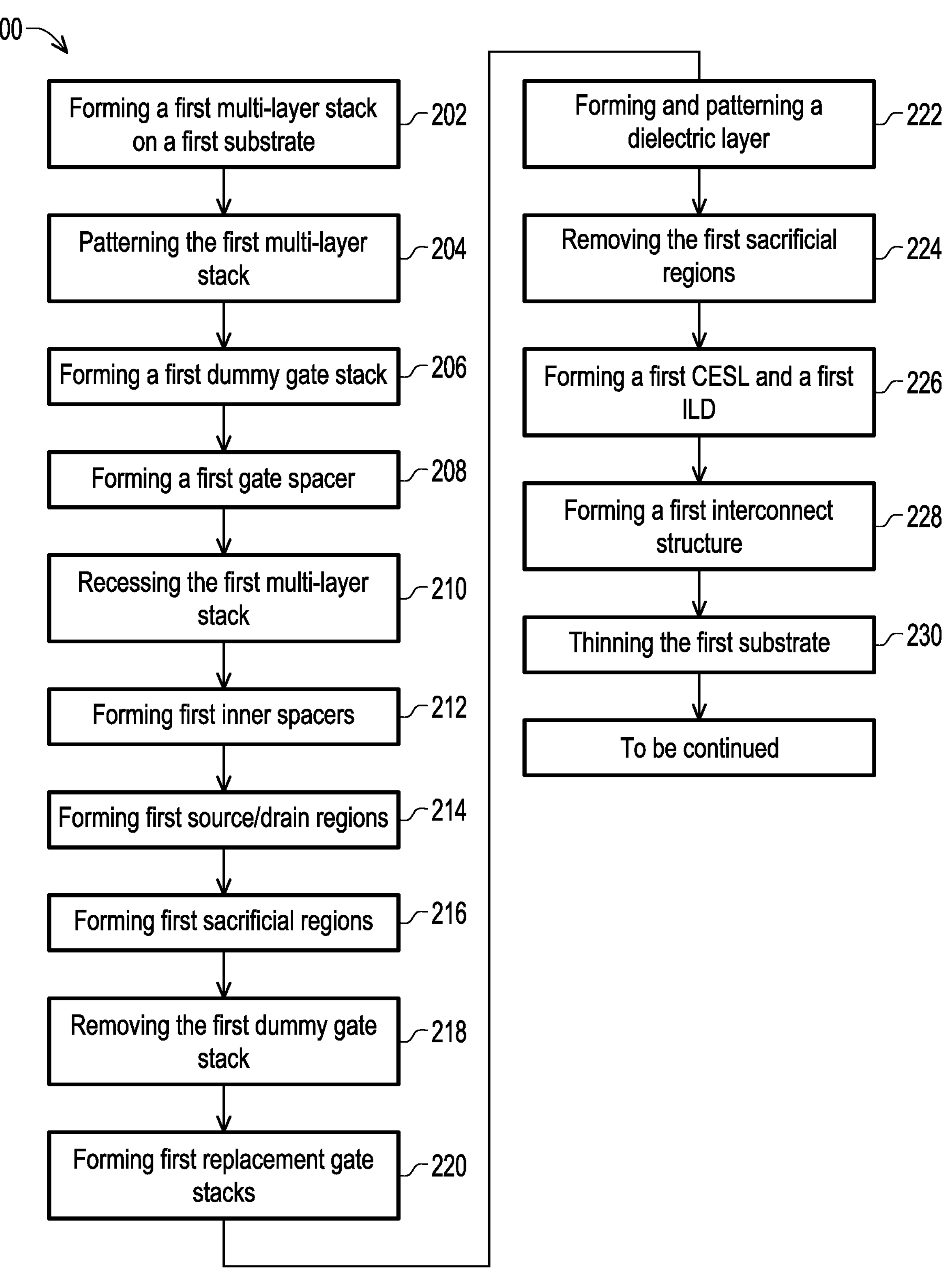
FIG. 42 illustrates a process flow for forming a CFET in accordance with some embodiments.
Figure 42:
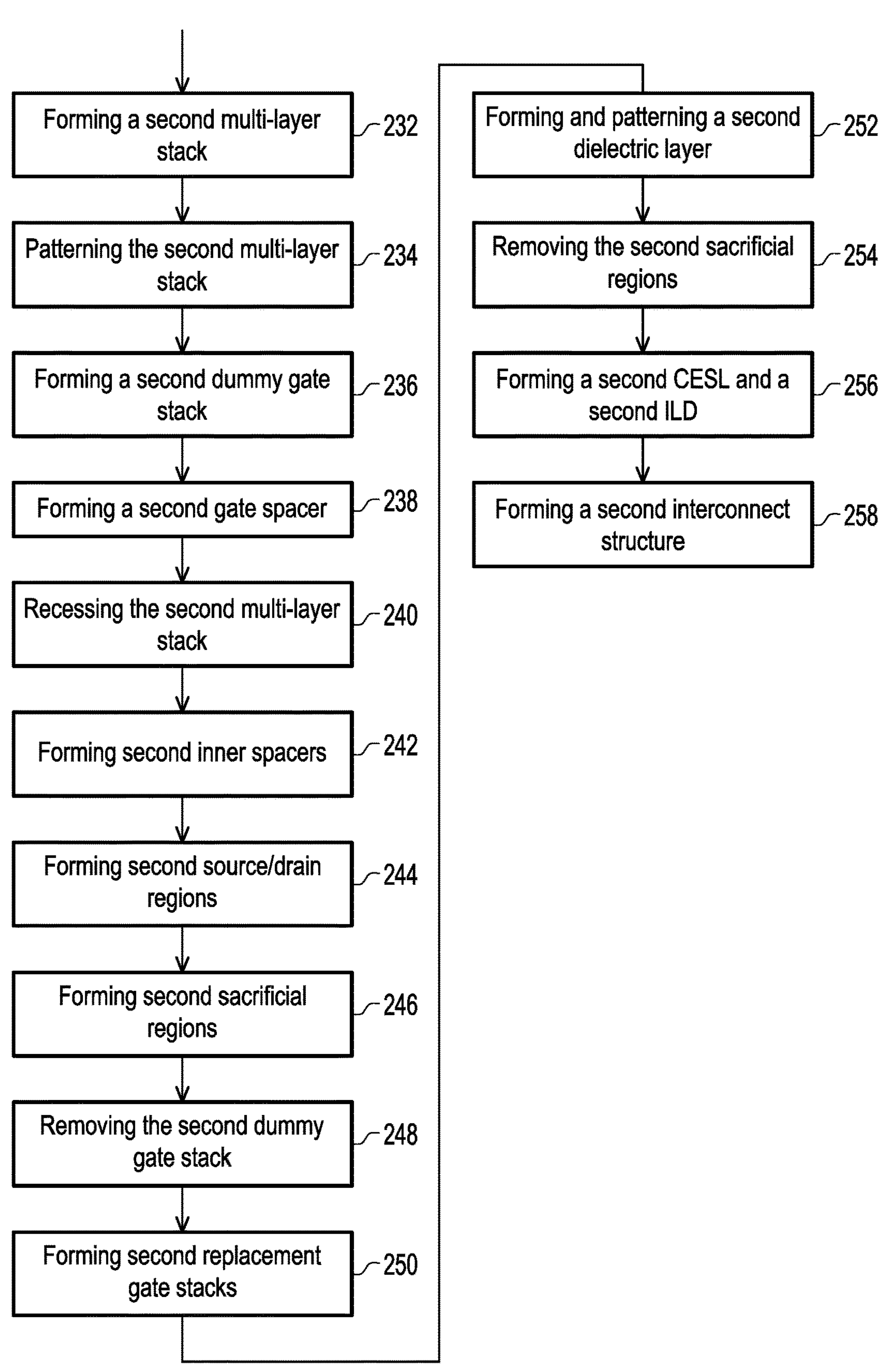

As further illustrated in FIGS. 1A, 1B, and 1C, a plurality of semiconductor layers are formed. The plurality of semiconductor layers include more dummy semiconductor layers 24 (in addition to the semiconductor layer 14 in substrate 16), and semiconductor layers 26, with dummy semiconductor layers 24 and semiconductor layers 26 being located alternatingly. The dummy semiconductor layers 24 and semiconductor layers 26 are collectively referred to as multi-layer stack 22. The respective process is illustrated as process 202 in the process flow 200 as shown in FIG. 42. It is appreciated that the numbers of the illustrated dummy semiconductor layers 24 and semiconductor layers 26 are examples, and the actual numbers may include any number. Each layer of the multi-layer stack 22 may be grown by a process such as Vapor Phase Epitaxy (VPE) or Molecular Beam Epitaxy (MBE), deposited by a process such as a Chemical Vapor Deposition (CVD) process, an Atomic Layer deposition (ALD) process, or the like.

In some embodiments, dummy semiconductor layers 24 are formed of or comprise silicon germanium. The germanium atomic percentage in dummy semiconductor layers 24 may be in the range between about 10 percent and about 50 percent, and may be in the range between about 30 percent and about 50 percent. Semiconductor layers 26 may comprise silicon, and is free from germanium. For example, the atomic percentage of silicon may be greater than 95 percent or greater than 99 percent. Alternatively, semiconductor layers 26 comprise silicon germanium having a lower germanium atomic percentage than dummy semiconductor layers 24. For example, the germanium in semiconductor layers 26 may be lower than about 5 percent.

Figure 2C:
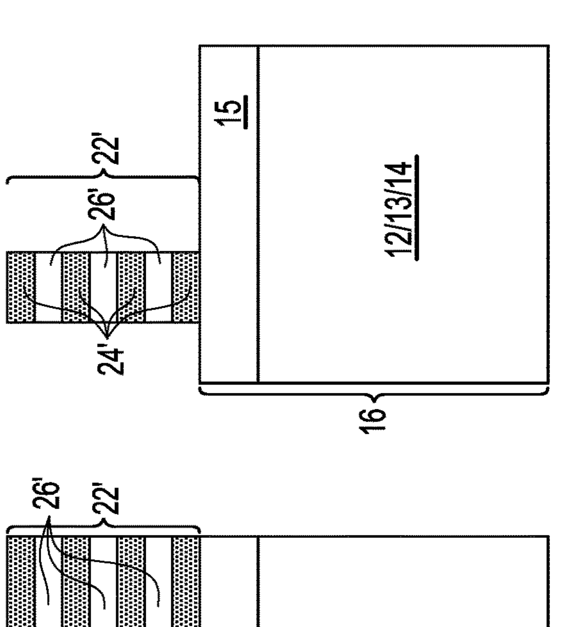
Figure 2B:
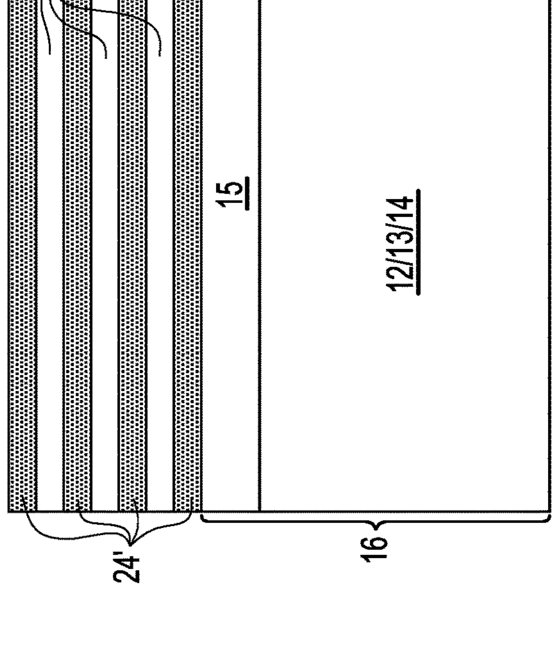
Figure 2B:
Figure 2A:
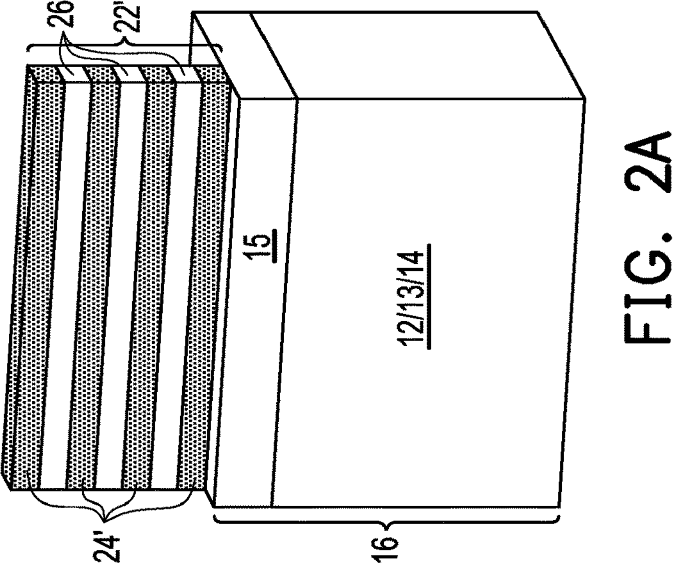
Figures 3A, 3B, 3C:
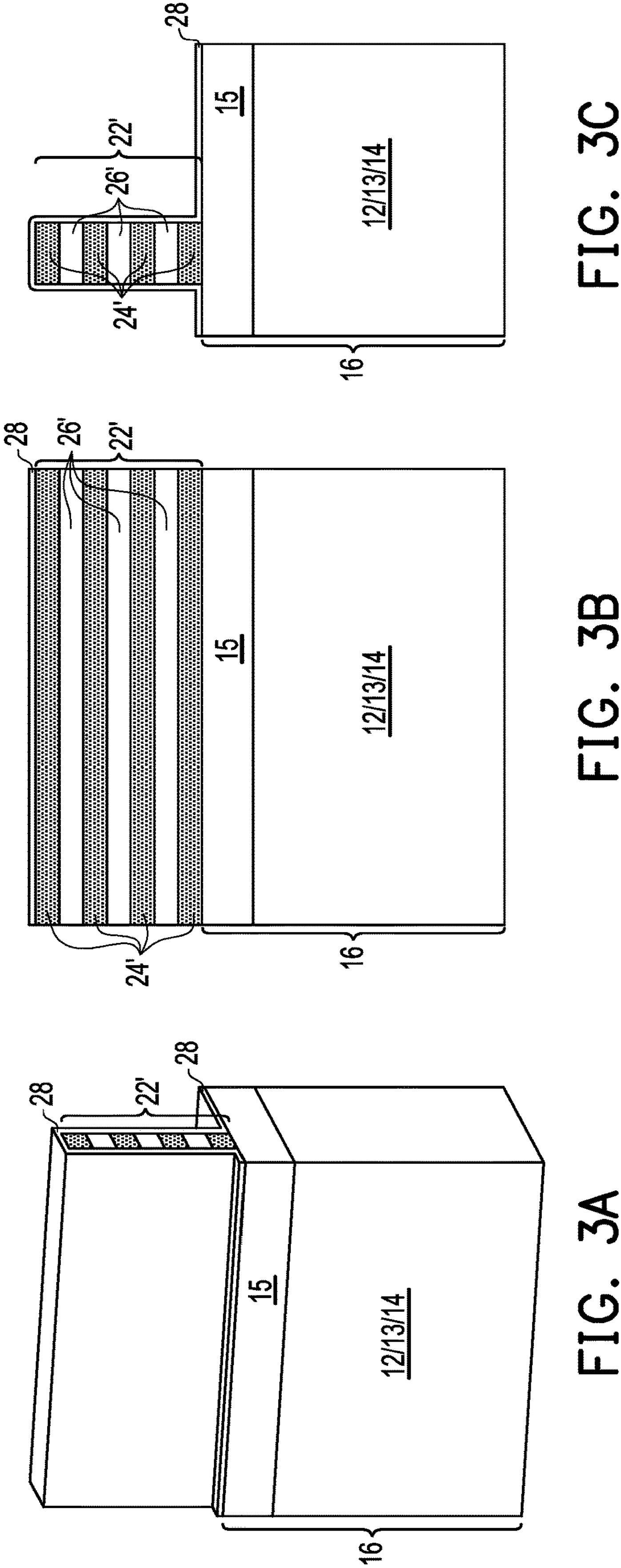
Figures 4A, 4B, 4C:
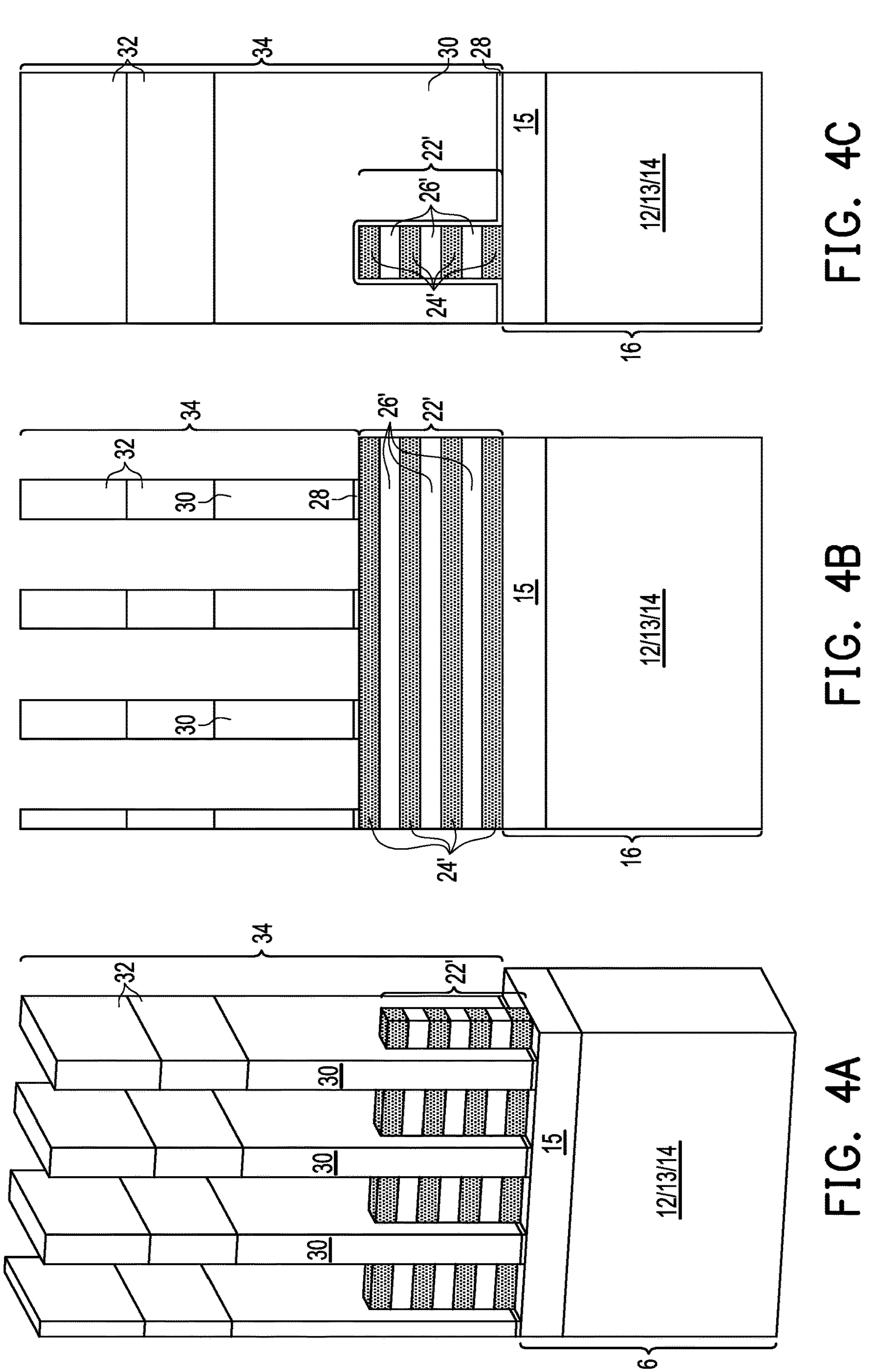

In FIGS. 2A, 2B, and 2C, multi-layer stack 22 is patterned to form multi-layer stack 22', which is the remaining portion of multi-layer stack 22. The respective process is illustrated as process 204 in the process flow 200 as shown in FIG. 42. The remaining portions 22' of multi-layer stack 22 are also referred to as nanostructures hereinafter, which are referred to using the corresponding reference number followed by a "'" sign. Accordingly, multi-layer stack 22' includes dummy nanostructures 24' and semiconductor nanostructures 26', and are also referred to as a semiconductor fin. The etching may be performed using any acceptable etch process, such as a Reactive Ion Etch (RIE) process, a Neutral Beam Etch (NBE) process, or the like. The etching may be anisotropic.

The semiconductor fins and the nanostructures may be patterned by any suitable method. For example, the patterning process may include one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as an etching mask for the patterning process.

Referring to 3A, 3B, and 3C, dummy gate dielectric layer 28 is formed. Dummy dielectric layer 28 may be formed of or comprise, for example, silicon oxide, silicon nitride, a combination thereof, or the like, and may be deposited or thermally grown according to acceptable techniques.

As shown in 4A, 4B, and 4C, dummy gate layer 30 is formed over the dummy dielectric layer 28. The dummy gate layer 30 may be deposited, for example, through Physical Vapor Deposition (PVD), CVD, or other techniques, and is planarized, such as by a CMP process. The material of dummy gate layer 30 may be conductive or non-conductive, and may be selected from a group including amorphous silicon, polycrystalline-silicon (polysilicon), poly-crystalline silicon-germanium (poly-SiGe), or the like. Mask layer(s) 32 are formed over the planarized dummy gate layer 30, and may include, for example, silicon nitride, silicon oxynitride, or the like. Next, the mask layers 32 may be patterned through photolithography and etching processes to form a mask, which is then used to etch and pattern dummy gate layer 30, and possibly dummy dielectric layer 28. The remaining portions of mask layers 32, dummy gate layer 30, and dummy dielectric layer 28 form dummy gate stacks 34. The respective process is illustrated as process 206 in the process flow 200 as shown in FIG. 42.

Figures 5A, 5B, 5C:
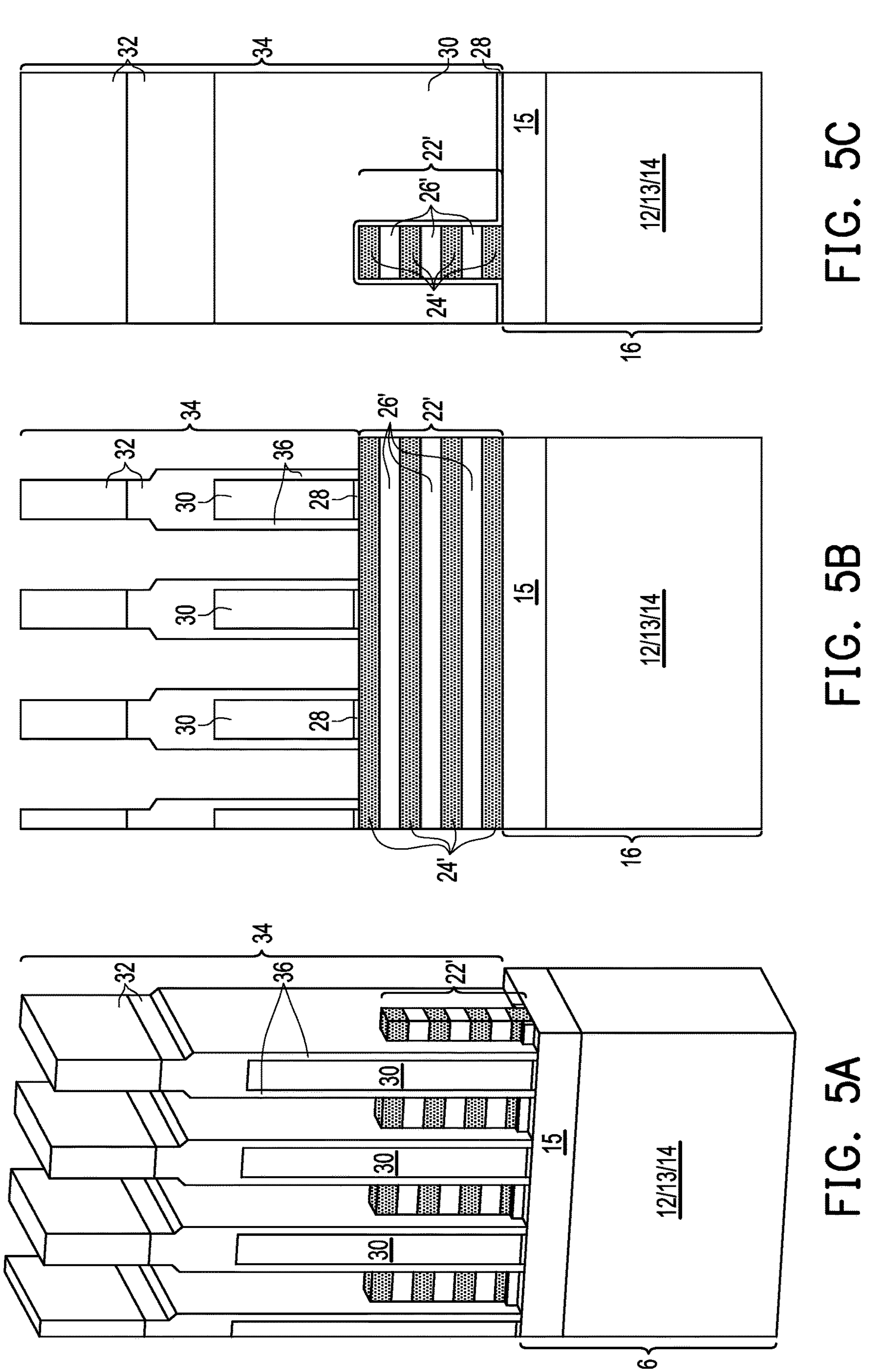

In FIGS. 5A, 5B, and 5C, gate spacers 36 are formed over the multi-layer stacks 22' and on exposed sidewalls of dummy gate stacks 34. The respective process is illustrated as process 208 in the process flow 200 as shown in FIG. 42. The gate spacers 36 may be formed by conformally forming one or more dielectric layers and subsequently etching the dielectric layers anisotropically. The applicable dielectric materials may include silicon oxide, silicon nitride, silicon oxynitride, silicon oxycarbonitride, or the like, which may be formed by a deposition process such as CVD, ALD, or the like.

Figures 6A, 6B, 6C:
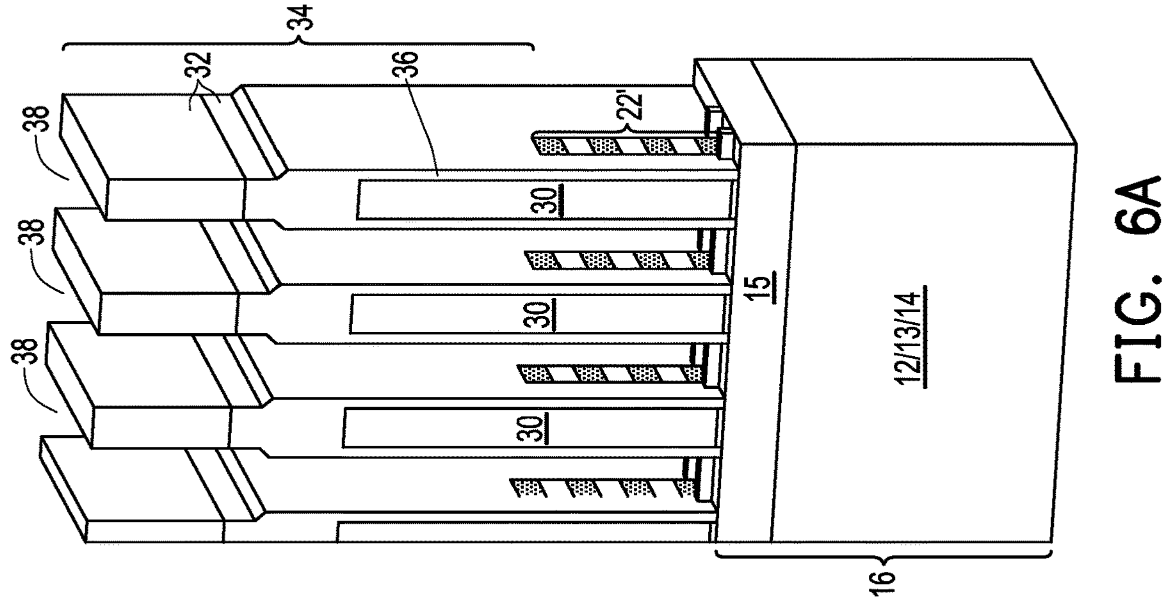

Referring to FIGS. 6A, 6B, and 6C, source/drain recesses 38 are formed in multi-layer stack 22'. The respective process is illustrated as process 210 in the process flow 200 as shown in FIG. 42. The source/drain recesses 38 are formed through etching, and may extend through the multi-layer stacks 22', so that dummy nanostructures 24' are exposed. In the etching processes, the gate spacers 36 and the dummy gate stacks 34 mask some portions of the multi-layer stack 22'.

Figures 7A, 7B, 7C:
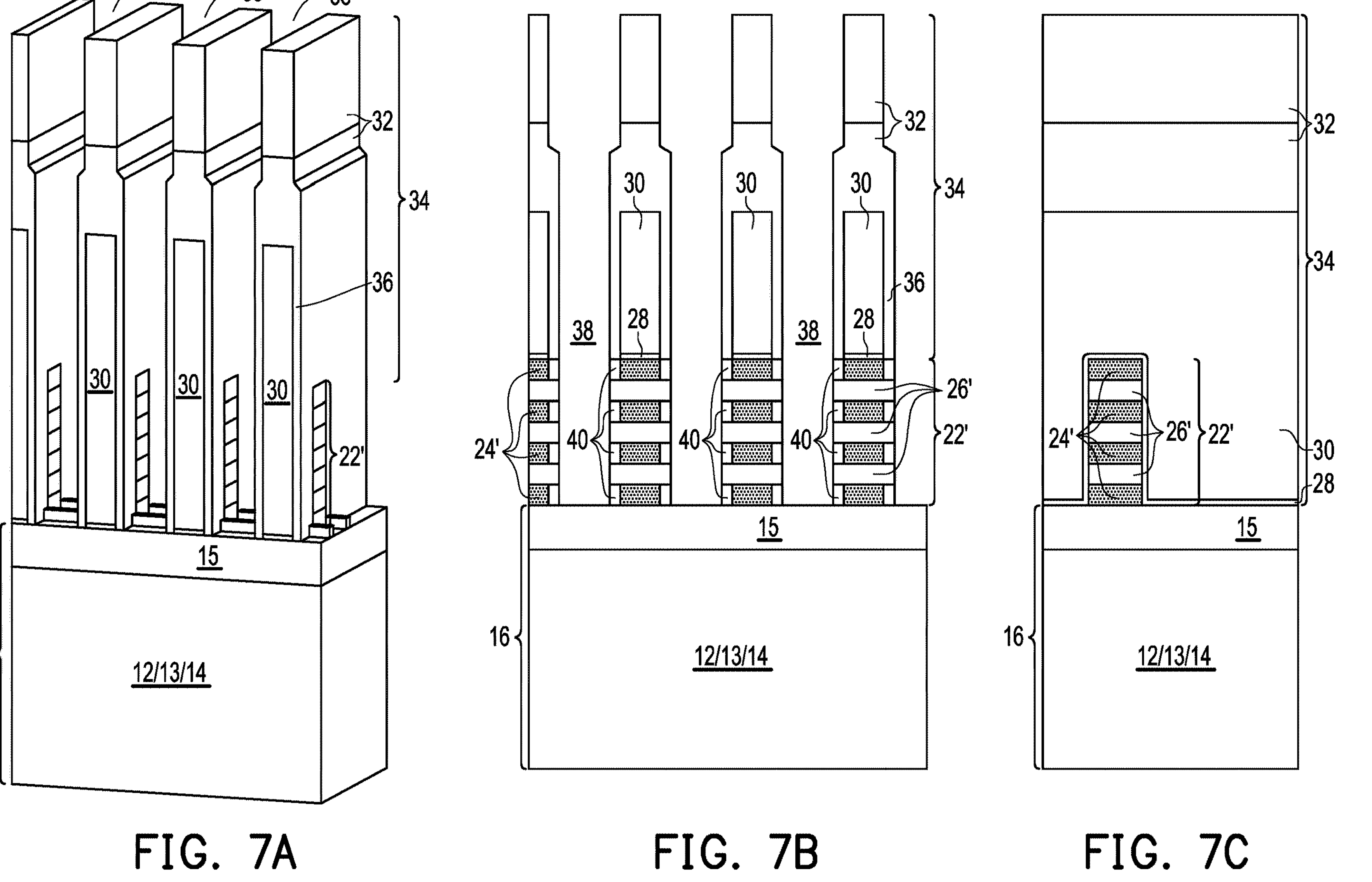

Referring to FIGS. 7A, 7B, and 7C, inner spacers 40 are formed. The respective process is illustrated as process 212 in the process flow 200 as shown in FIG. 42. In the formation process, the sidewalls of the dummy nanostructures 24' are first recessed through an etch process, which is isotropic, to form lateral recesses. The etching is selective to the material of the dummy nanostructures 24'. A dielectric material is then deposited to extend into the lateral recesses, and an etching process is performed to remove the portions of the dielectric material outside of the lateral recesses. The remaining portions of the dielectric material form inner spacers 40.

Figures 8A, 8B, 8C:
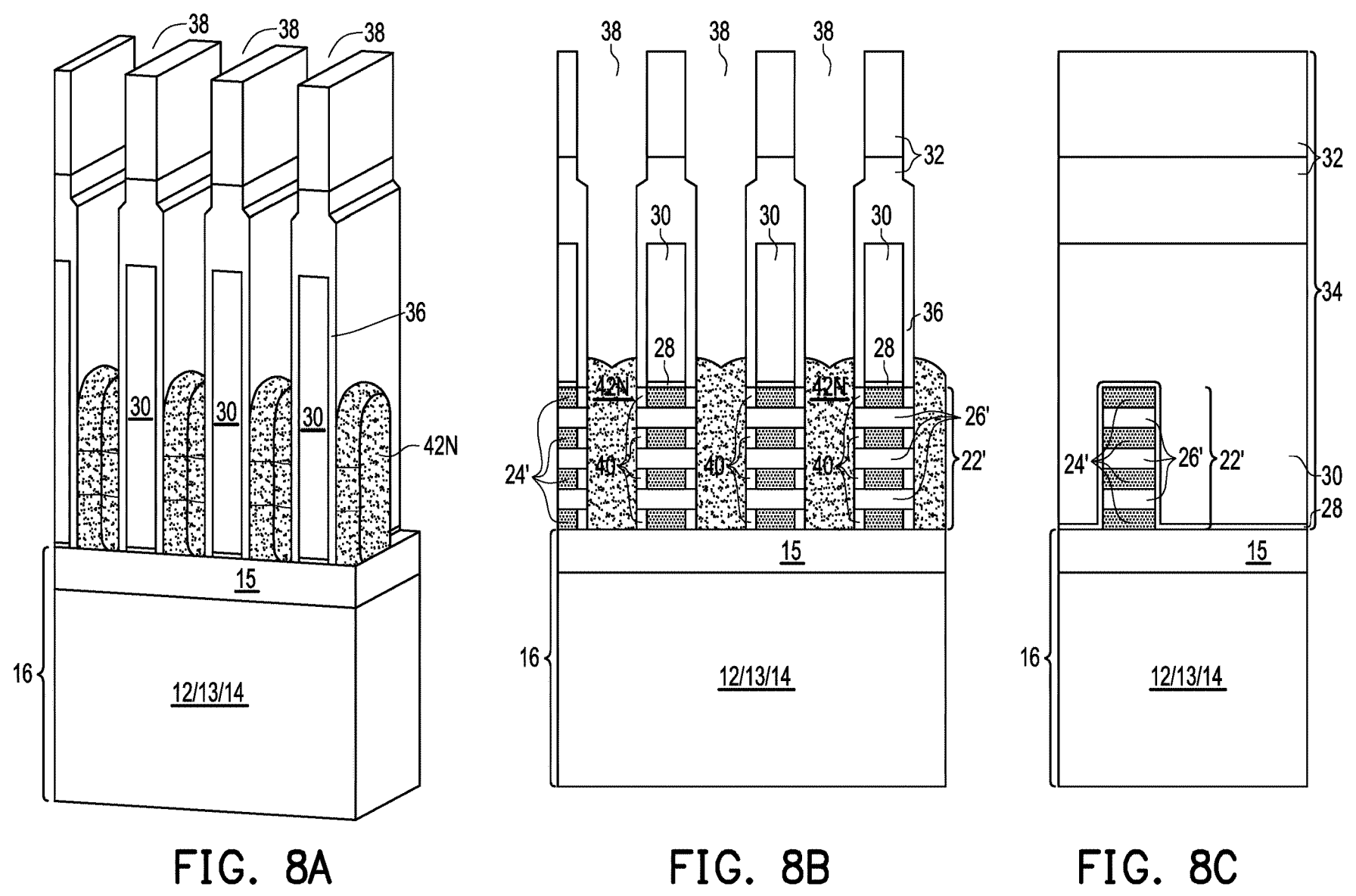

In FIGS. 8A, 8B, and 8C, epitaxial source/drain regions 42N are formed in the lower portions of the source/drain recesses 38. The respective process is illustrated as process 214 in the process flow 200 as shown in FIG. 42. Source/drain regions refer to source and/or drain regions, depending on the context. The epitaxial source/drain regions 42N are in contact with the lower semiconductor nanostructures 26', which form the channel regions of the respective NFET. Inner spacers 40 electrically insulate the epitaxial source/drain regions 42N from the dummy nanostructures 24', which will be replaced with replacement gates in subsequent processes.

It is appreciated that although in the example embodiments, NFET is formed before the formation of the PFET, the NFET may also be formed after the formation of the PFET in accordance with alternative embodiments, and the corresponding materials and structures may be realized from the disclosure of the example embodiments.

The epitaxial source/drain regions 42N are epitaxially grown. The respective material may include silicon or carbon-doped silicon, which is doped with an n-type dopant such as phosphorous, arsenic, or the like. The epitaxial source/drain regions 42N may be in-situ doped, and may be, or may not be, implanted with an n-type dopant.

Figures 9A, 9B, 9C:
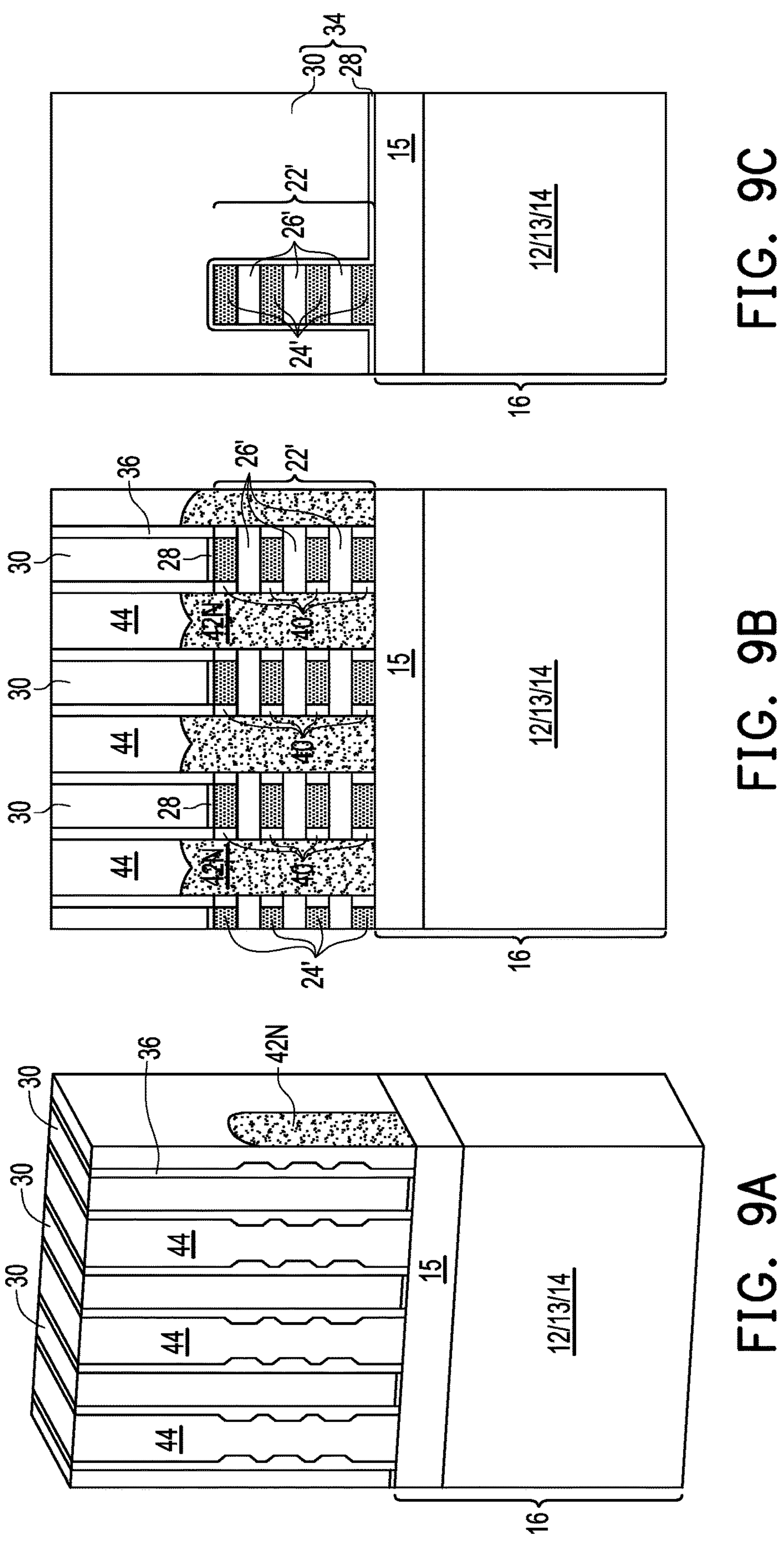

In FIGS. 9A, 9B, and 9C, dielectric regions 44 are formed over source/drain regions 42N. Dielectric regions 44 are removed in subsequent processes, and thus are also referred to as sacrificial regions 44. The respective process is illustrated as process 216 in the process flow 200 as shown in FIG. 42. In accordance with some embodiments, dielectric regions 44 may be formed of an oxide-based dielectric material such as silicon oxide, silicon oxynitride, silicon oxycarbide, Phospho-Silicate Glass (PSG), Boro-Silicate Glass (BSG), Boron-doped Phospho-Silicate Glass (BPSG), Undoped Silicate Glass (USG), or the like. A planarization process is performed to level the top surfaces of dielectric regions 44 with the top surfaces of dummy gate stacks 34.

Figures 10A, 10B, 10C:
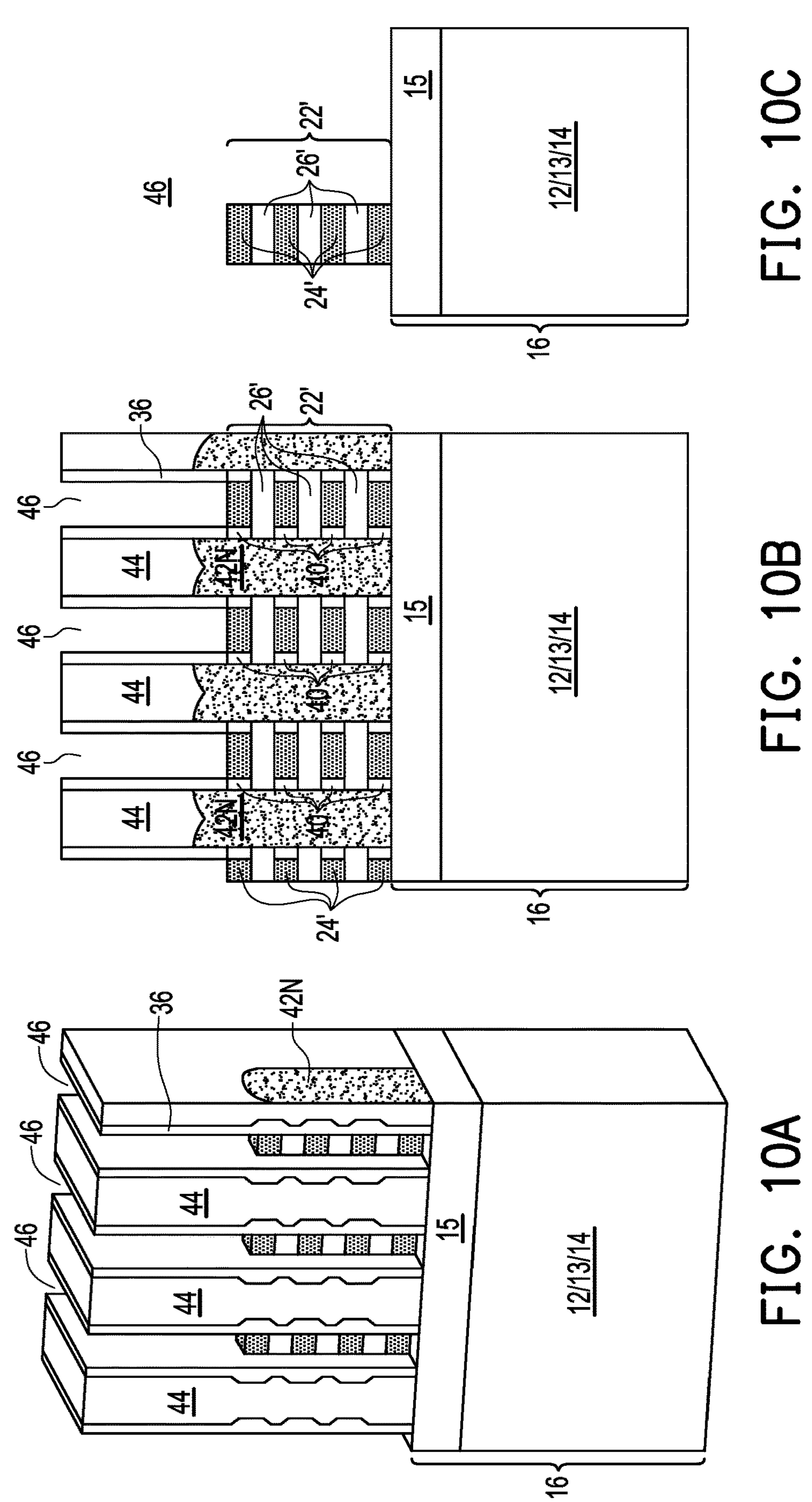

The dummy gate stacks 34 are then removed in one or more etching processes, so that recesses 46 are formed, as shown in FIGS. 10A, 10B, and 10C. The respective process is illustrated as process 218 in the process flow 200 as shown in FIG. 42. Each of recesses 46 exposes and/or overlies portions of multi-layer stacks 22'.

Figures 11A, 11B, 11C:
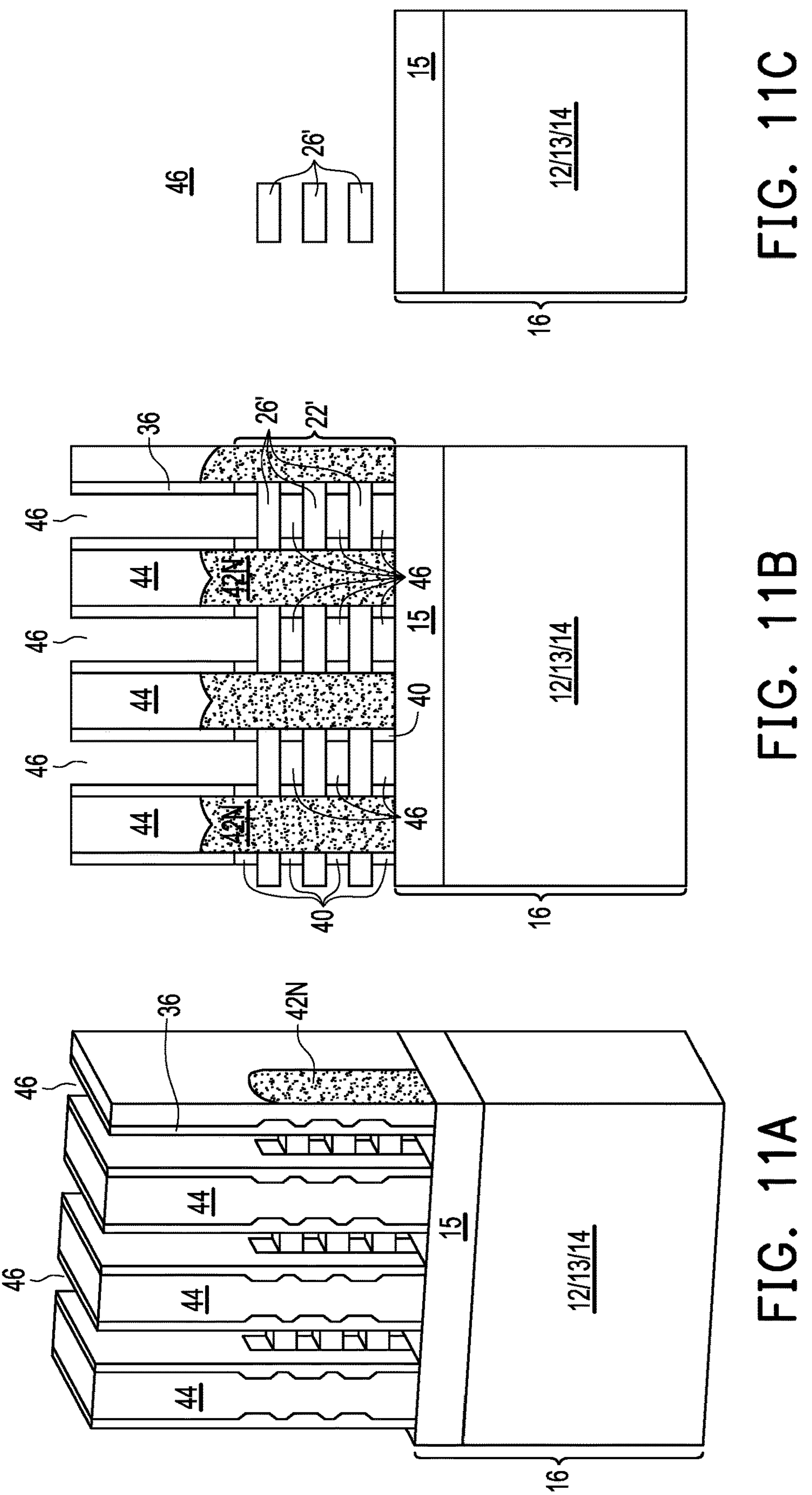

The remaining portions of the dummy nanostructures 24' are then removed through etching, so that recesses 46 extend between the semiconductor nanostructures 26'. The resulting structure is shown in FIGS. 11A, 11B, and 11C. In the etching process, the dummy nanostructures 24' may be etched at a faster rate than the semiconductor nanostructures 26', and inner spacers 40 are not etched. The etching may be isotropic. For example, when the dummy nanostructures 24' are formed of silicon-germanium, and the semiconductor nanostructures 26' are formed of silicon, the etch process may include a wet etch process using tetramethylammonium hydroxide (TMAH), ammonium hydroxide ($NH_4OH$), or the like.

Figures 12A, 12B, 12C:
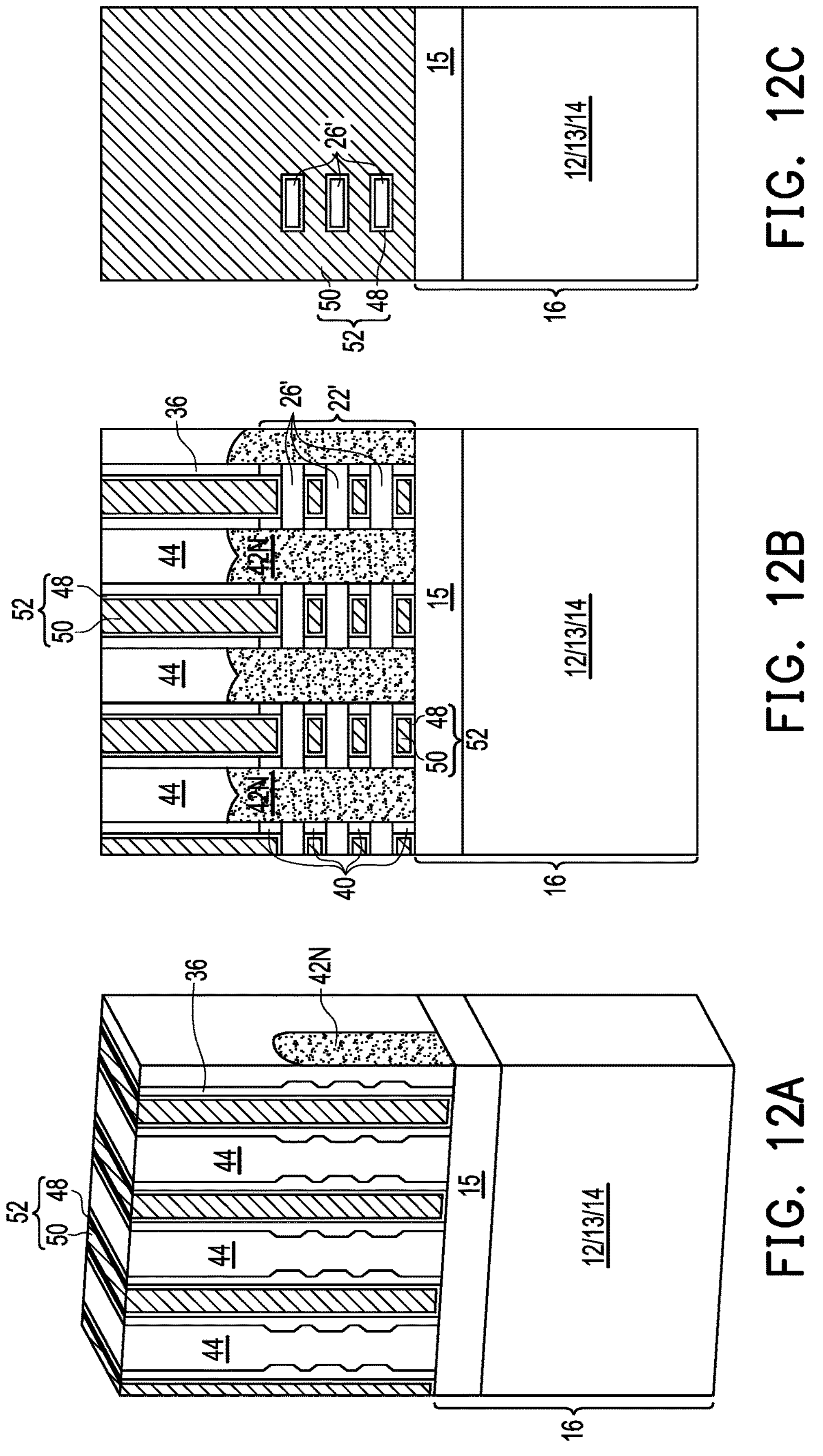

In FIGS. 12A, 12B, and 12C, replacement gate stacks 52 are formed in recesses 46, and include portions between upper semiconductor nanostructures 26' and the respective lower semiconductor nanostructures 26'. The respective process is illustrated as process 220 in the process flow 200 as shown in FIG. 42. Gate stacks 52 include gate dielectrics 48, and replacement gate electrodes 50 on gate dielectrics 48. Gate dielectrics 48 may include interfacial layers and high-k dielectric layers over the respective interfacial layers. The interfacial layers may include silicon oxide. The high-k dielectric layers may include hafnium oxide, zirconium oxide, lanthanum oxide, and/or the like. Gate electrodes 50 may include work function layers comprising TiN, TiSiN, TaN, TiAlN, TiAl, and/or the like, and may or may not include filling metals formed of cobalt, tungsten, and/or the like. Accordingly, gate electrodes 50 are also referred to as metal gates 50. The formation of replacement gate stacks 52 may include depositing the dielectric layer(s) and conductive layers, and performing a planarization process such as a CMP process or a mechanical grinding process to remove the excess portions of the dielectric layers and the conductive layers.

Figures 13A, 13B, 13C:
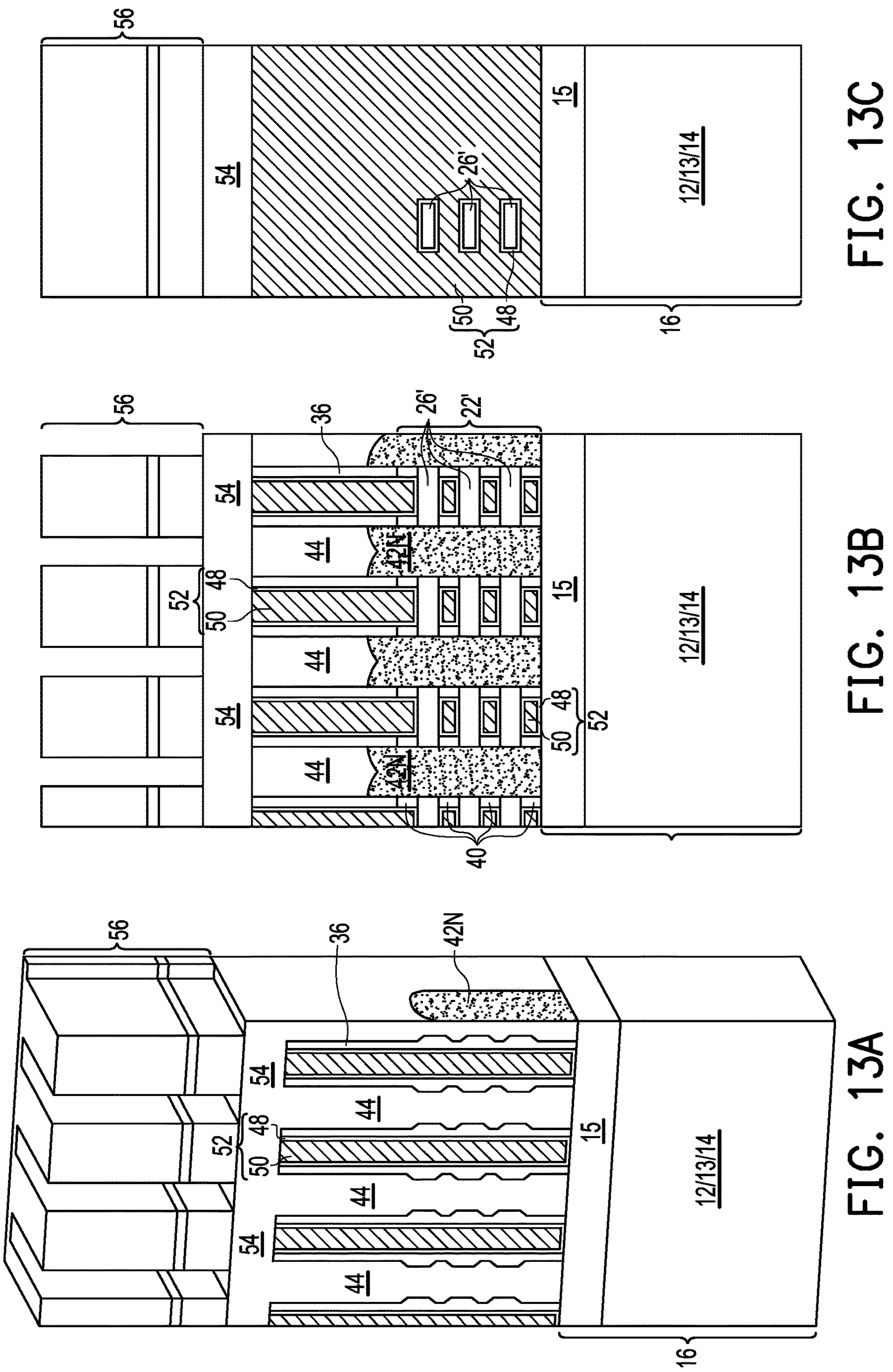

FIGS. 13A, 13B, and 13C illustrate the formation of dielectric layer 54, which comprises a dielectric material such as silicon oxide, silicon carbide, silicon oxynitride, silicon oxycarbide, or the like, or the combinations thereof. The formation may include CVD, PECVD, ALD, or the like. The respective process is illustrated as process 222 in the process flow 200 as shown in FIG. 42. Next, a patterned etching mask 56 is formed. The patterned etching mask 56 may include a photoresist, and may be a single layer etching mask, a tri-layer etching mask, or the like. There may also be (or may not be) a hard mask underlying the photoresist. The hard mask may be formed of or comprise TiN, CoN, SiN, or the like.

Figures 14A, 14B, 14C:
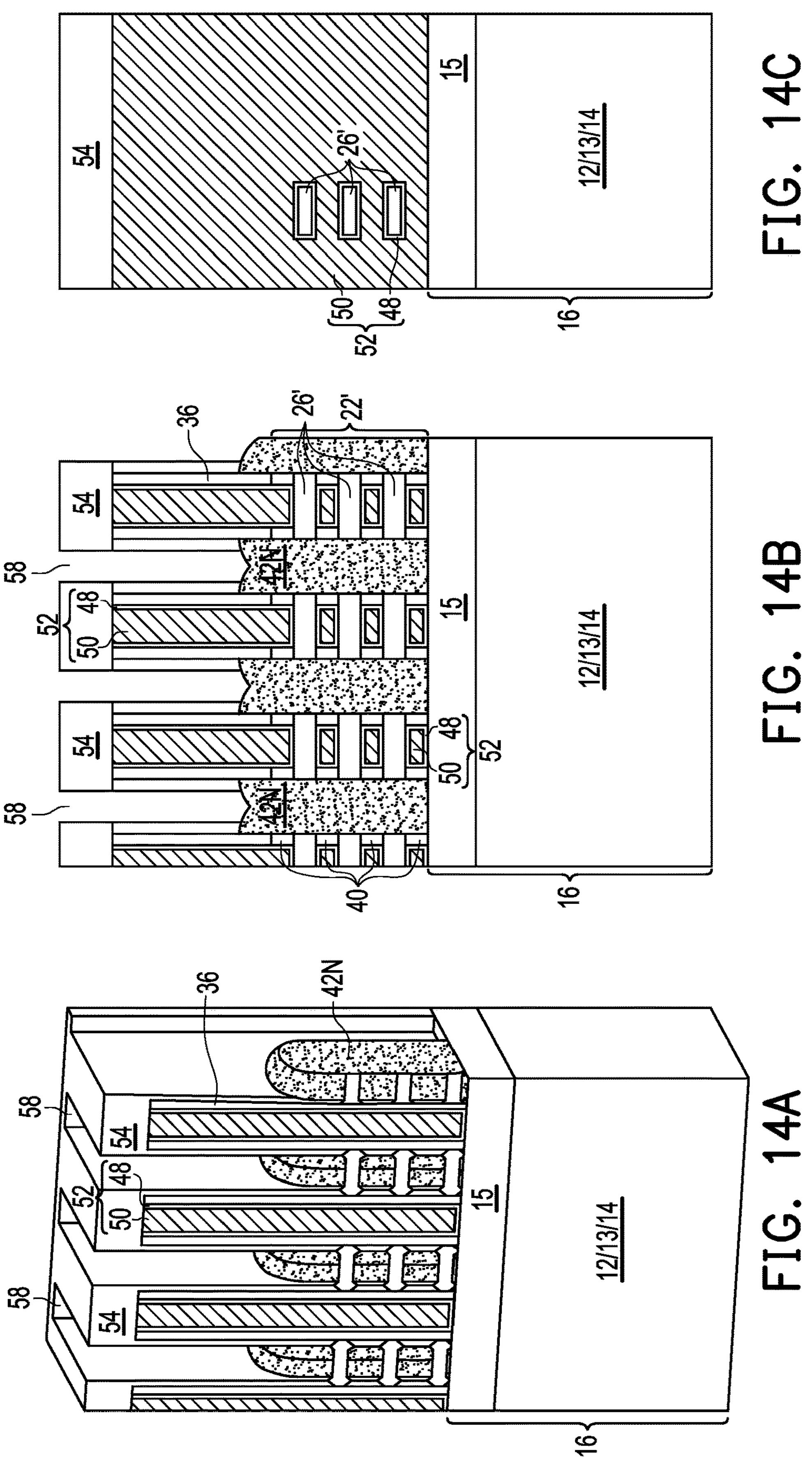

Referring to FIGS. 14A, 14B, and 14C, dielectric layer 54 is etched using the patterned etching mask 56 to define patterns. The respective process is also illustrated as process 222 in the process flow 200 as shown in FIG. 42. The sacrificial regions 44 are then etched using etching mask 56 to define patterns, forming openings 58. The respective process is illustrated as process 224 in the process flow 200 as shown in FIG. 42. Accordingly, epitaxial source/drain regions 42N are exposed to openings 58. The remaining portions of the patterned etching mask 56 are then removed.

Figures 15A, 15B, 15C:
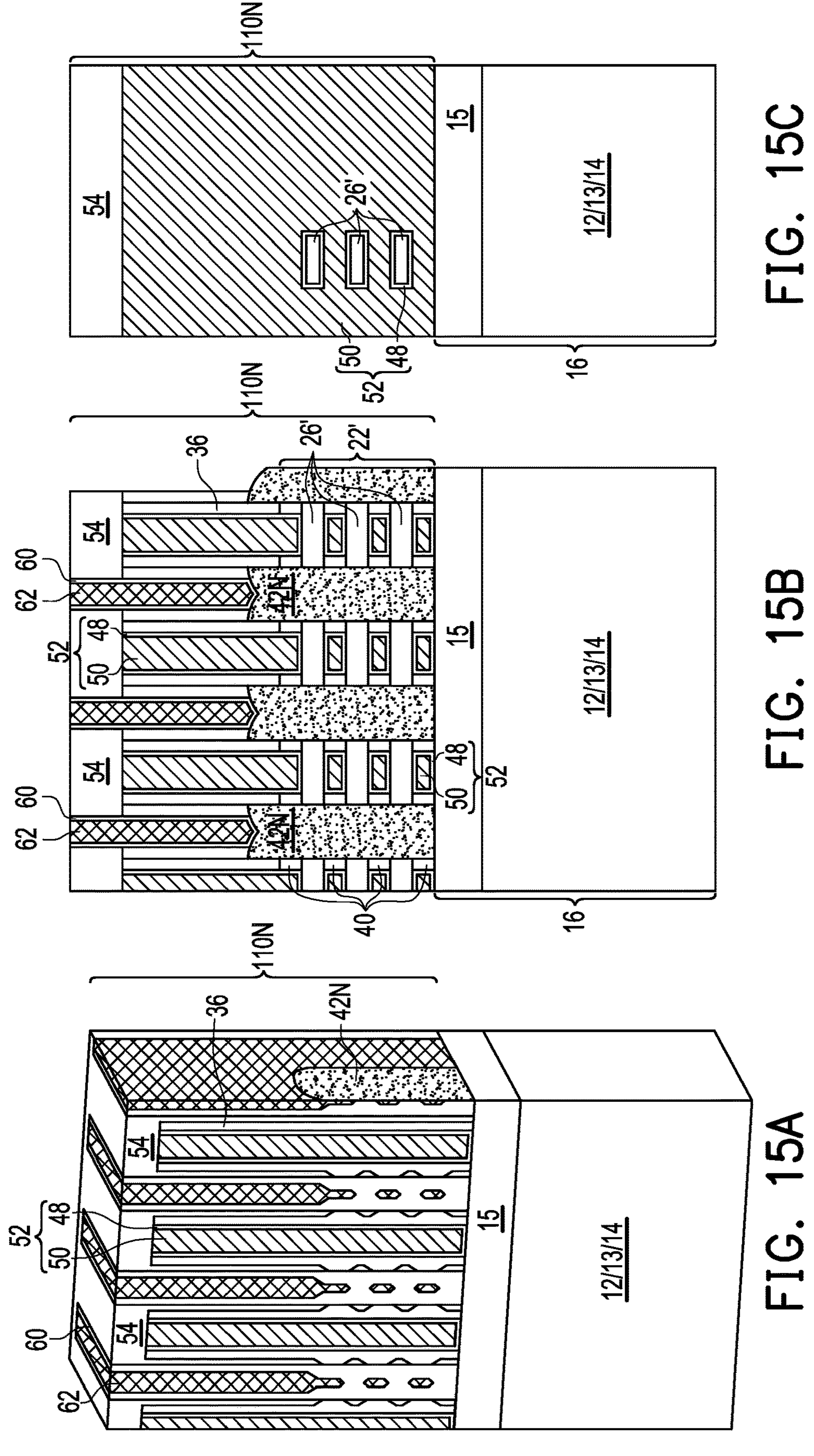

Referring to FIGS. 15A, 15B, and 15C, a Contact Etch Stop Layer (CESL) 60 and an Inter-Layer Dielectric (ILD) 62 are formed. The respective process is illustrated as process 226 in the process flow 200 as shown in FIG. 42. The CESL 60 may be formed of or comprise a dielectric material having a high etching selectivity from the etching of the ILD 62. For example, CESL 60 may be formed of or comprise silicon nitride, silicon oxide, silicon oxynitride, or the like, which may be formed by any suitable deposition process, such as CVD, ALD, or the like. The ILD 62 may be formed of a dielectric material, which may be deposited by any suitable method, such as CVD, plasma-enhanced CVD (PECVD), FCVD, or the like. The applicable dielectric material of the ILD 62 may include PSG, BSG, BPSG, USG, silicon oxide, or the like. NFET 110N is thus formed.

Figures 16A, 16B, 16C:
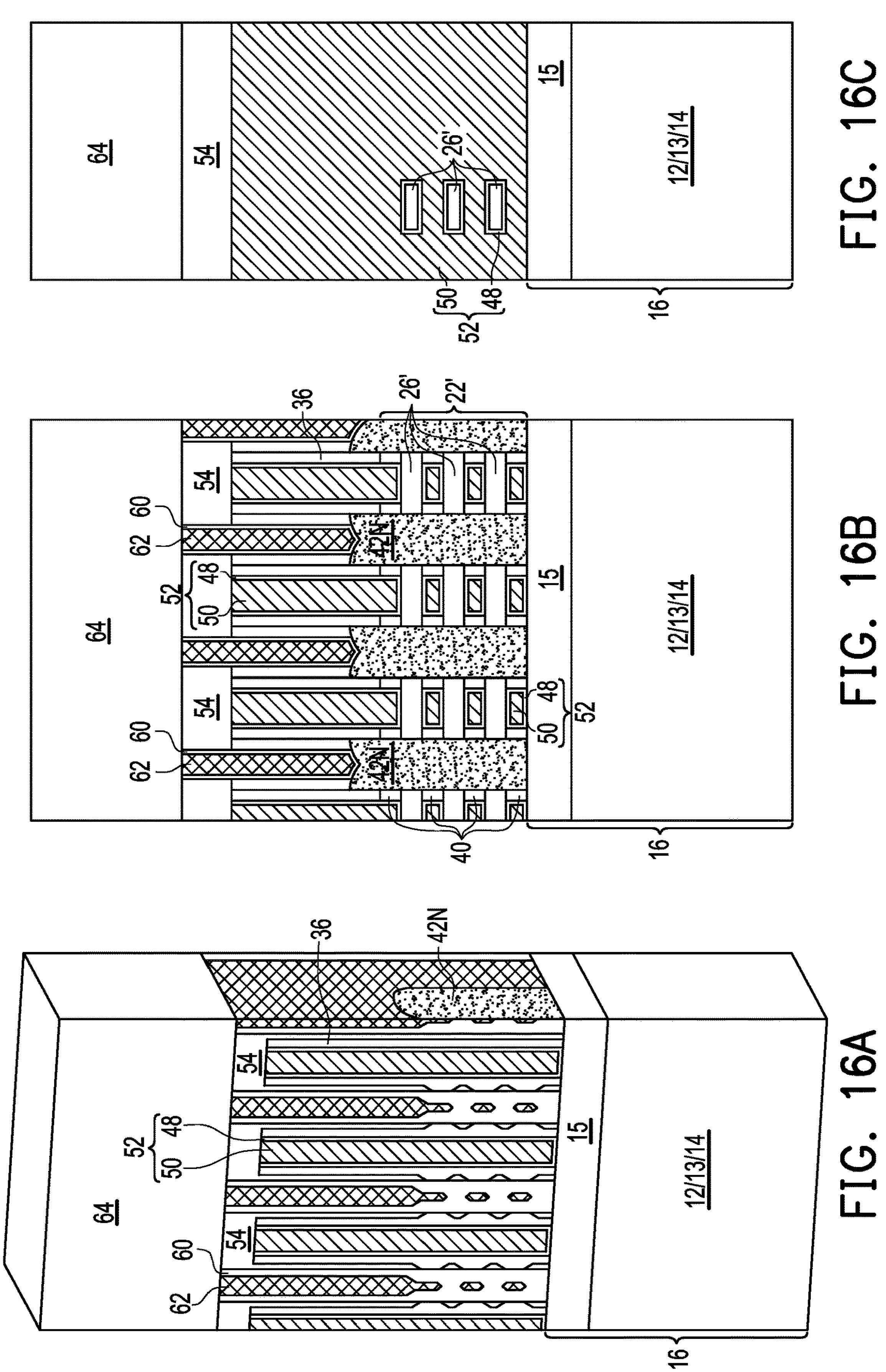

Referring to FIGS. 16A, 16B, and 16C, an upper structure 64 is formed, wherein the details in the upper structure 64 are not shown. In accordance with some embodiments, upper structure 64 includes a dielectric layer, which may be formed of or comprise silicon oxide, silicon nitride, or the like. Upper structure 64 may also include a carrier attached to the precedingly formed structure. The carrier layer may be a silicon carrier, which is attached to the precedingly formed structure through fusion bonding. The upper structure 64 may also include a glass carrier, which is adhered to the precedingly formed structure through an adhesive.

In accordance with alternative embodiments, upper structure 64 includes (and is referred to as) a front-side (back end of line) interconnect structure. The respective process is illustrated as process 228 in the process flow 200 as shown in FIG. 42. The front-side interconnect structure 64 includes dielectric layers and layers of conductive features in the dielectric layers. The dielectric layers may include low-k dielectric layers formed of low-k dielectric materials. The dielectric layers may further include passivation layers, which are formed of non-low-k and dense dielectric materials such as Undoped Silicate-Glass (USG), silicon oxide, silicon nitride, or the like, or combinations thereof over the low-k dielectric materials. The dielectric layers may also include polymer layers.

The conductive features in the front-side interconnect structure 64 may include conductive lines and vias, which may be formed using damascene processes. The conductive features may include diffusion barriers and a copper-containing material over the diffusion barriers. There may also be aluminum pads over and electrically connected to the metal lines and vias. Depending on how the respective die is to be packaged, the top surface features among the conductive features may include bond pads, metal pillars, solder regions, and/or the like.

Figures 17A, 17B, 17C:
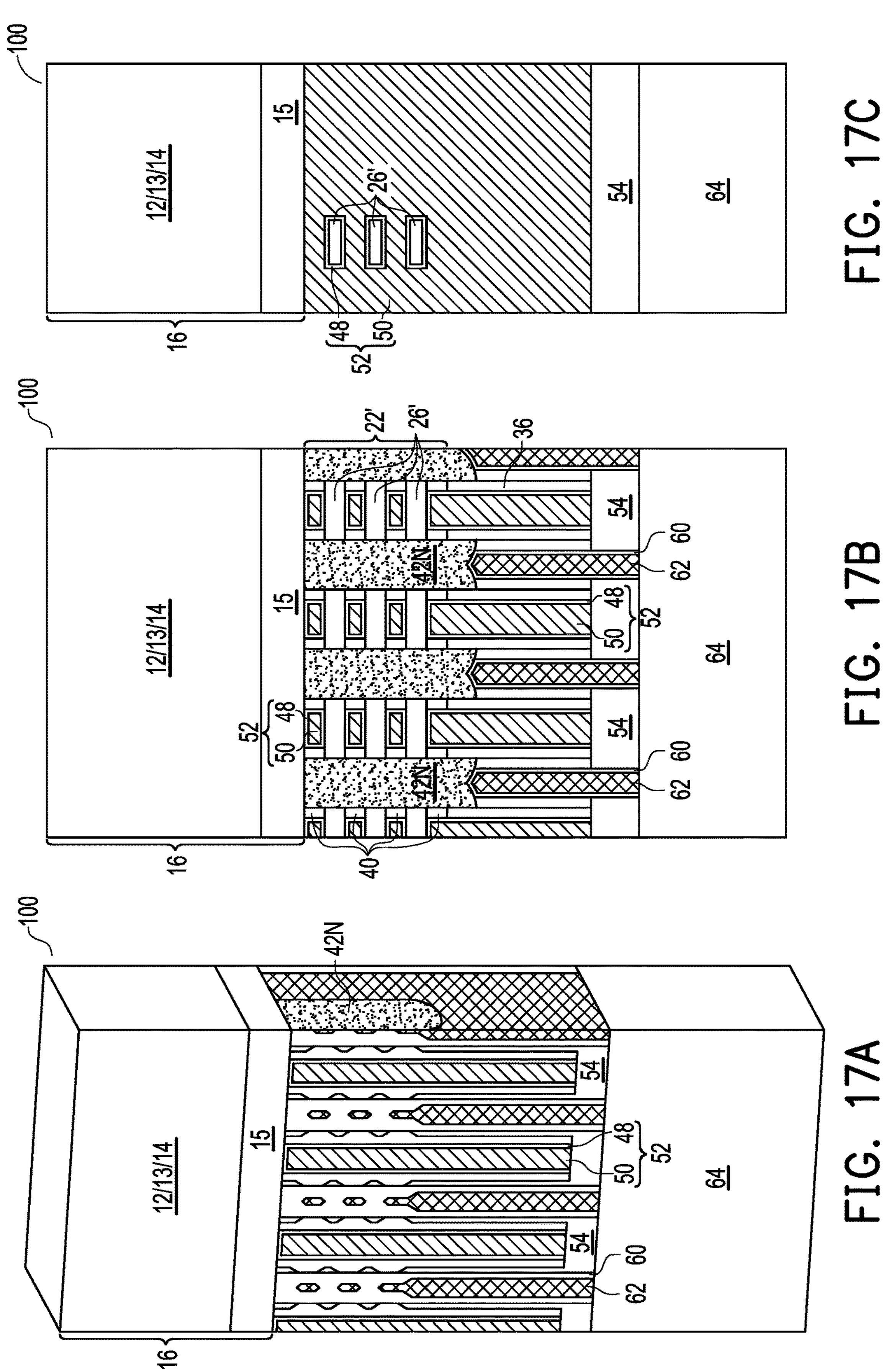

The structure as shown in FIGS. 16A, 16B, and 16C is then flipped upside down. The resulting structure is shown in FIGS. 17A, 17B, and 17C, and is referred to as structure 100. The subsequent processes may take different approaches, depending on the structure of substrate 16. For example, as shown in FIGS. 1A, 1B, and 1C, substrate 16 may or may not include silicon-containing dielectric layer 13 and SiGe layer 14. The subsequently discussed example processes as shown in FIGS. 18A, 18B, 18C, 19A, 19B, and 19C may be based on the substrate 16 that is free from silicon-containing dielectric layer 13, and may or may not include SiGe layer 14.

Figures 18A, 18B, 18C:
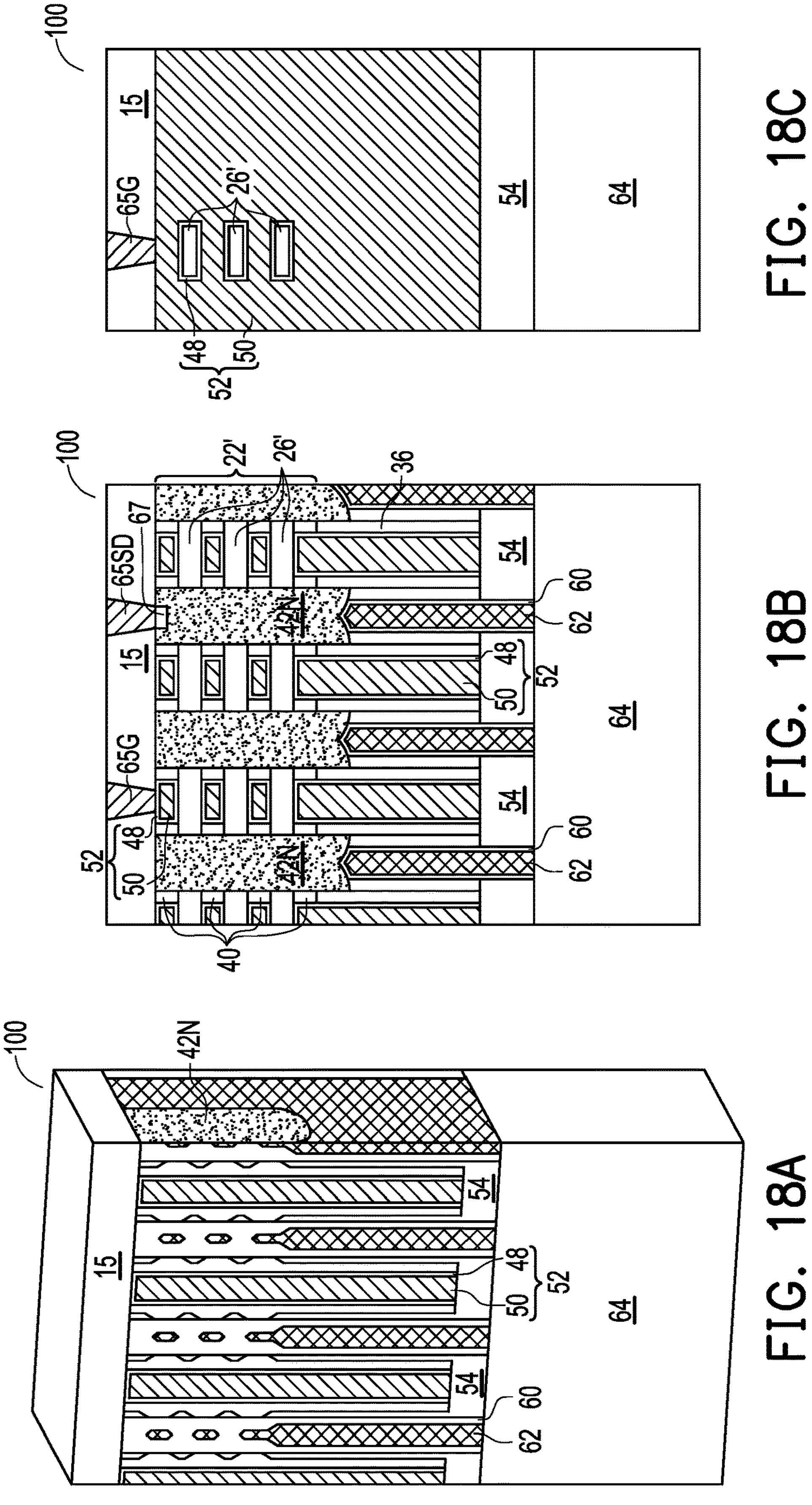

In accordance with some embodiments, a portion of substrate 16 is removed in a thinning process. The respective process is illustrated as process 230 in the process flow 200 as shown in FIG. 42. For example, as shown in FIGS. 18A, 18B, and 18C, the semiconductor material in substrate 16 may be removed, exposing silicon-containing dielectric layer 15.

In accordance with some embodiments gate vias 65G may be formed in dielectric layer 15 to electrically connect to gate electrode 50. Source/drain vias 65SD and source/drain silicide layers 67 may also be formed in dielectric layer 15 to electrically connect to source/drain regions 42N. In accordance with alternative embodiments, no gate vias and/or source/drain vias are formed.

Figures 19A, 19B, 19C:
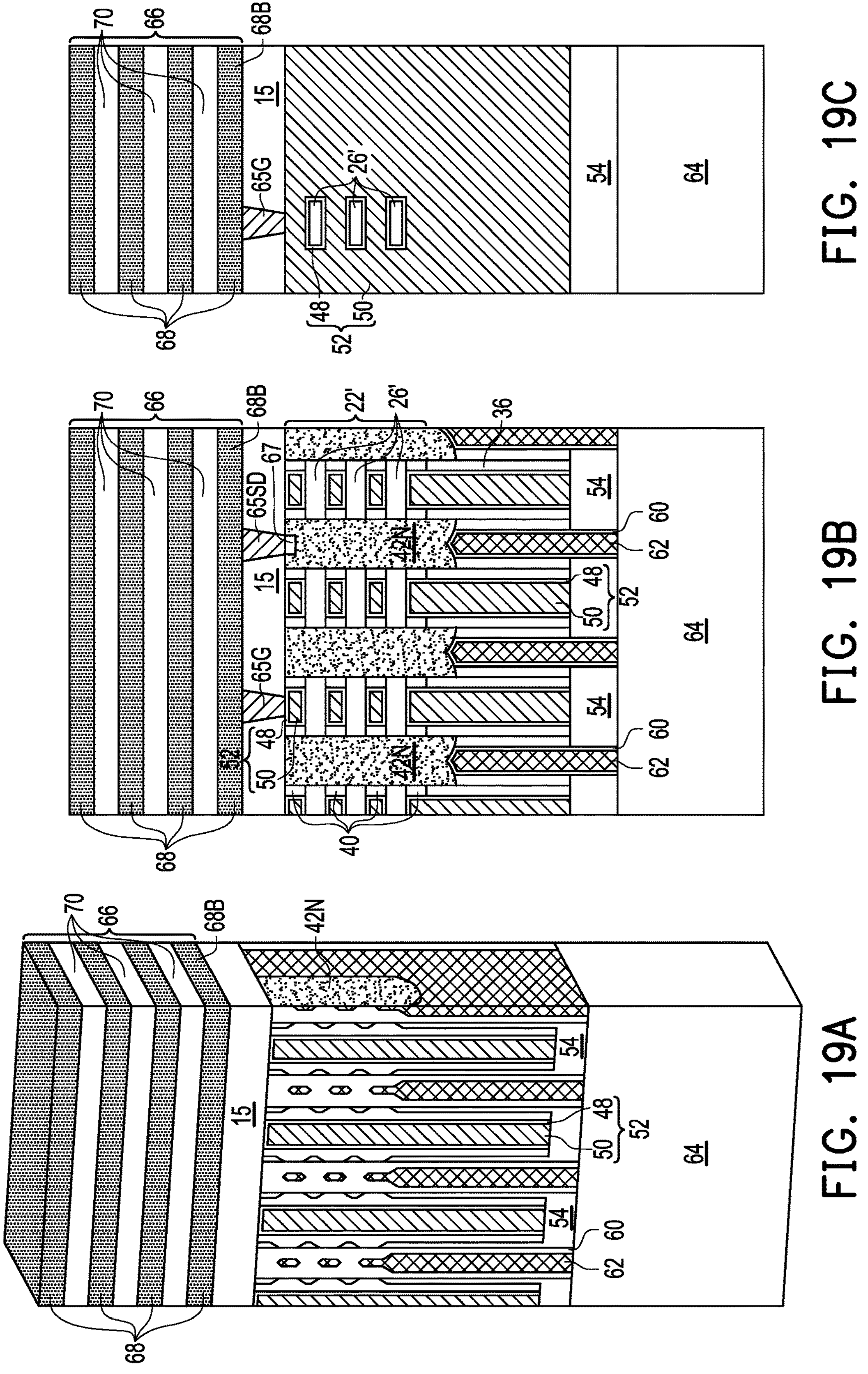
Figure 36:
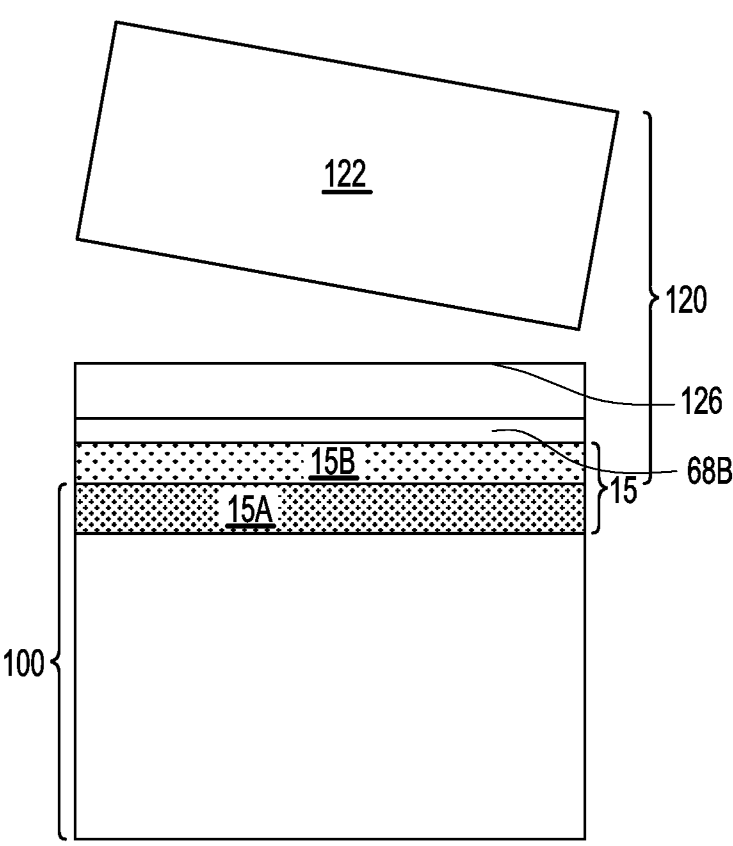
Figure 37:
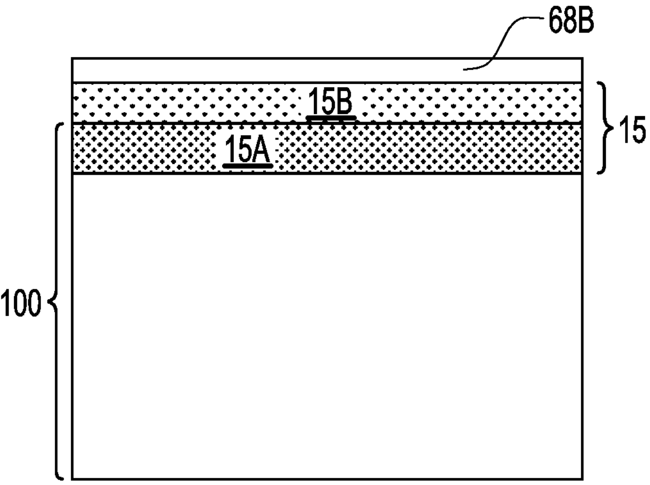

Next, as shown in FIGS. 19A, 19B, and 19C, multi-layer stack 66 is formed. The respective process is illustrated as process 232 in the process flow 200 as shown in FIG. 42. The formation of multi-layer stack 66 may include bonding a substrate onto silicon-containing dielectric layer 15 through fusion bonding, removing upper portions of the substrate, and leaving dummy layer 68 (also denoted as 68B). The corresponding processes are also illustrated in FIGS. 36 and 37. A plurality of dummy semiconductor layers 68 (in addition to the semiconductor layer 68B) and semiconductor layers 70 are then epitaxially grown from dummy semiconductor layer 68B, with dummy semiconductor layers 68 and semiconductor layers 70 being located alternatingly. The dummy semiconductor layers 68 and semiconductor layers 70 are collectively referred to as multi-layer stack 66. It is appreciated that the numbers of the illustrated dummy semiconductor layers 68 and semiconductor layers 70 are examples, and the actual numbers may vary. Each layer of the multi-layer stack 66 may be grown by a process such as VPE, MBE, CVD, ALD, or the like.

In some embodiments, dummy semiconductor layers 68 are formed of or comprise silicon germanium. The germanium atomic percentages of dummy semiconductor layers 68 may be in the range between about 10 percent and about 50 percent, and may be in the range between about 30 percent and about 50 percent. Semiconductor layers 70 may have a germanium atomic percentage higher than the germanium atomic percentage of dummy semiconductor layers 68. For example, semiconductor layers 70 may comprise pure or substantially pure germanium, and may be free from silicon. Alternatively, semiconductor layers 70 comprise silicon germanium with the germanium in semiconductor layers 70 being higher than about 60 percent, 80 percent, 90 percent, or higher.

Figure 34:
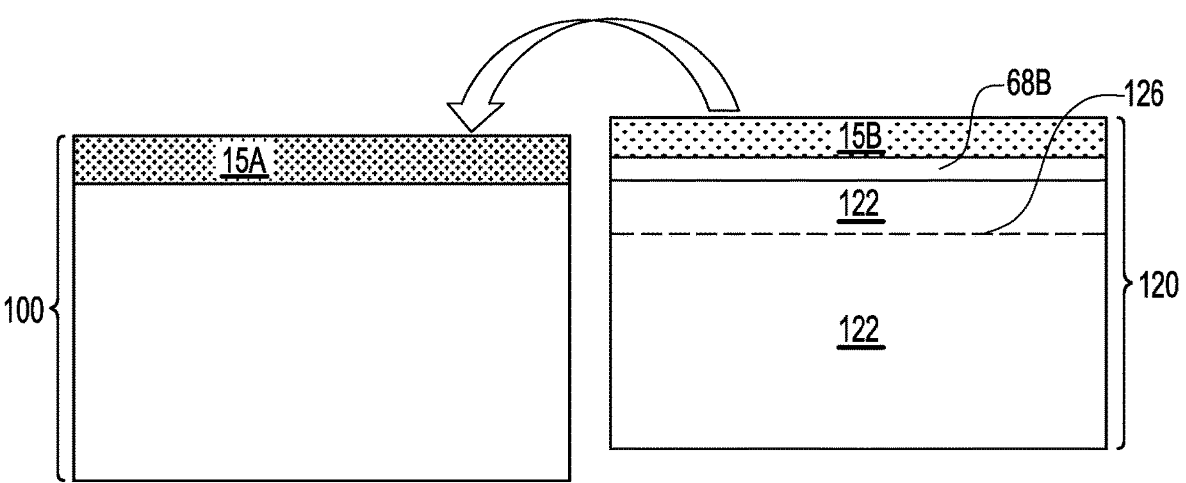
FIGS. 34 through 37 illustrate the cross-sectional views of a wafer bonding process used for forming CFETs in accordance with some embodiments.
Figure 35:
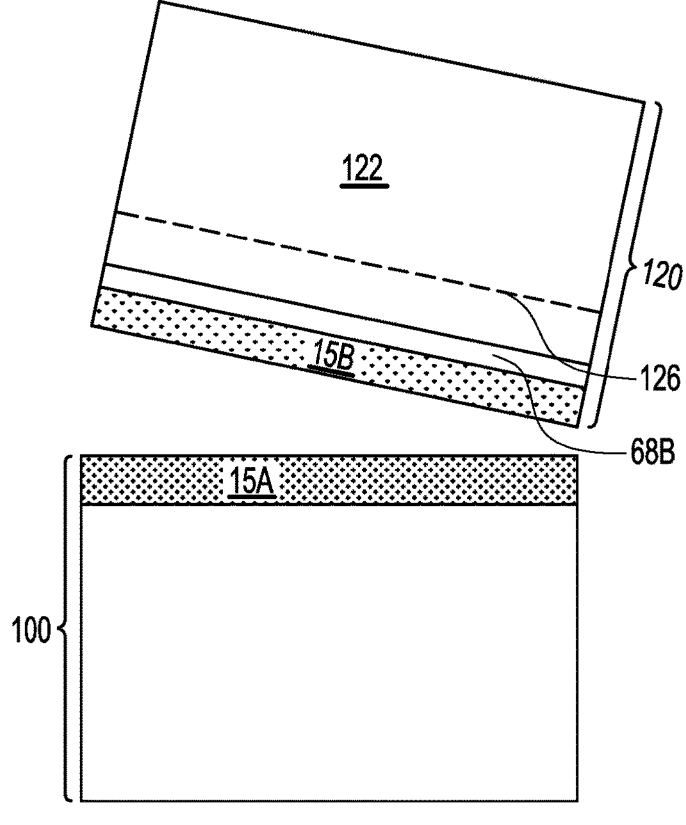

In accordance with alternative embodiments, the substrate 16 (FIGS. 1A, 1B, and 1C) includes SiGe layer 14, and during the backside thinning process as shown in FIGS. 18A, 18B, and 18C, the SiGe layer 14 is left unremoved, and acts as dummy layer 68B for growing the multi-layer stack 66 thereon. Accordingly, the processes as shown in FIGS. 34-36 may be skipped.

The subsequent processes, structures, and material as shown in FIGS. 20A, 20B, and 20C through FIGS. 32A, 32B, and 32C, which are for forming PFETs, are essentially the same as what are disclosed for forming NFET, except some materials and structures are selected to suit to the conductivity type of the PFETs. Again, although NFETs are illustrated and discussed in the example embodiments as being formed before the formation of the PFETs, the formation order may be inversed.

Figures 20A, 20B, 20C:
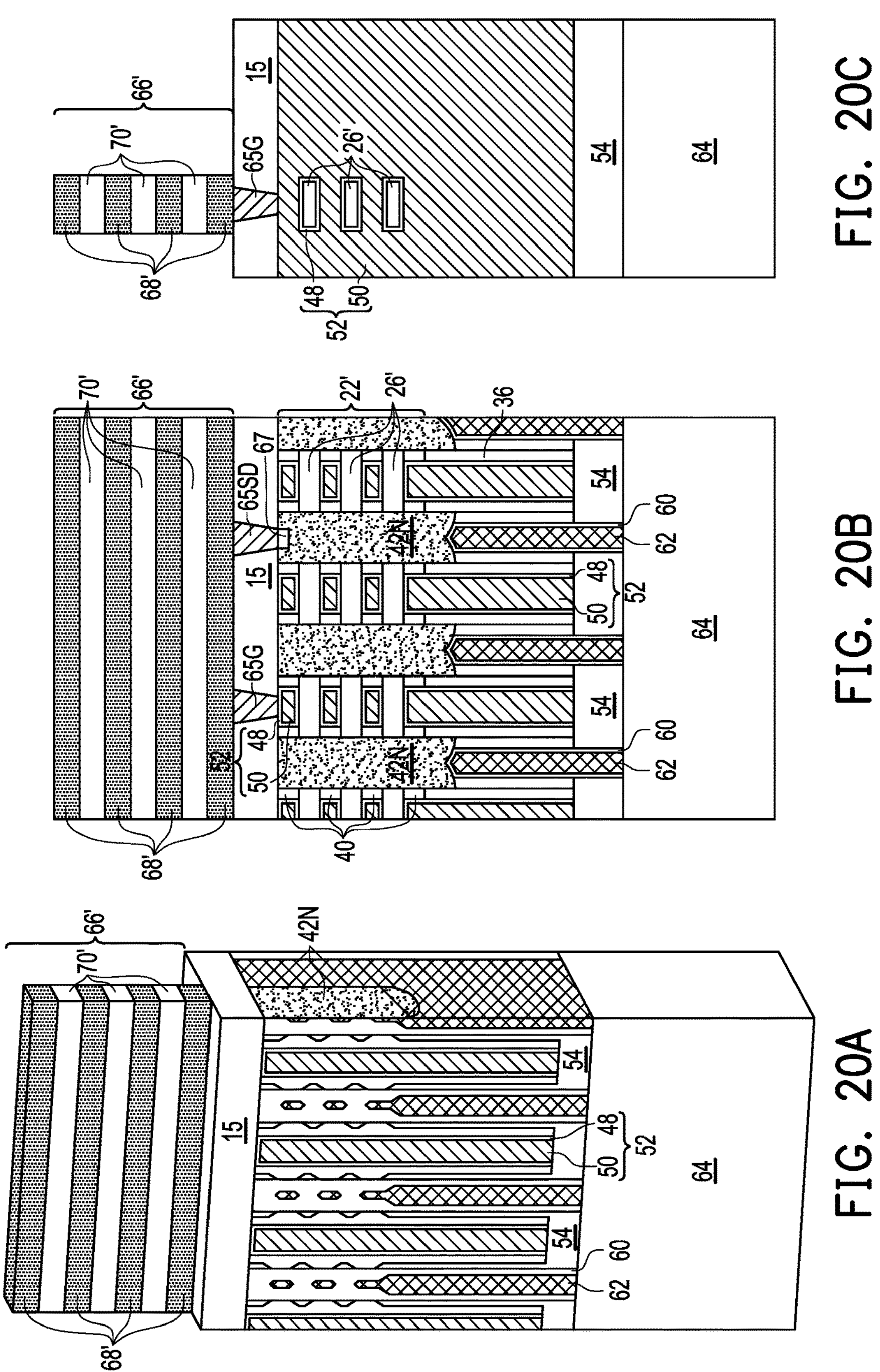
Figure 21A:
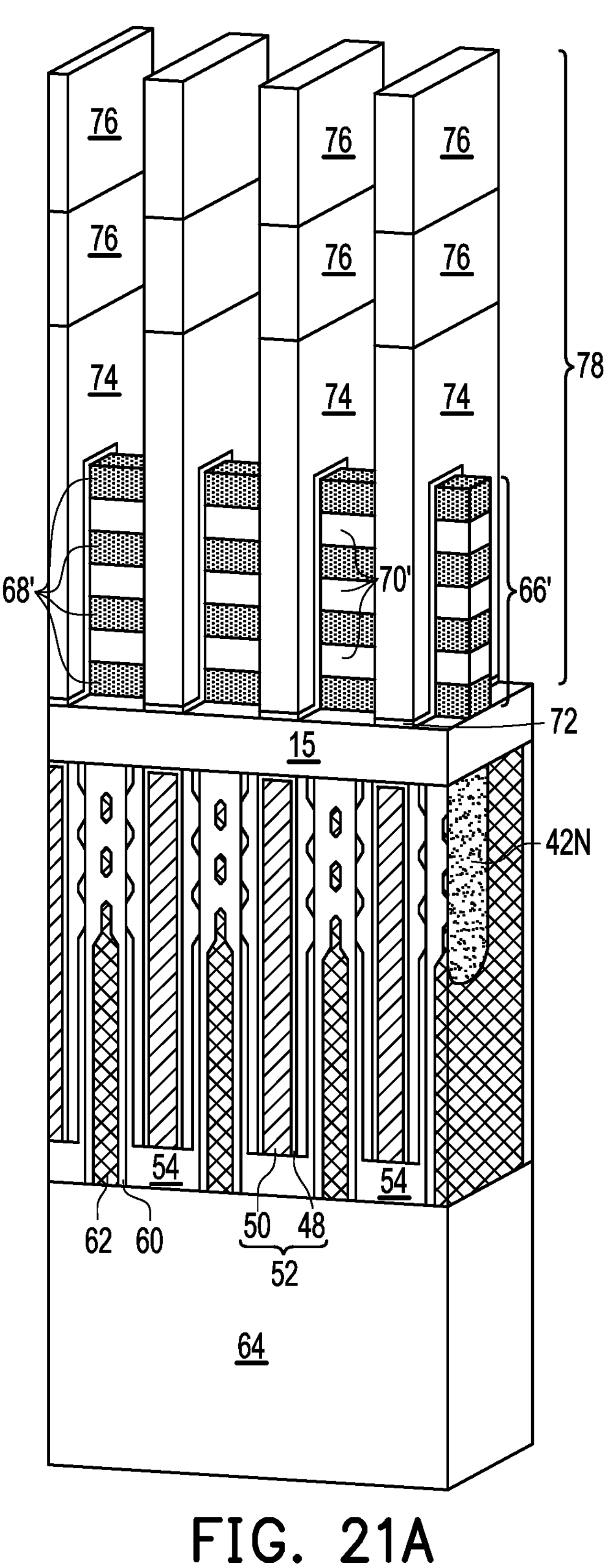
Figures 21B, 21C:
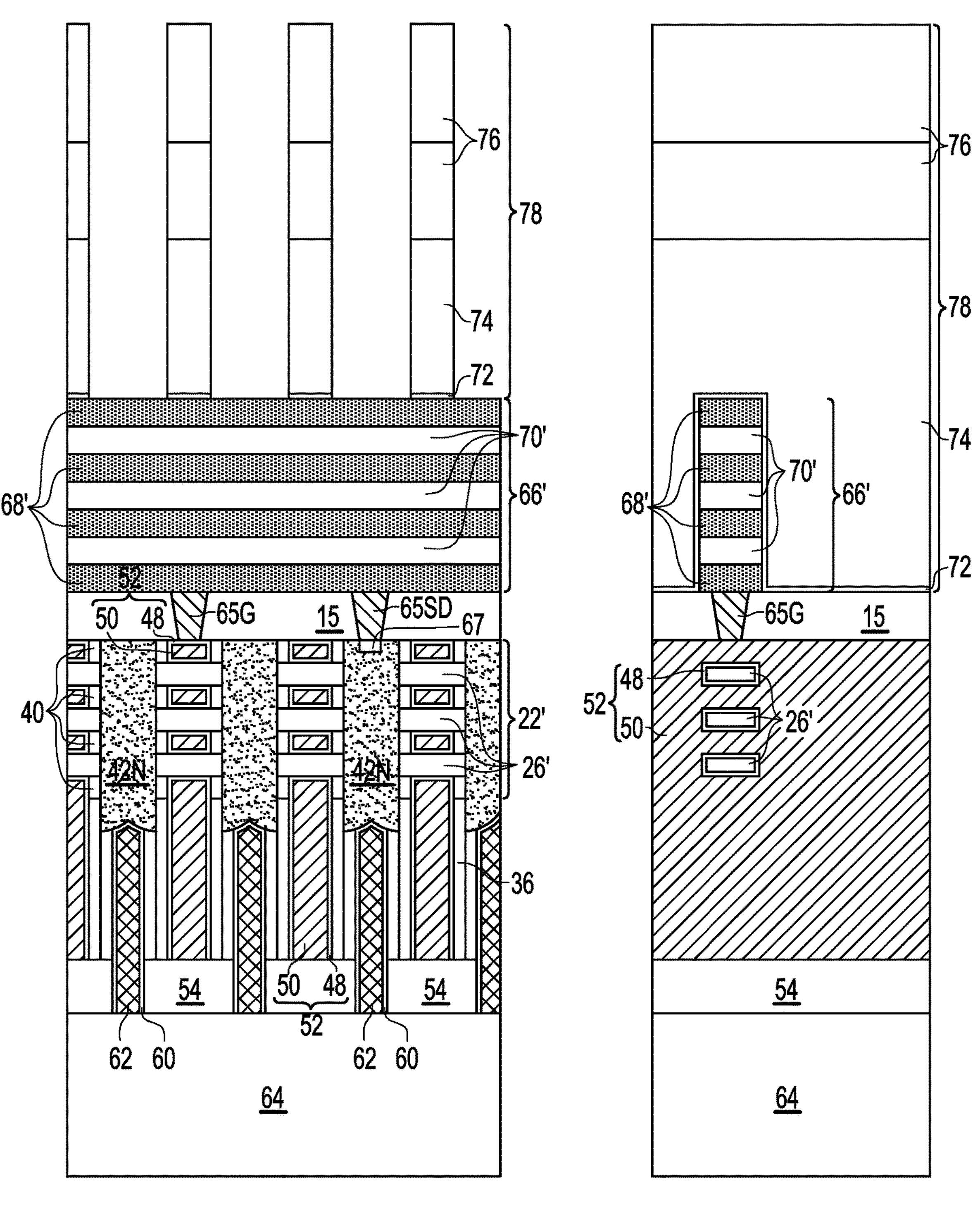

In FIGS. 20A, 20B, and 20C, multi-layer stack 66 is patterned to form multi-layer stack 66', which is the remaining portion of multi-layer stack 66. The respective process is illustrated as process 234 in the process flow 200 as shown in FIG. 42. The patterning is performed through an anisotropic etching process, which is stopped on dielectric layer 15. The remaining portions 66' of multi-layer stack 66 are also referred to as nanostructures hereinafter. Multi-layer stack 66' includes dummy nanostructures 68' and semiconductor nanostructures 70'.

Referring to 21A, 21B, and 21C, dummy gate stacks 78 are formed. The respective process is illustrated as process 236 in the process flow 200 as shown in FIG. 42. Dummy gate stacks 78 include dummy gate dielectrics 72, dummy gate electrodes 74 over dummy gate dielectrics 72, and mask layers 76 over dummy gate electrodes 74.

Dummy gate dielectrics 72 may be formed of or comprise, for example, silicon oxide, silicon nitride, a combination thereof, or the like, and may be deposited or thermally grown according to acceptable techniques. The material of dummy gate electrodes 74 may be conductive or non-conductive, and may be selected from a group including amorphous silicon, polycrystalline-silicon (polysilicon), poly-crystalline silicon-germanium (poly-SiGe), or the like. Mask layers 76 may include, for example, silicon nitride, silicon oxynitride, or the like. The formation of dummy gate stacks 78 may include depositing the corresponding layers, and patterning the layers through anisotropic etching processes.

Figure 22A:
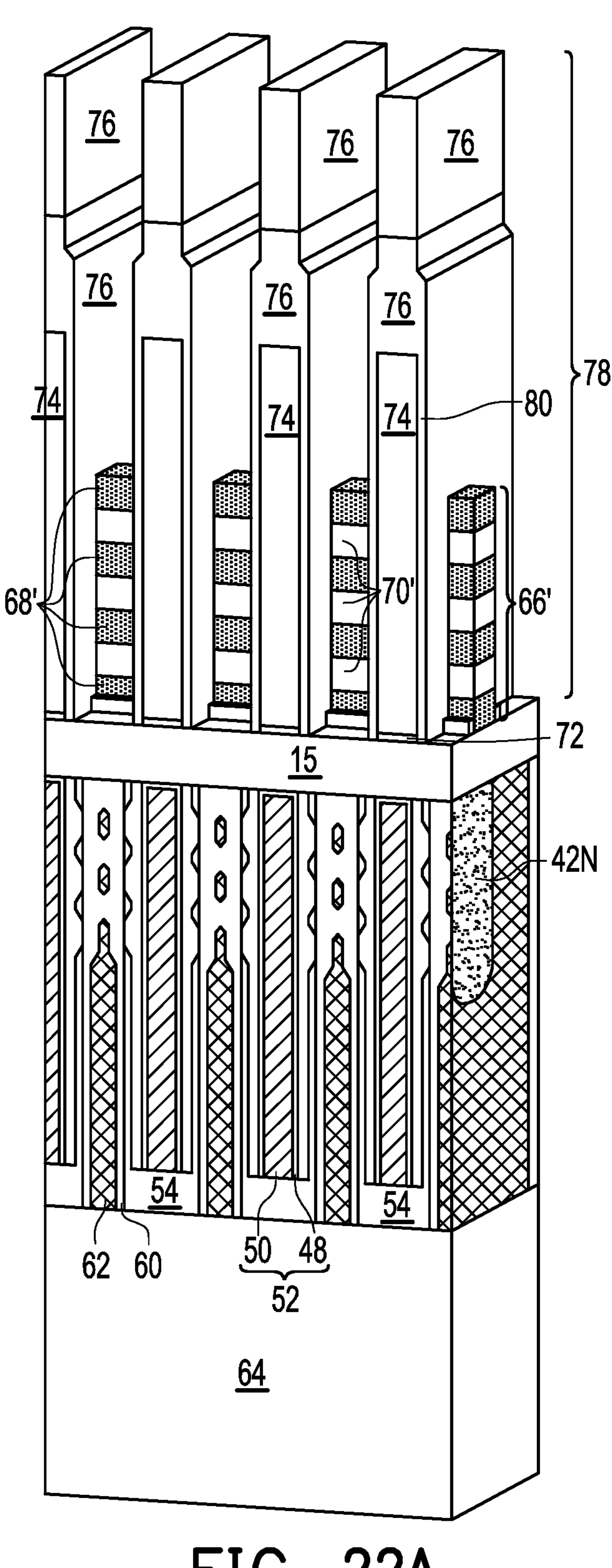
Figures 22B, 22C:
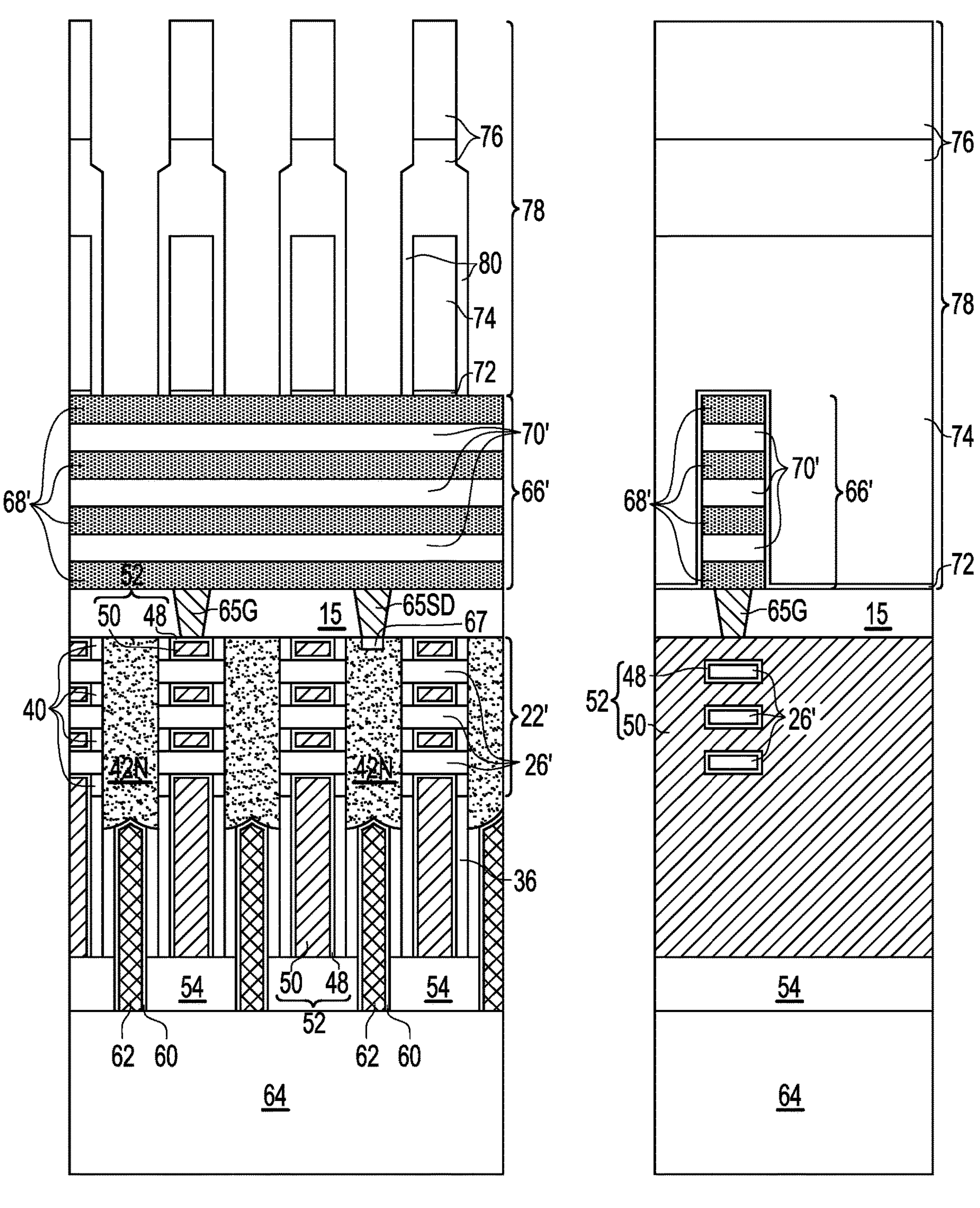
Figure 23A:
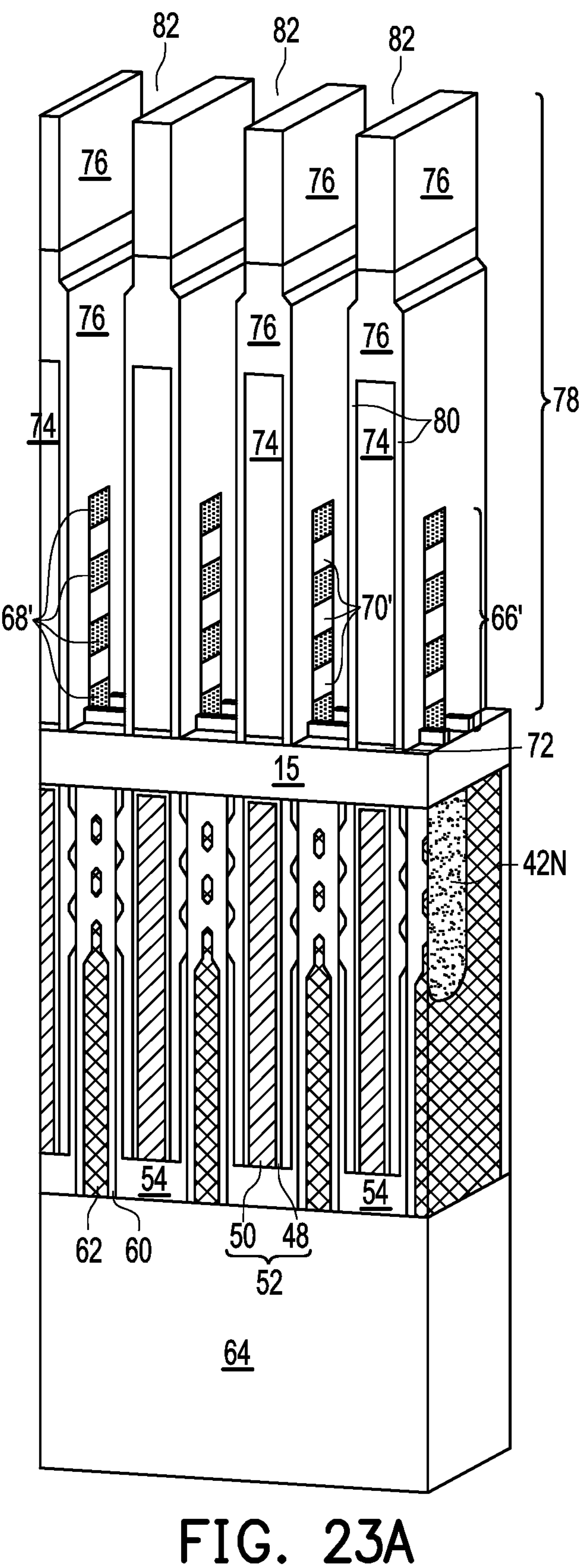
Figures 23B, 23C:
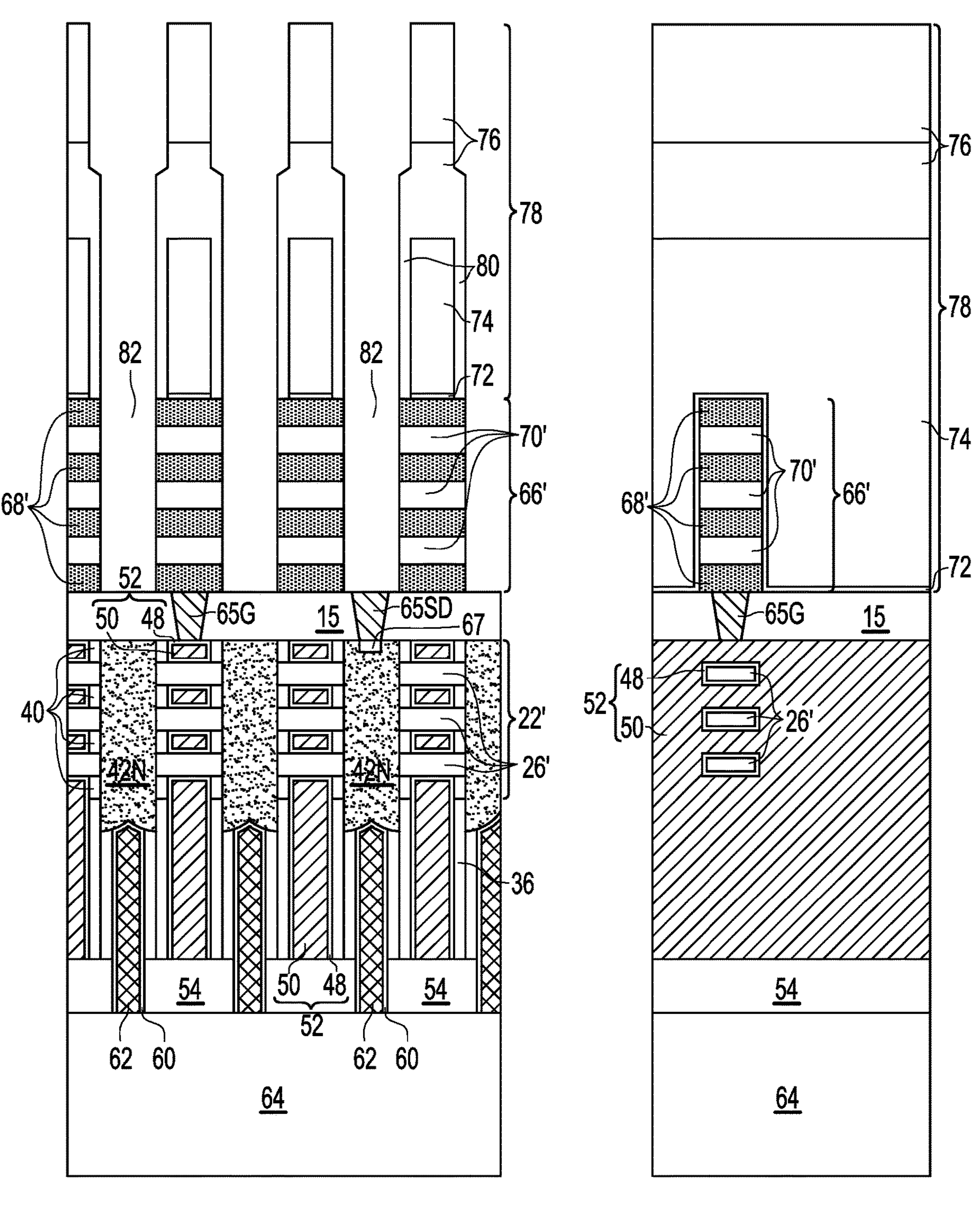

In FIGS. 22A, 22B, and 22C, gate spacers 80 are formed over the multi-layer stacks 22' and on the exposed sidewalls of dummy gate stacks 78. The respective process is illustrated as process 238 in the process flow 200 as shown in FIG. 42. Next, as shown in FIGS. 23A, 23B, and 23C, source/drain recesses 82 are formed in multi-layer stack 66'. The respective process is illustrated as process 240 in the process flow 200 as shown in FIG. 42. The source/drain recesses 82 are formed through etching, and may extend through the multi-layer stacks 66', so that dielectric layer 15 is exposed. Gate vias 65SD, if formed, are also exposed. In the etching processes, the gate spacers 80 and the dummy gate stacks 78 mask some portions of the multi-layer stack 66'.

Figure 24A:
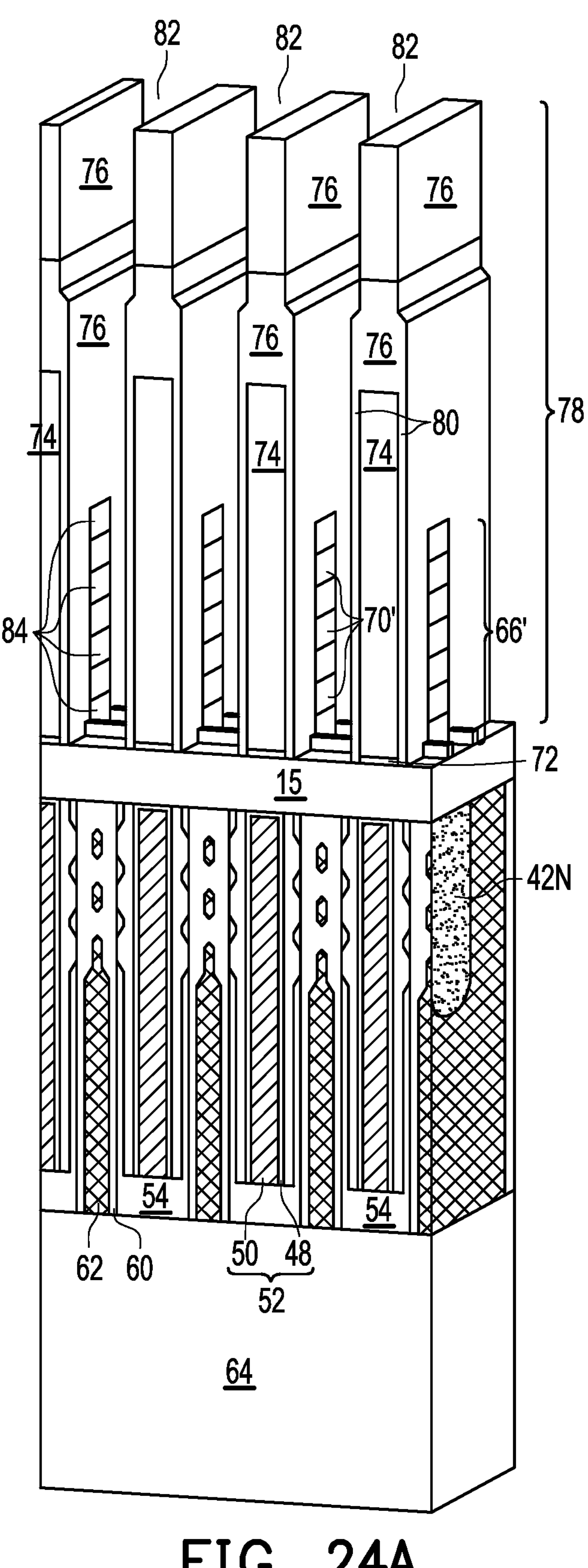
Figures 24B, 24C:
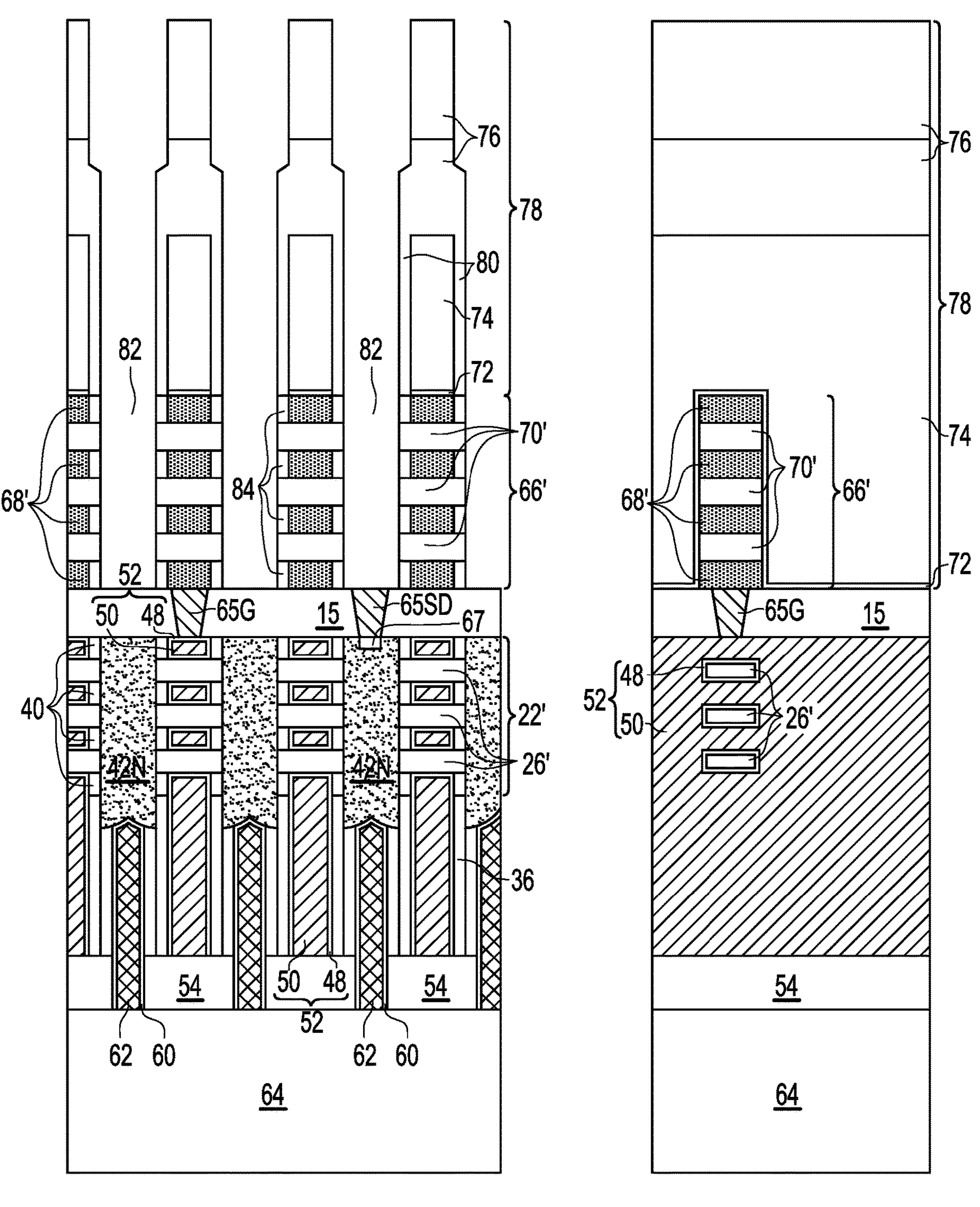

Referring to FIGS. 24A, 24B, and 24C, inner spacers 84 are formed. The respective process is illustrated as process 242 in the process flow 200 as shown in FIG. 42. In the formation process, the sidewalls of the dummy nanostructures 68' are first recessed through an etch process, which is isotropic, to form lateral recesses. The etching is selective to the material of the dummy nanostructures 68'. A dielectric material is then deposited to extend into the lateral recesses, and an etching process is performed to remove the portions of the dielectric material outside of the recesses. The remaining portions of the dielectric material form inner spacers 84.

Figure 25A:
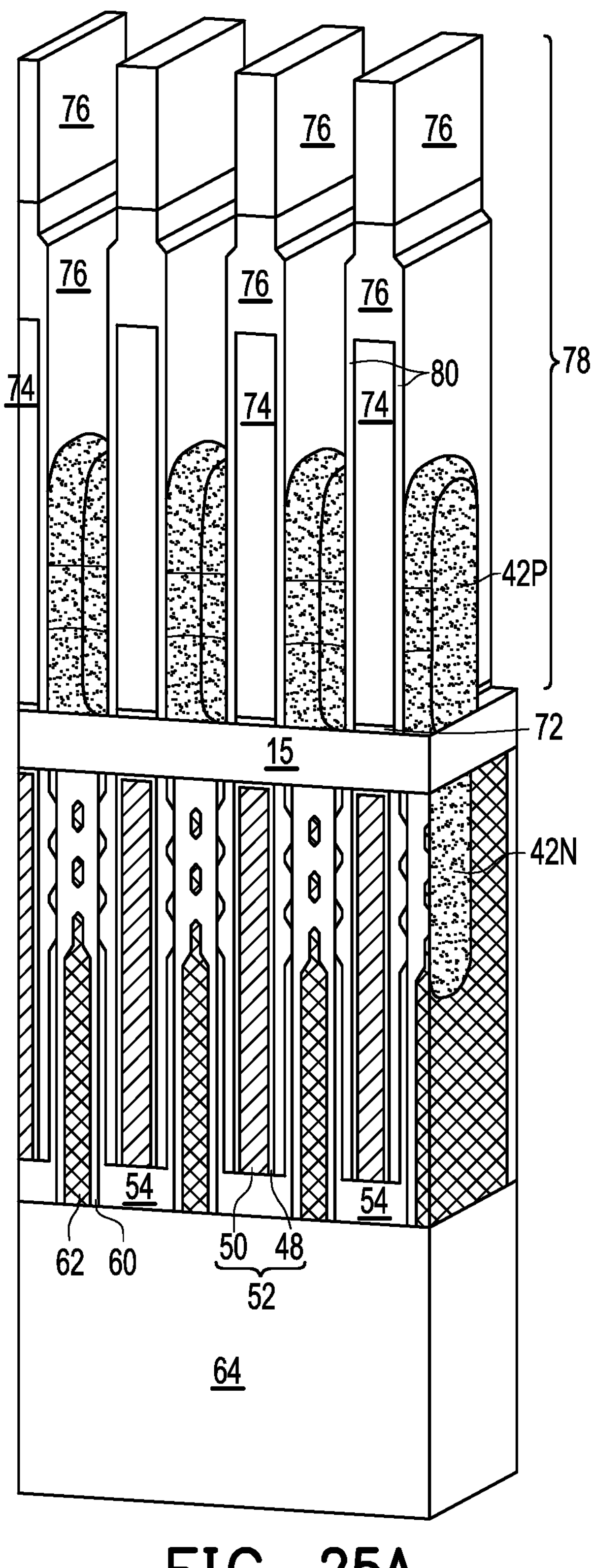
Figures 25B, 25C:
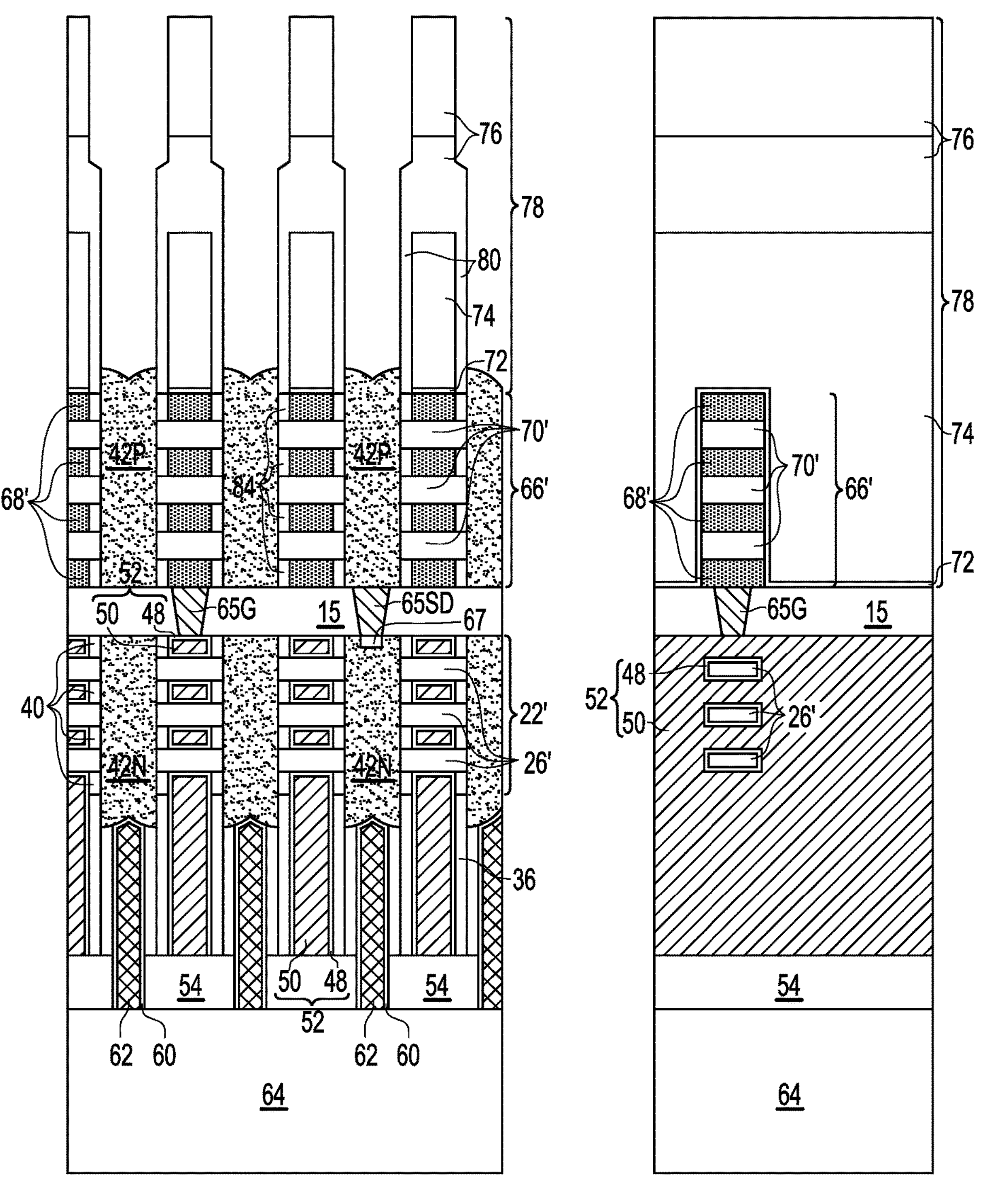

In FIGS. 25A, 25B, and 25C, epitaxial source/drain regions 42P are formed in the lower portions of the source/drain recesses 82. The respective process is illustrated as process 244 in the process flow 200 as shown in FIG. 42. The epitaxial source/drain regions 42P are in contact with the semiconductor nanostructures 70', which form the channel regions of the respective PFET. Inner spacers 84 electrically insulate the epitaxial source/drain regions 42P from the dummy nanostructures 68', which will be replaced with replacement gates in subsequent processes.

The epitaxial source/drain regions 42P are epitaxially grown. The respective material may include silicon, silicon germanium, or the like, which is doped with a p-type dopant such as boron, indium, or the like. The epitaxial source/drain regions 42P may be in-situ doped, and may be, or may not be, implanted with a p-type dopant.

Figure 26A:
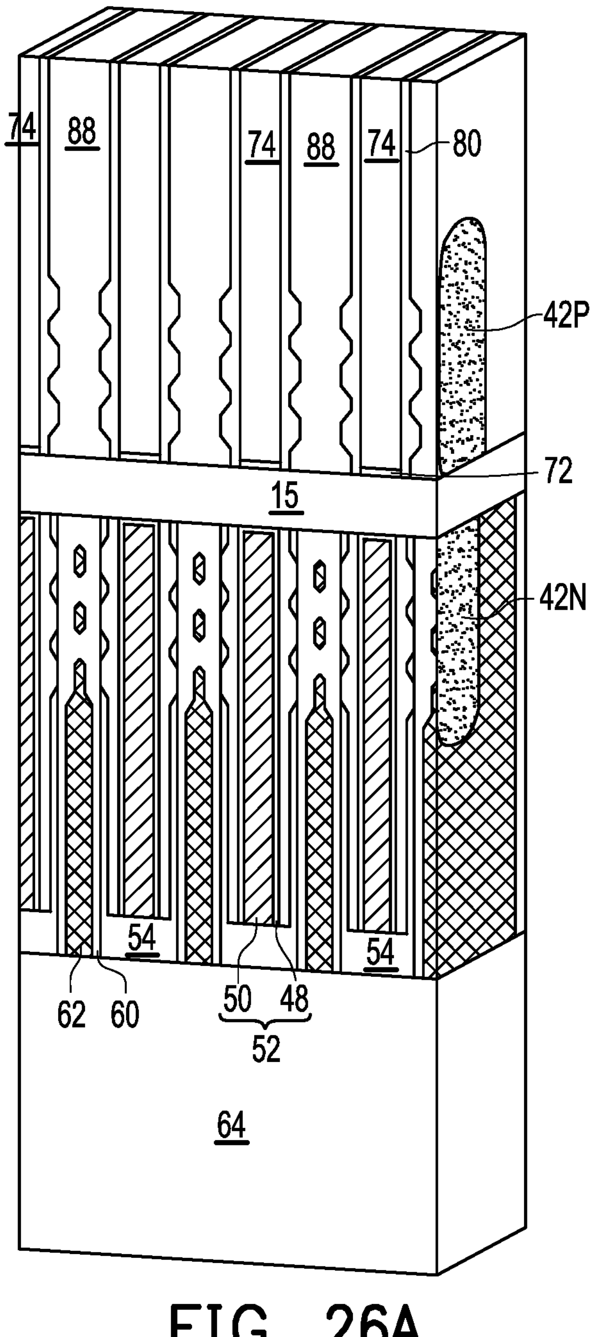
Figures 26B, 26C:
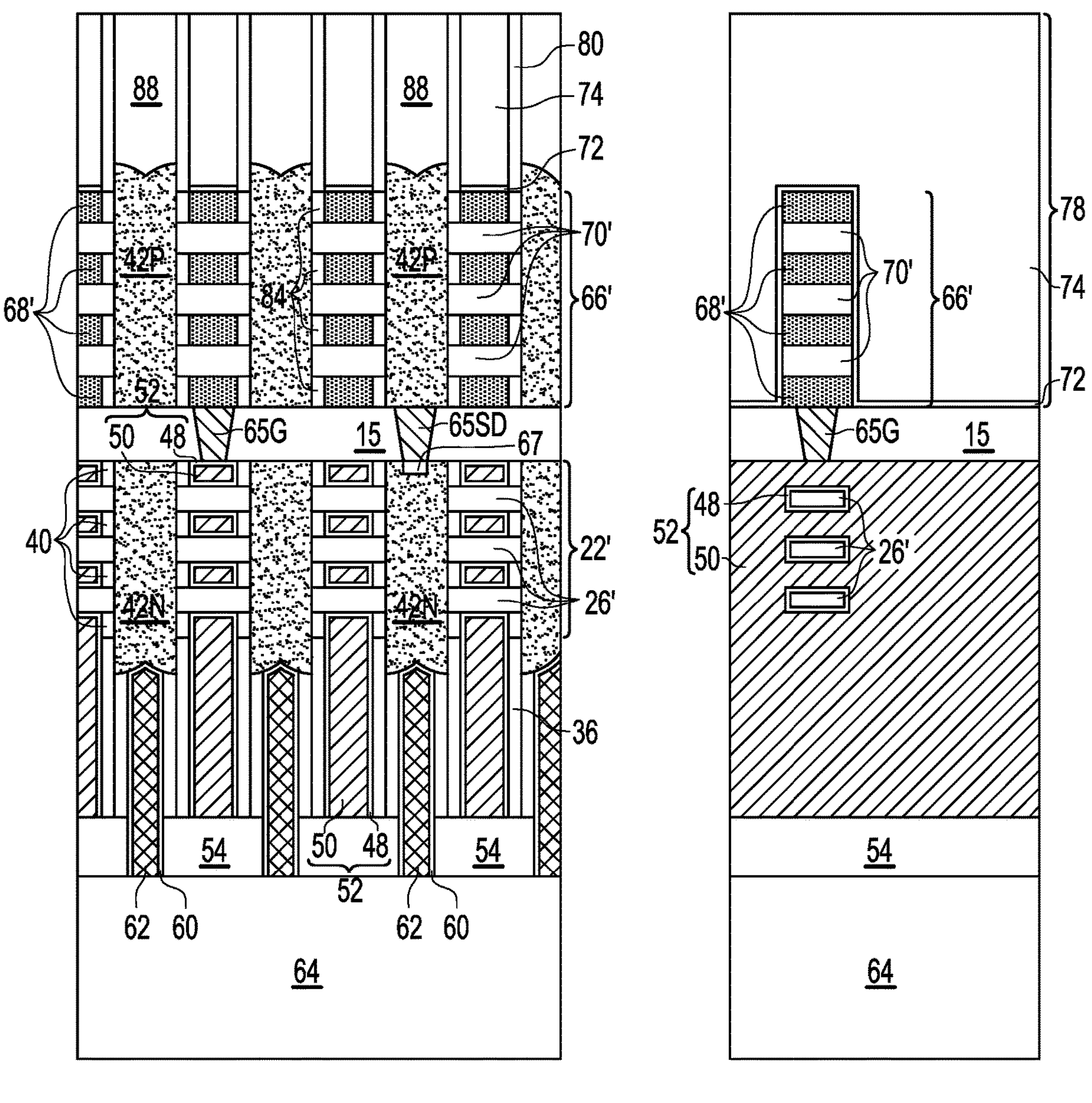

In FIGS. 26A, 26B, and 26C, (sacrificial) regions 88 are formed over source/drain regions 42P. The respective process is illustrated as process 246 in the process flow 200 as shown in FIG. 42. A planarization process is performed to level the top surfaces of sacrificial regions 88 with the top surfaces of dummy gate electrodes 74.

Figure 27A:
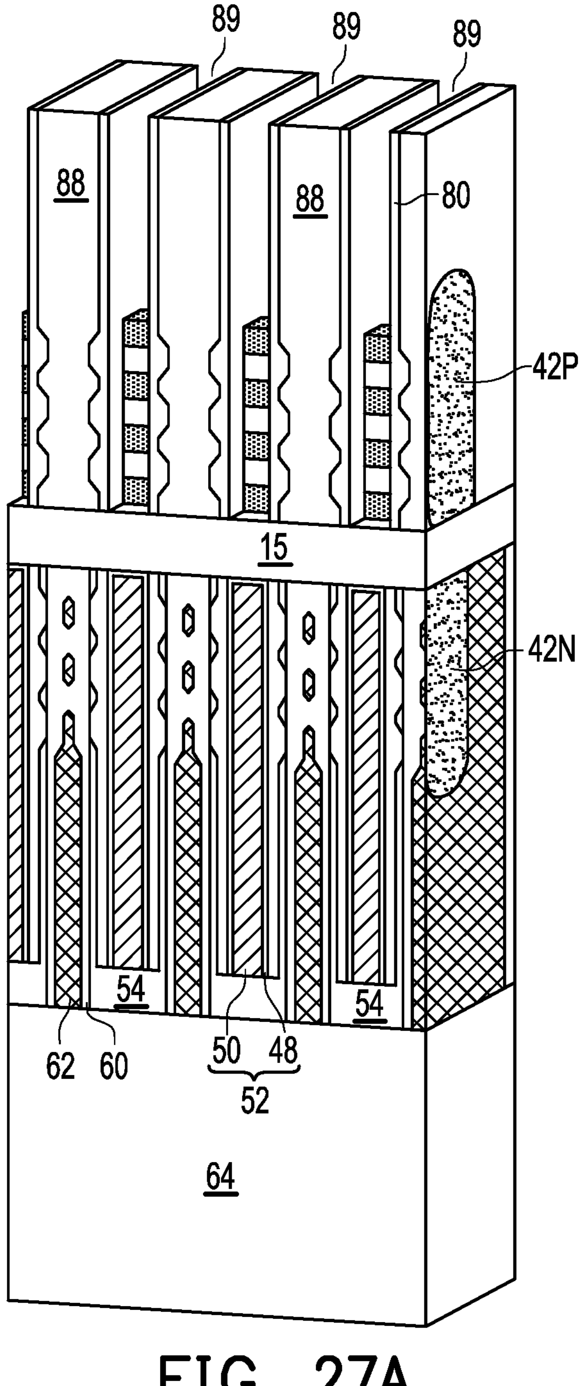
Figures 27B, 27C:
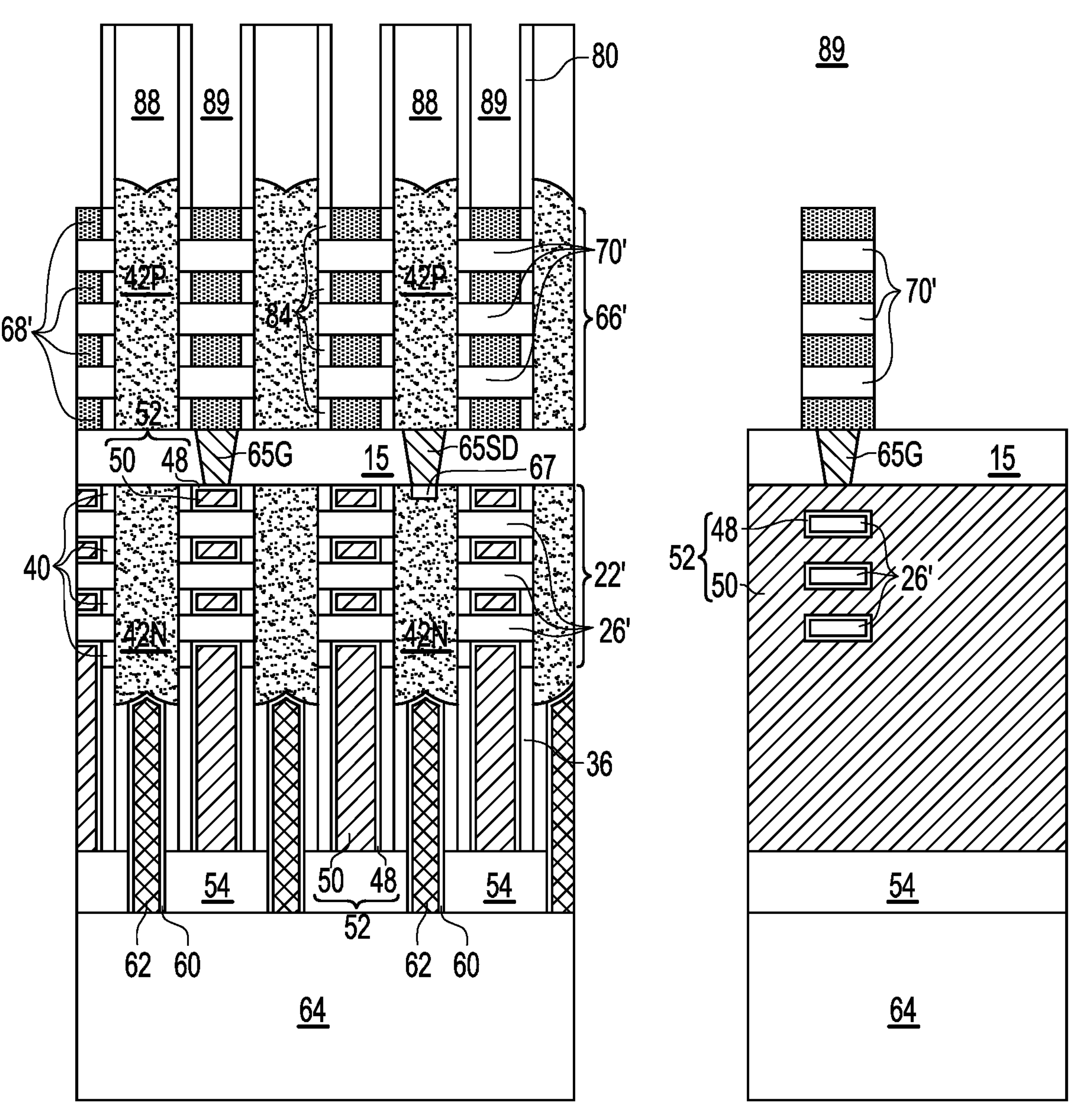

The dummy gate stacks 78 are then removed in one or more etching processes, so that recesses 89 are formed, as shown in FIGS. 27A, 27B, and 27C. The respective process is illustrated as process 248 in the process flow 200 as shown in FIG. 42. Each of recesses 89 exposes and/or overlies portions of multi-layer stacks 66'.

Figure 28A:
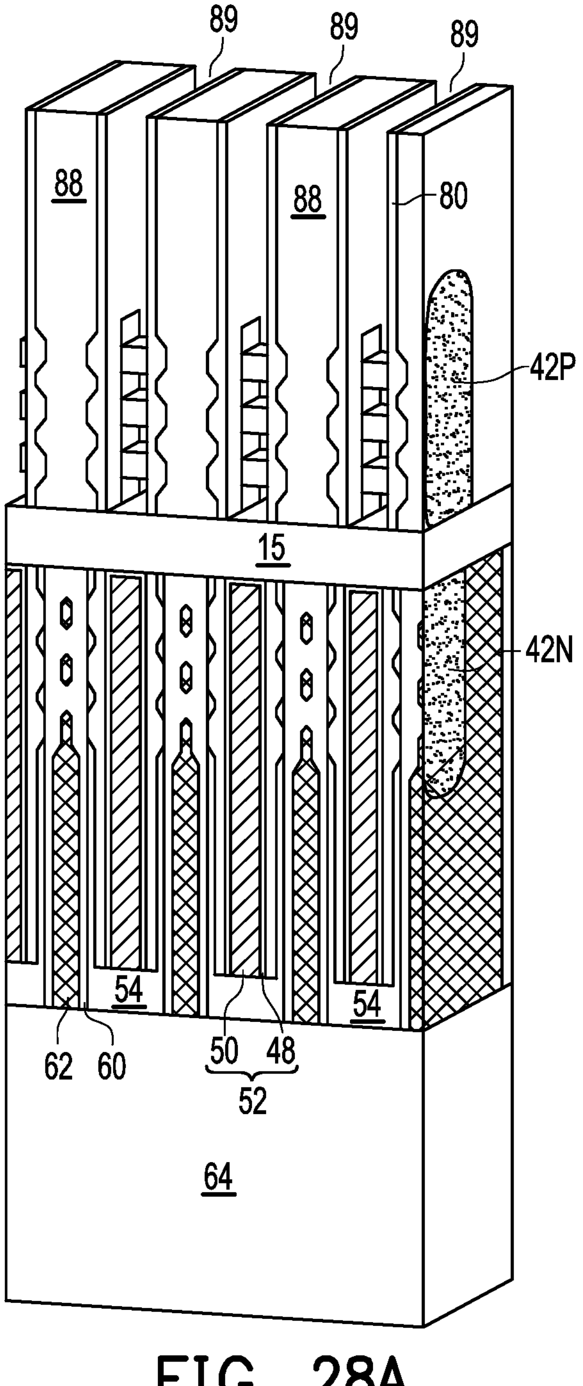
Figures 28B, 28C:
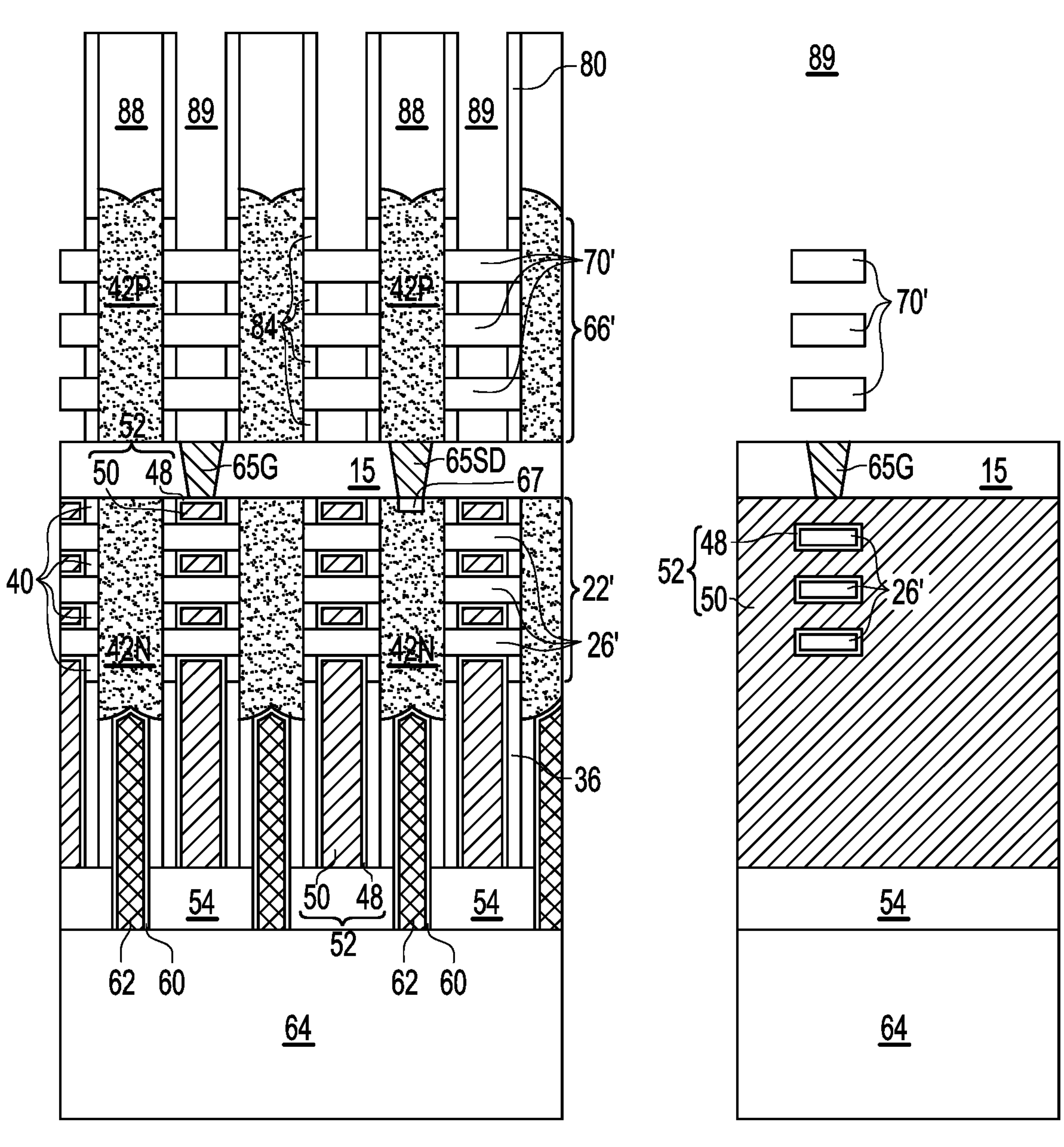

The remaining portions of the dummy nanostructures 68' are then removed through etching, so that recesses 89 extend between the semiconductor nanostructures 70'. The resulting structure is shown in FIGS. 28A, 28B, and 28C. In the etching process, the dummy nanostructures 68' may be etched at a faster rate than the semiconductor nanostructures 70', and inner spacers 84 are not etched. The etching may be isotropic.

Figure 29A:
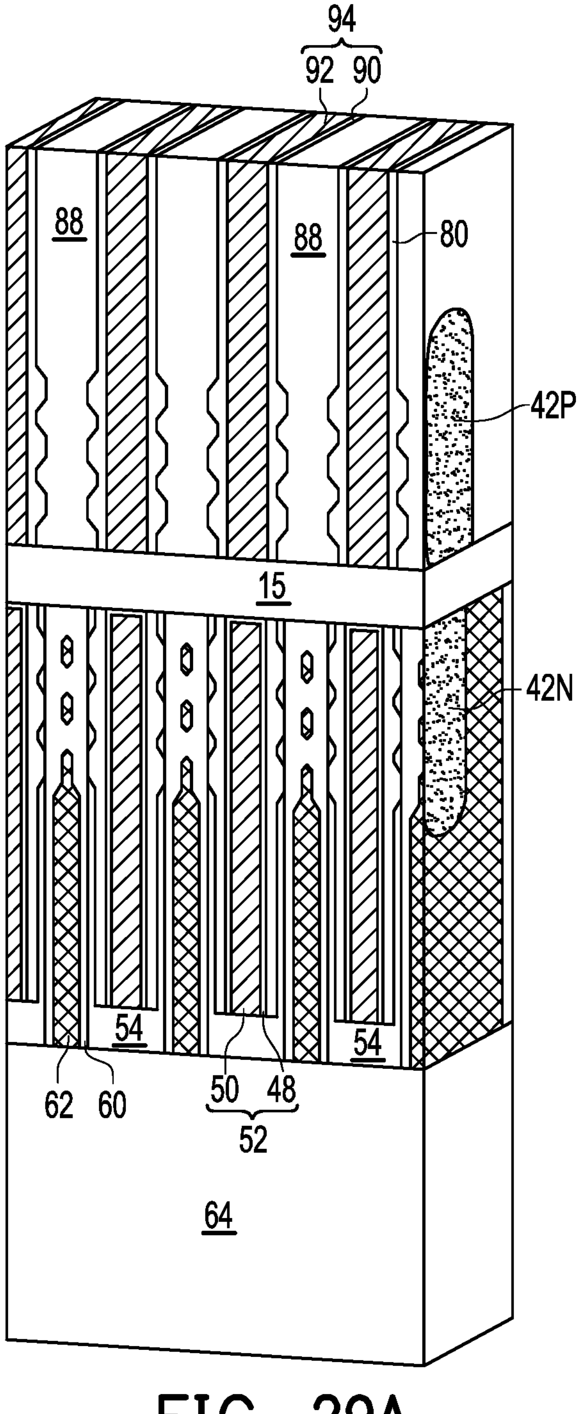
Figures 29B, 29C:
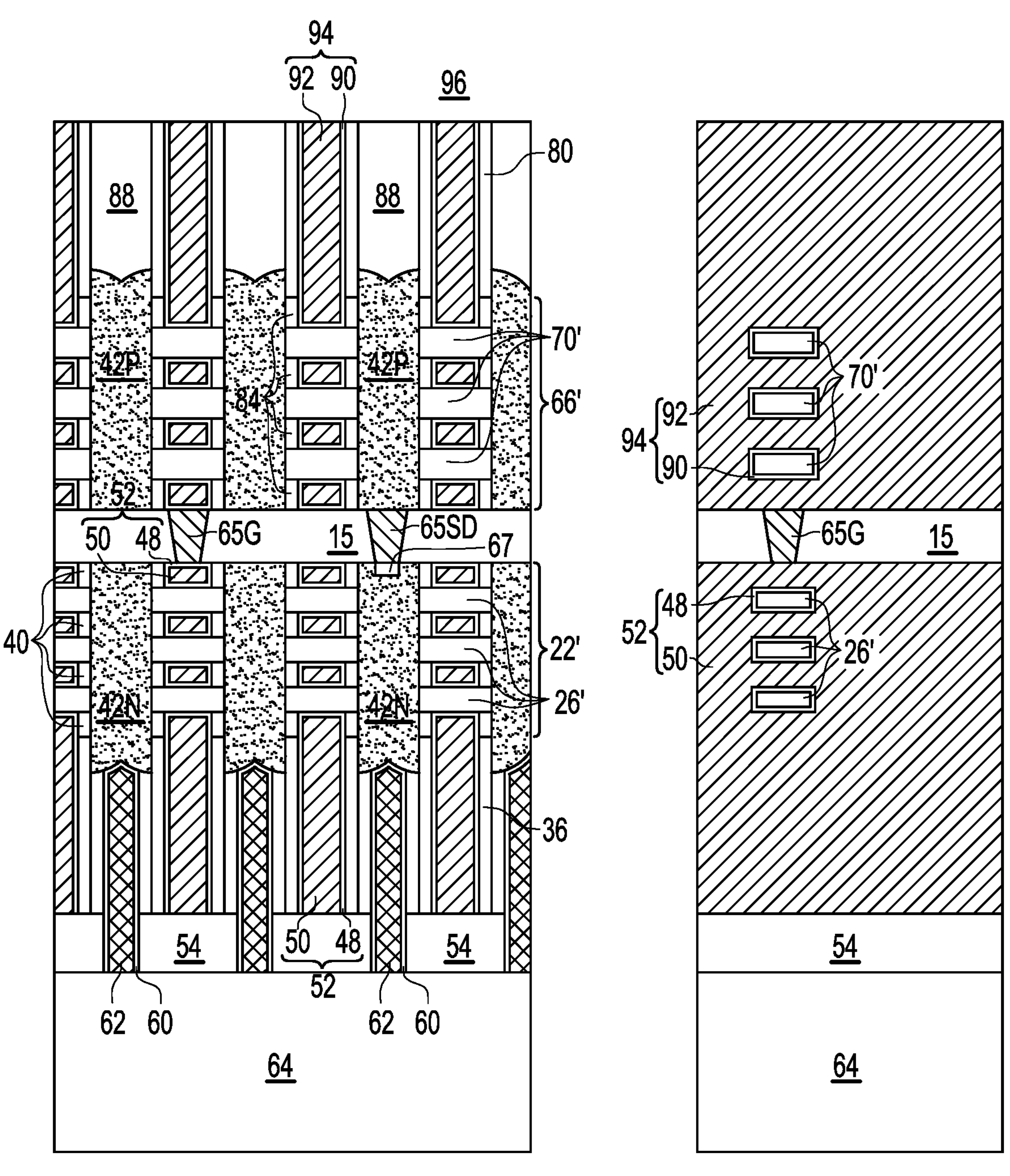

In FIGS. 29A, 29B, and 29C, replacement gate stacks 94 are formed in recesses 89, and include portions between upper semiconductor nanostructures 70' and the respective lower semiconductor nanostructures 70'. The respective process is illustrated as process 250 in the process flow 200 as shown in FIG. 42. Gate stacks 94 include gate dielectrics 90, and replacement gate electrodes 92 on gate dielectrics 90. Gate dielectrics 90 may include interfacial layers and high-k dielectric layers over the respective interfacial layers. The interfacial layers may include silicon oxide. The high-k dielectric layers may include hafnium oxide, zirconium oxide, lanthanum oxide, and/or the like. Gate electrodes 92 may include work function layers comprising TiN, TiSiN, TaN, and/or the like, and may or may not include filling metals formed of cobalt, tungsten, and/or the like. Accordingly, gate electrodes 92 are also referred to as metal gates 92.

Figure 30A:
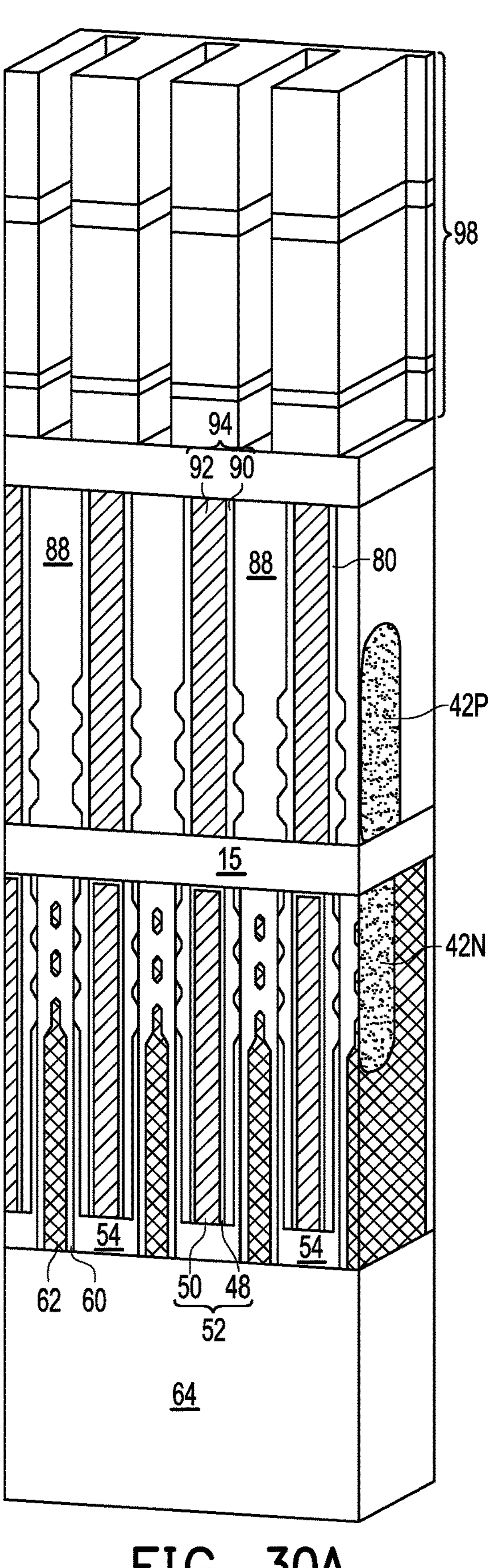
Figures 30B, 30C:
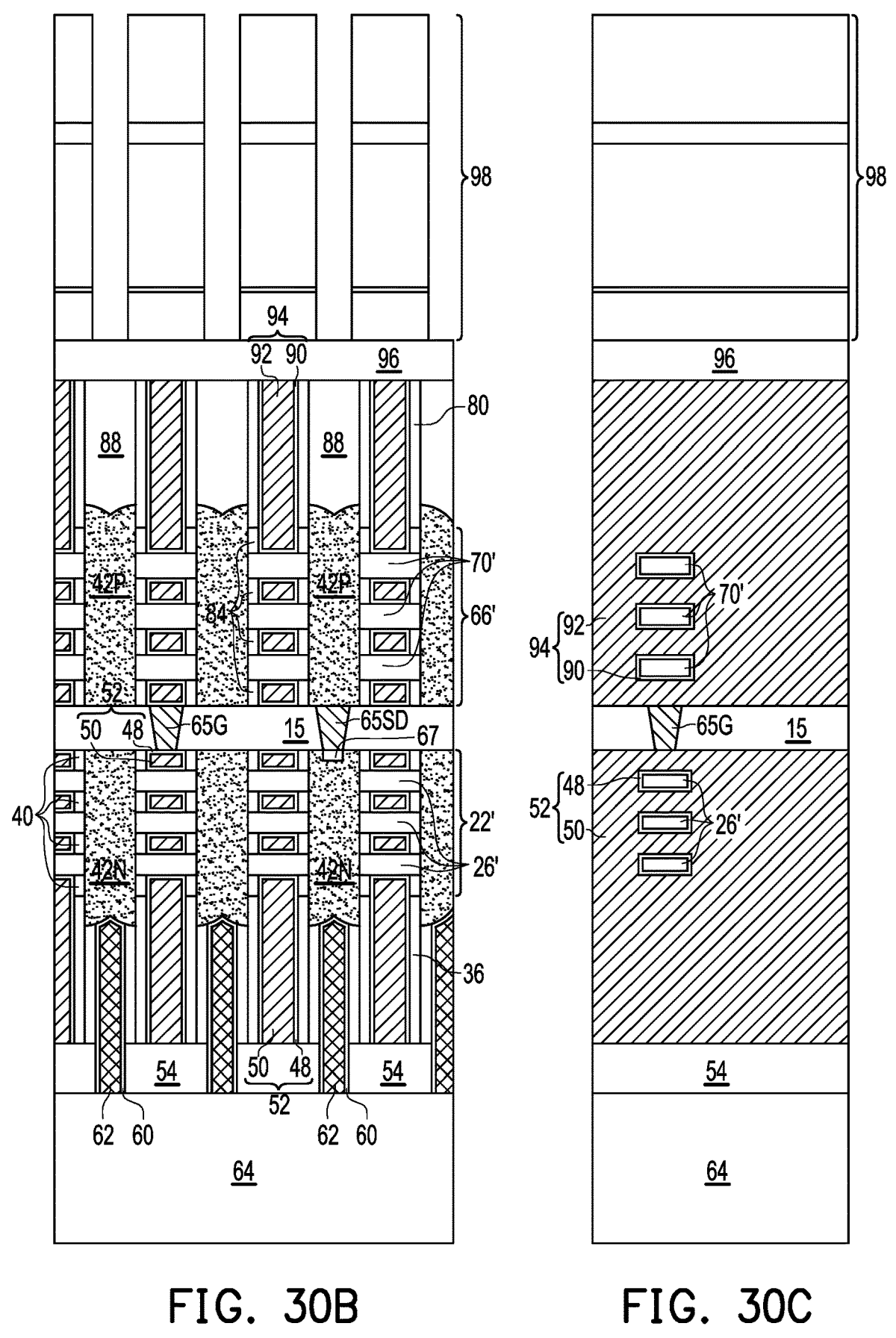

FIGS. 30A, 30B, and 30C illustrate the formation of dielectric layer 96, which comprises a dielectric material such as silicon oxide, silicon carbide, silicon oxynitride, silicon oxycarbide, or the like, or the combinations thereof. The respective process is illustrated as process 252 in the process flow 200 as shown in FIG. 42. The formation may include CVD, PECVD, ALD, or the like. Next, a patterned etching mask 98 is formed. The patterned etching mask 98 may include a photoresist, and may be a single layer etching mask, a tri-layer etching mask, or the like. There may also be (or may not be) a hard mask underlying the photoresist. The hard mask may be formed of or comprise TiN, CoN, SiN, or the like.

Figure 31A:
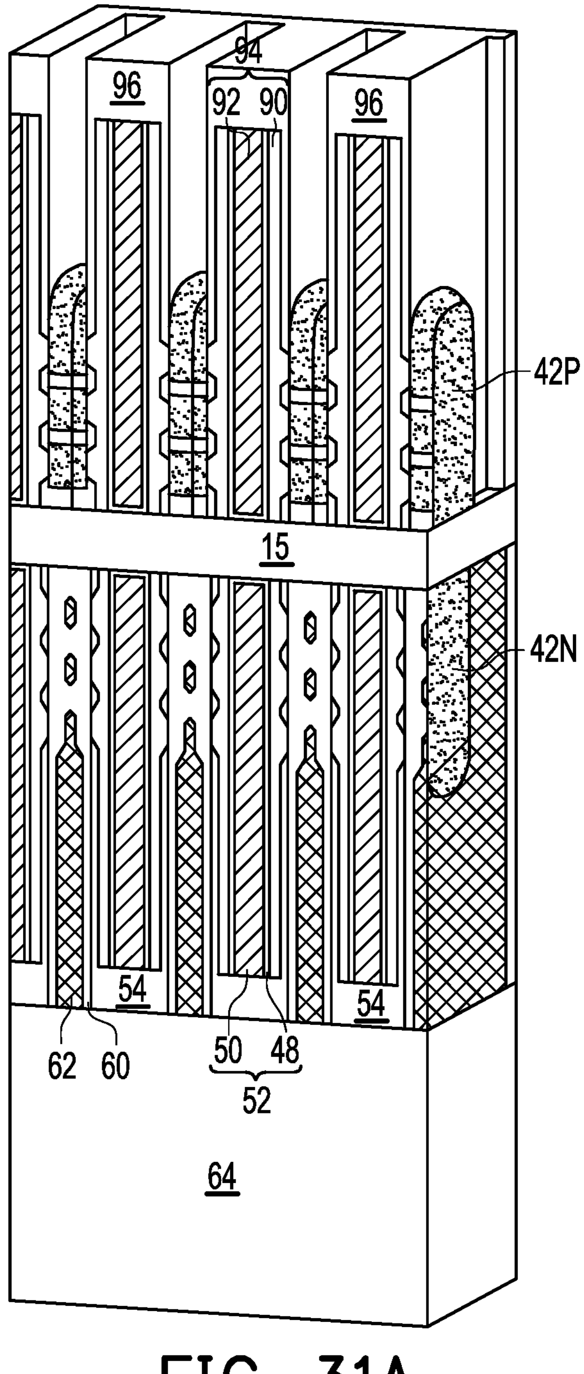
Figures 31B, 31C:
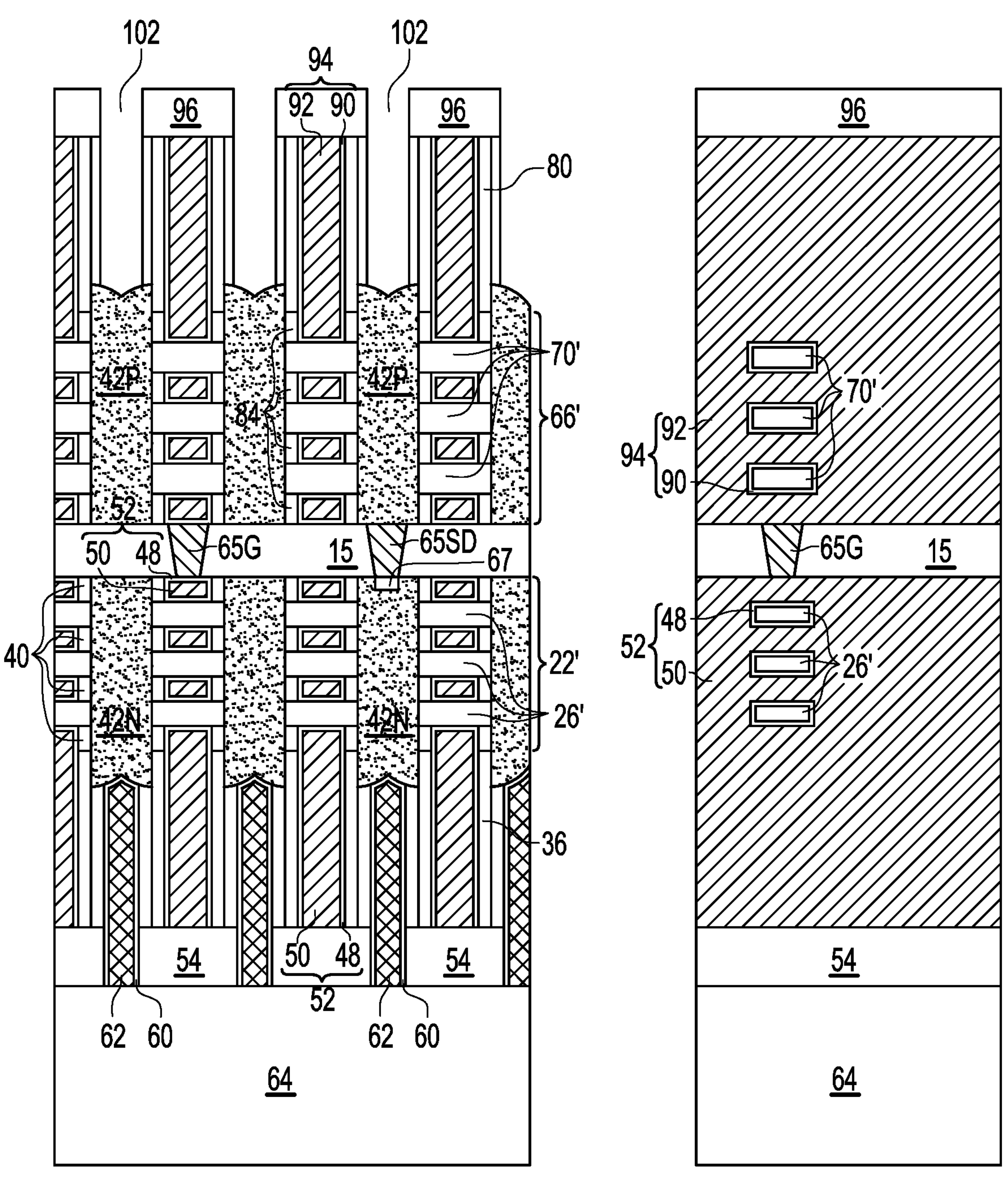

Referring to FIGS. 31A, 31B, and 31C, dielectric layer 96 is etched using the patterned etching mask 98 to define patterns. The sacrificial regions 88 are then removed through etching using etching mask 98, forming openings 102. The respective process is illustrated as process 254 in the process flow 200 as shown in FIG. 42. Accordingly, epitaxial source/drain regions 42P are exposed to openings 102. The remaining portions of the patterned etching mask 98 are then removed.

Figure 32A:
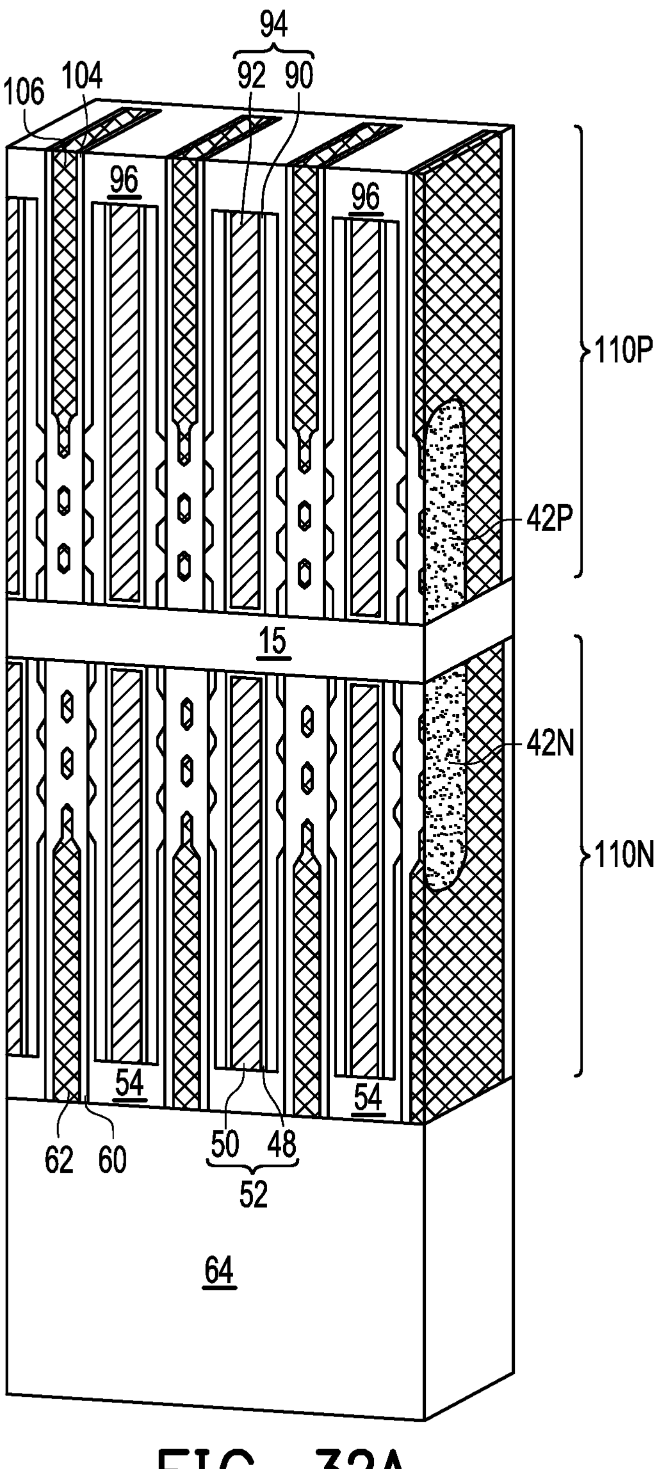
Figures 32B, 32C:
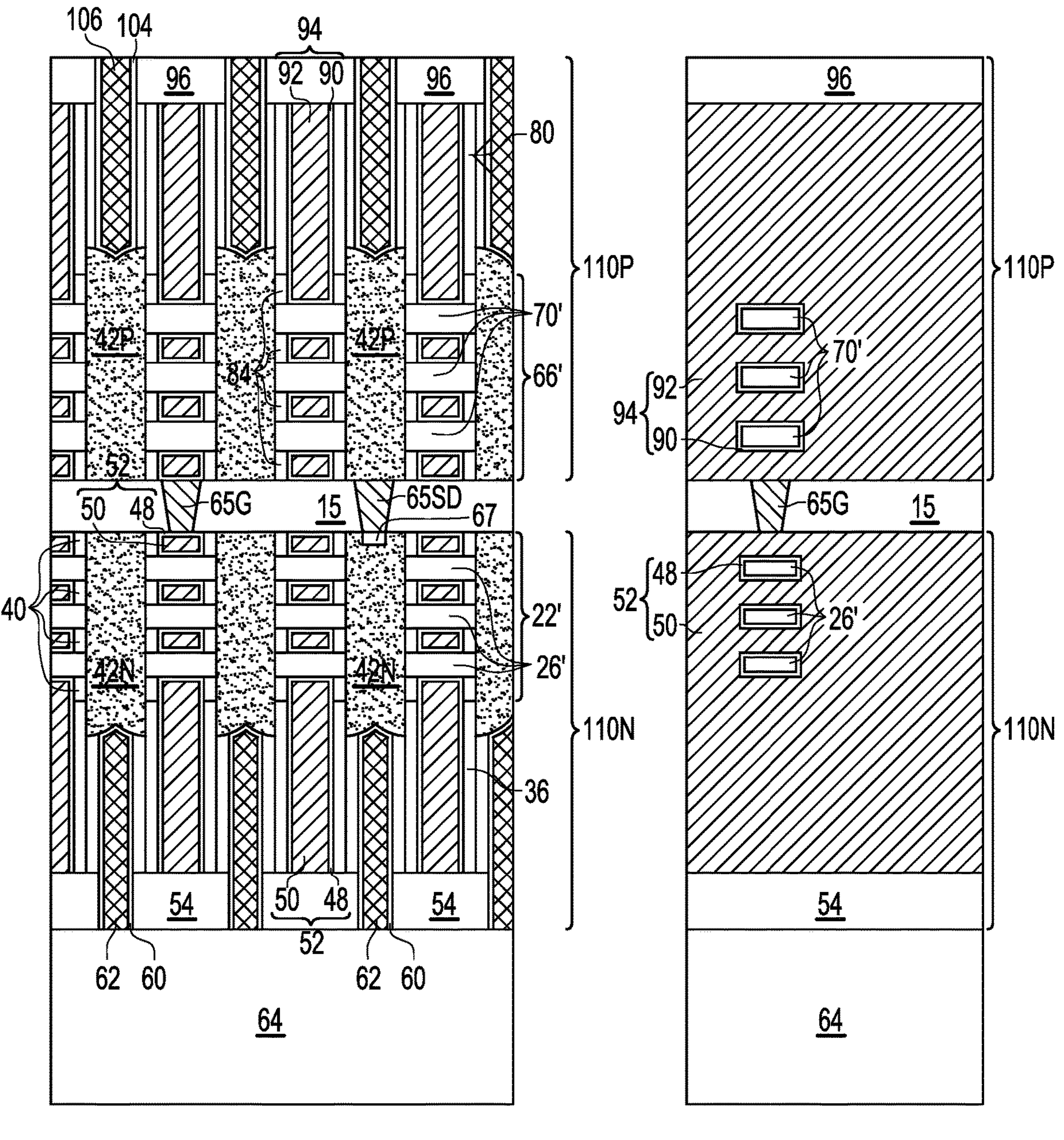

Referring to FIGS. 32A, 32B, and 32C, CESL 104 and ILD 106 are formed. The respective process is illustrated as process 256 in the process flow 200 as shown in FIG. 42. The CESL 104 may be formed of or comprise silicon nitride, silicon oxide, silicon oxynitride, or the like, which may be formed by using suitable deposition process such as CVD, ALD, or the like. The ILD 106 may be formed of a dielectric material such as PSG, BSG, BPSG, USG, silicon oxide, or the like.

NFET 110N and PFET 110P are thus formed. NFET 110N includes nanostructures 26' as channels, while PFET 110P includes nanostructures 70' as channels. Channels 26' and channels 70' are formed of different materials. For example, Channels 26' may be formed of silicon or SiGe with a low germanium atomic percentage, while channel 70' may be formed of germanium or SiGe with a high germanium atomic percentage.

Figure 33A:
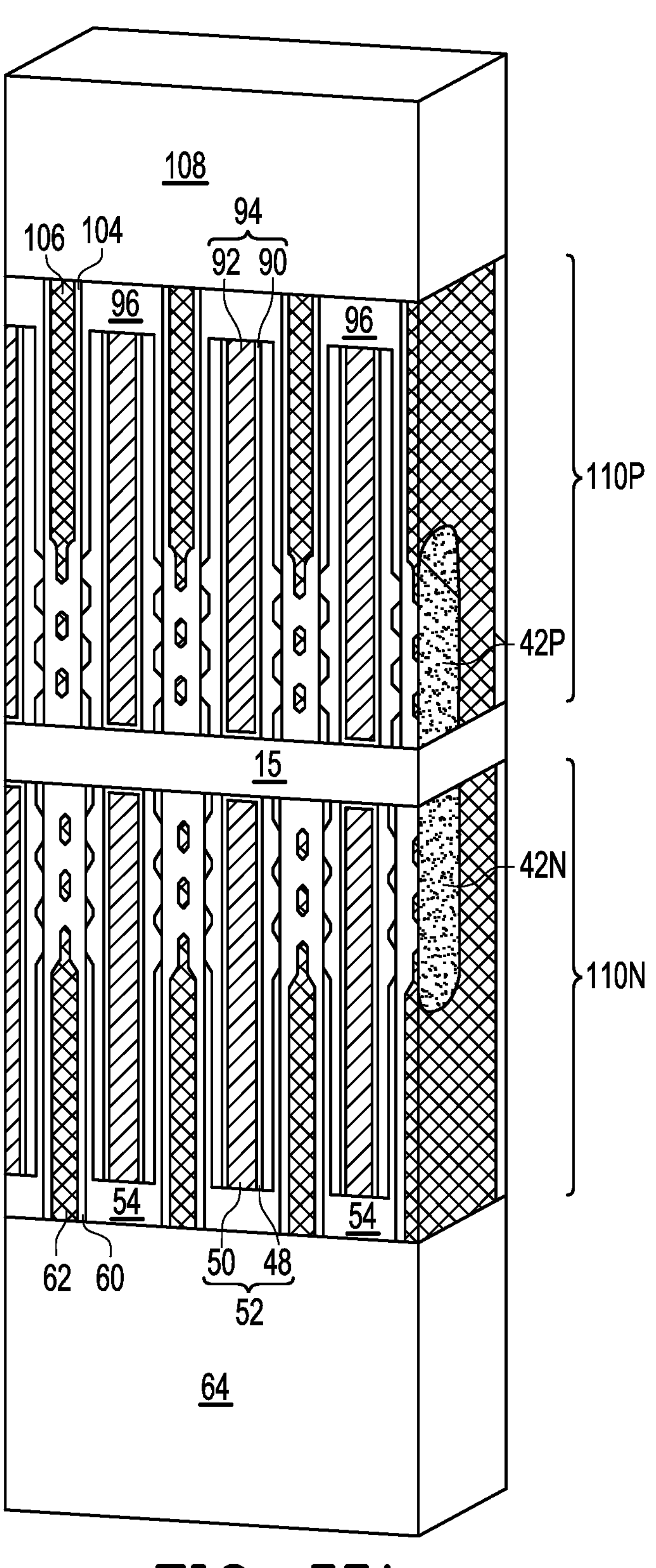
Figures 33B, 33C:
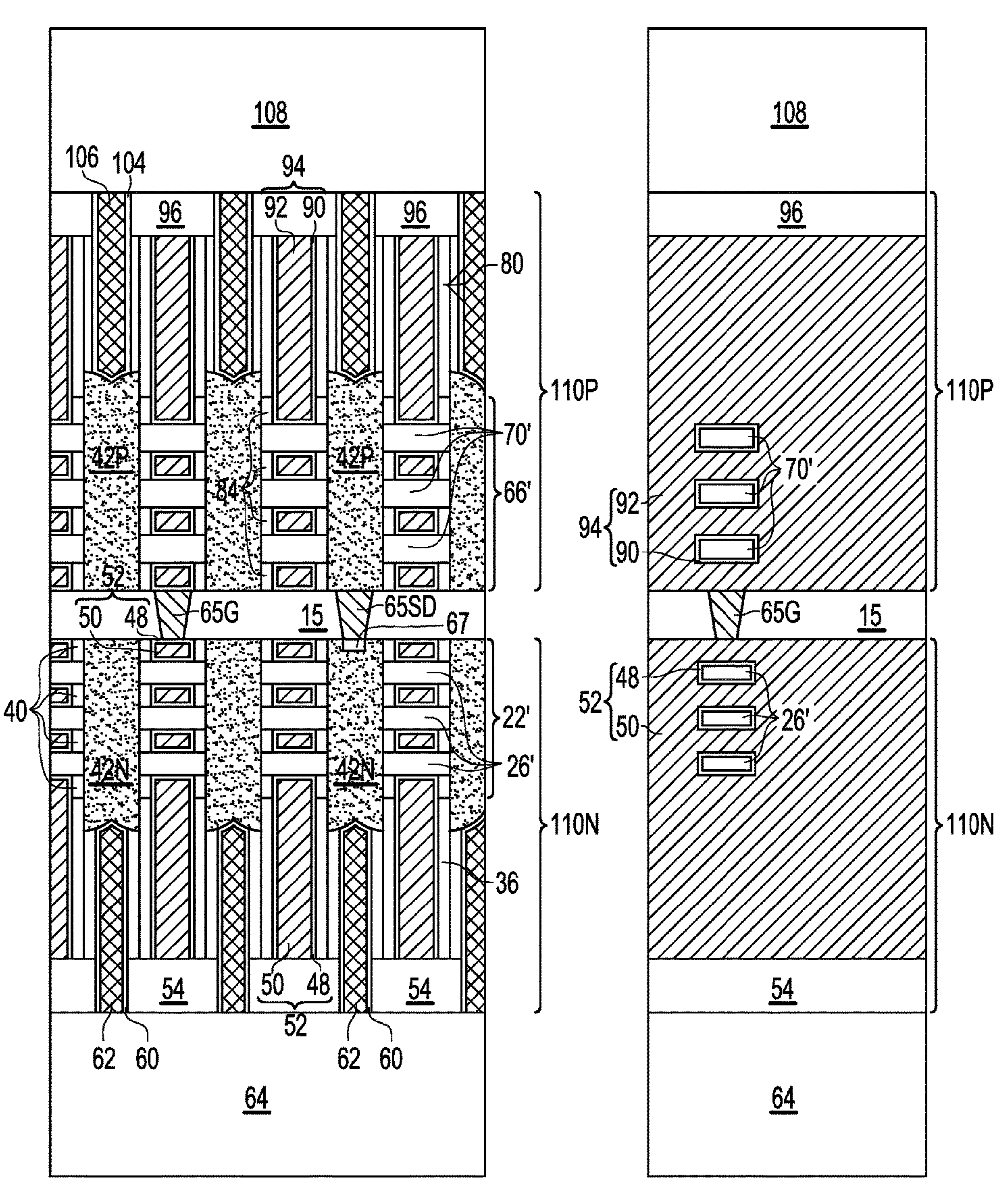

Referring to FIGS. 33A, 33B, and 33C, front-side interconnect structure 108 is formed. The respective process is illustrated as process 258 in the process flow 200 as shown in FIG. 42. The front-side interconnect structure 108 includes dielectric layers and layers of conductive features in the dielectric layers. The dielectric layers may include low-k dielectric layers formed of low-k dielectric materials. The dielectric layers may further include passivation layers, which are formed of non-low-k and dense dielectric materials such as USG, silicon oxide, silicon nitride, or the like, or combinations thereof over the low-k dielectric materials. The dielectric layers may also include polymer layers.

The conductive features in the front-side interconnect structure 108 may include conductive lines and vias, which may be formed using damascene processes. The conductive features may include diffusion barriers and a copper containing material over the diffusion barriers. There may also be aluminum pads over and electrically connected to the metal lines and vias. Depending on how the respective die is to be packaged, the top surface features among the conductive features may include bond pads, metal pillars, solder regions, and/or the like.

FIGS. 34 through 37 illustrate a process flow for attaching bottom semiconductor layer 68B (FIGS. 19A, 19B, and 19C) to structure 100 in accordance with some embodiments, which semiconductor layer 68B is used for epitaxially growing the upper dummy semiconductor layers 68 and semiconductor layers 70 as shown in FIGS. 19B and 19C. FIG. 34 schematically illustrates the structure 100 as shown in FIGS. 18A, 18B, and 18C, wherein the details of structure 100 including NFET 110N are not illustrated in detail. The top layer may be silicon-containing dielectric layer 15A, which may be formed of $SiO_2$, SiN, SiC, SiOC, SiOCN, SiON, or the like.

Wafer 120 is provided. In accordance with some embodiments, wafer 120 includes substrate 122, and SiGe layer 68B on substrate 122. Substrate 122 may be a silicon substrate. In accordance with some embodiments, a hydrogen implantation process is performed to implant hydrogen to an intermediate level in substrate 122 and to form hydrogen implanted layer 126. In accordance with alternative embodiments, no hydrogen implantation process is performed. Silicon-containing dielectric layer 15B is formed on SiGe layer 68, for example, through a deposition process. Silicon-containing dielectric layer 15B may be formed of $SiO_2$, SiN, SiC, SiOC, SiOCN, SiON, or the like. The material of silicon-containing dielectric layer 15B may be the same as or different from the material of silicon-containing dielectric layers 15A.

FIGS. 35 and 36 illustrate the flip bonding of wafers 100 and 120. Silicon-containing dielectric layer 15B is bonded to silicon-containing dielectric layer 15A through fusion bonding. Silicon-containing dielectric layers 15A and 15B are collectively referred to as silicon-containing dielectric layer 15. The bonded structure is shown in FIG. 36.

Next, a cut process is performed, so that the top portion of the substrate 122 is separated from the bottom portion at hydrogen implanted layer 126. A CMP process or a mechanical grinding process is then performed to remove the remaining portion of substrate 122, so that SiGe layer 68B is exposed. In accordance with alternative embodiments in which hydrogen implantation process is not performed, the entire thick substrate 122 is thinned through the CMP or the mechanical grinding process to reveal SiGe layer 68B. In subsequent processes, alternating semiconductor layers 70 and dummy semiconductor layers 68 are epitaxially grown on bottom SiGe layer 68B, forming the structure shown in FIGS. 19A, 19B, and 19C. The process may then be continued to form the PFETs.

Figure 38:
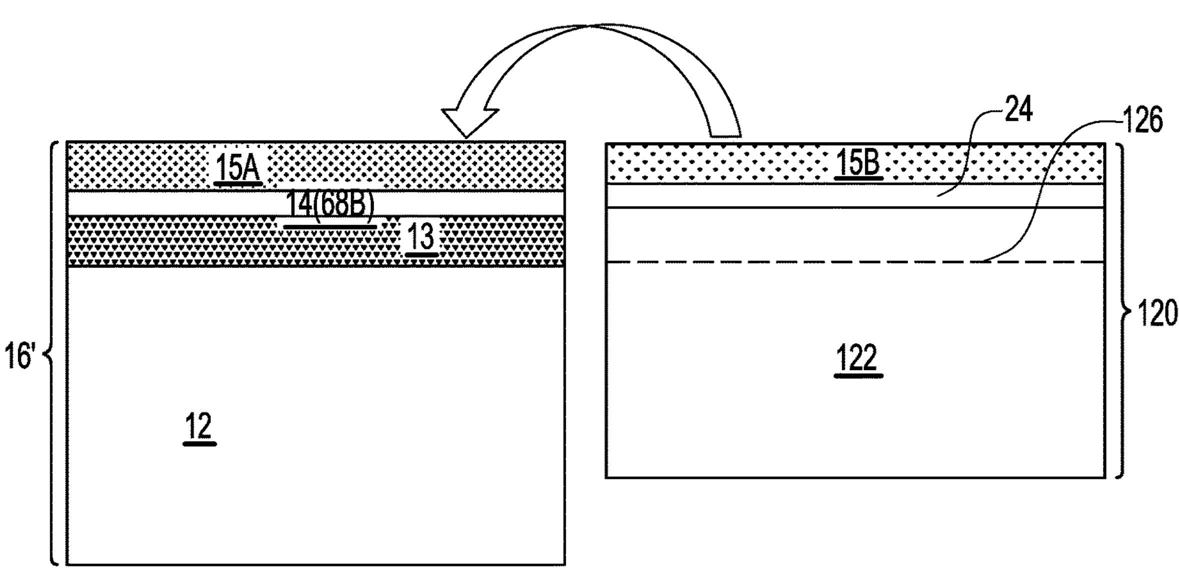
FIGS. 38 through 41 illustrate the cross-sectional views of a wafer bonding process used for forming CFETs in accordance with some embodiments.

FIGS. 38 through 41 illustrate the process for forming the initial substrate 16 as shown in FIGS. 1A, 1B, and 1C, which includes silicon-containing dielectric layer 13 and SiGe layer 14 (which is also layer 68B). Referring to FIG. 38, wafer 16' is formed, which includes substrate 12, silicon-containing dielectric layer 13, and SiGe layer 14. Silicon-containing dielectric layer 15A is deposited over SiGe layer 14 through a deposition process.

Figure 39:
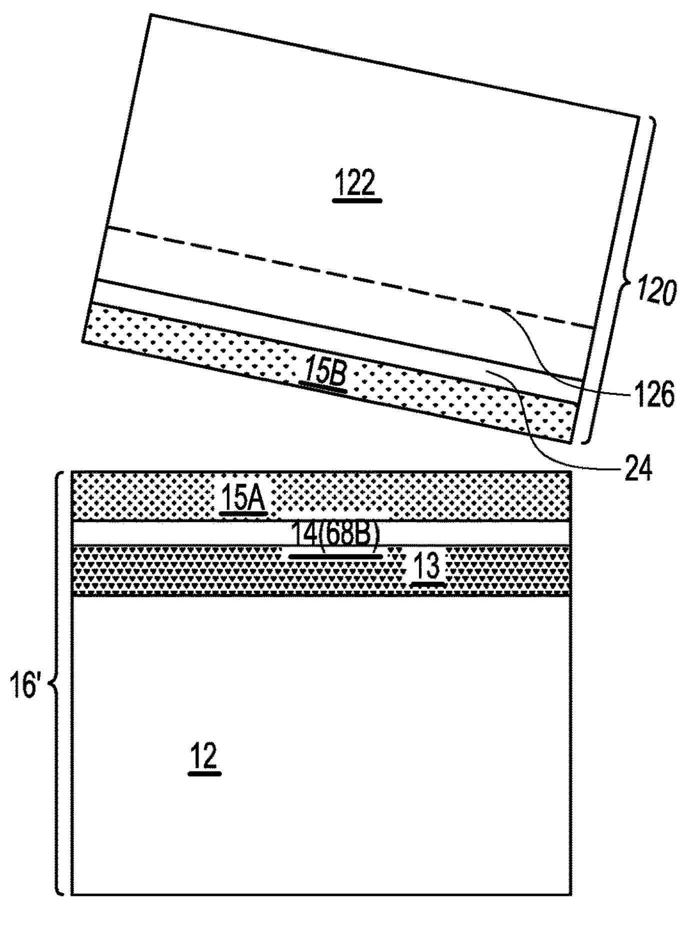
Figure 40:
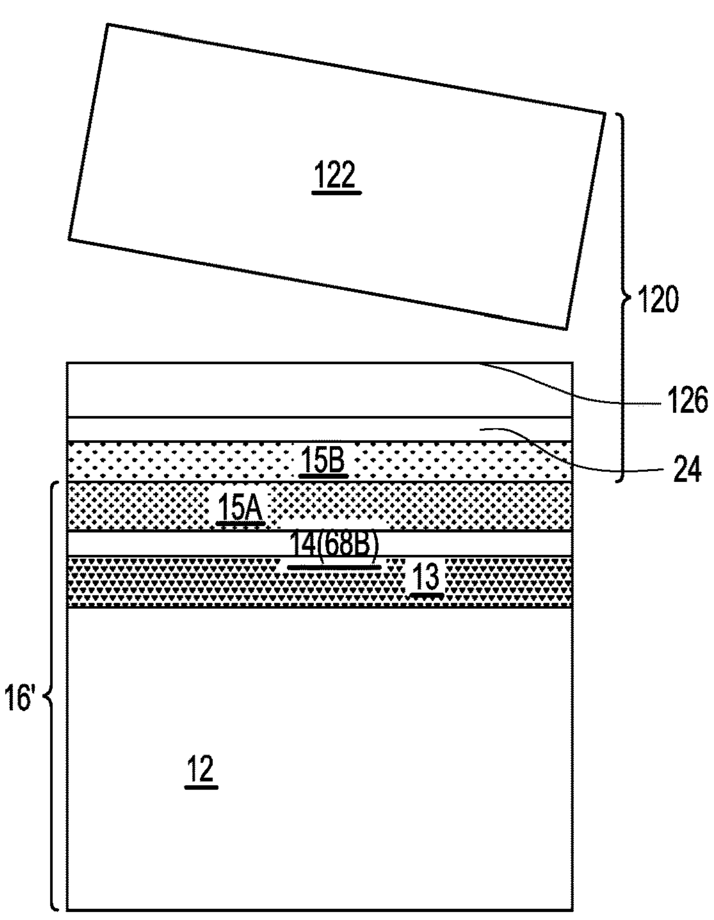

Wafer 120 is also formed, and may include substrate 122, SiGe layer 24, and silicon-containing dielectric layer 15B. Hydrogen implanted layer 126 may be, or may not be formed. Next, as shown in FIGS. 39 and 40, wafer 120 is bonded to wafer 16', with silicon-containing dielectric layers 15A and 15B bonded together to form silicon-containing dielectric layer 15. The material of silicon-containing dielectric layer 15A may be the same as or different from the material of silicon-containing dielectric layer 15B.

Figure 41:
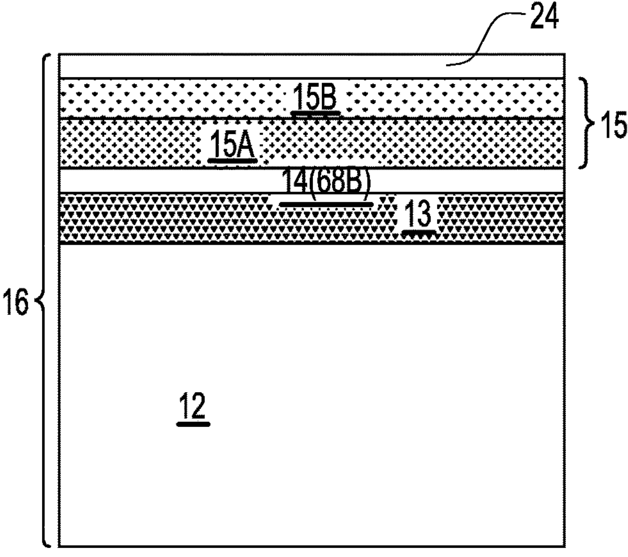

FIG. 40 illustrates the removal of a portion of wafer 120 over hydrogen implanted layer 126, for example, by separating the top portion of the substrate 122 from the bottom portion of substrate 122. Next, the portion of wafer 120 over SiGe layer 24 is removed through a thinning process, which may be performed through CMP or mechanical grinding. The resulting structure is shown in FIG. 41. The resulting structure is wafer/substrate 16, which may be the wafer/substrate 16 in FIGS. 1A, 1B, and 1C, on which NFFTs and PFET can be formed. Advantageously, since dummy semiconductor layer 68B has already been formed in the structure 100, when forming the structure shown in FIGS. 19A, 19B, 19C, the wafer 16 as shown in FIGS. 17A, 17B, and 17C is polished to remove the substrate 12 (FIG. 41) and silicon-containing dielectric layer 13, so that dummy semiconductor layer 68B is revealed. The process may then proceed to FIGS. 19A, 19B, and 19C to finish the formation of the NFET.

Referring back to FIGS. 33A, 33B, and 33C, NFET 110 and PFET 110P are formed back-to-back, with dielectric layer 15 separating them from each other. The source/drain regions 42 and the gate electrode 50 of NFET 110N may be in physical contact with dielectric layer 15. The source/drain regions 86 and the gate electrode 92 of PFET 110P may be in physical contact with dielectric layer 15.

In accordance with some embodiments, gate vias 65G may be formed to electrically connect gate electrode 50 to gate electrode 92. Source/drain vias 65SD may be formed to electrically connect source/drain regions 42N to source/drain regions 42P. In accordance with alternative embodiments, no gate vias and source/drain vias are formed, and the connection between NFET 110N and PFET 110P may be made by forming metal lines and vias in interconnect structure 64 and 108, and forming deep vias to connect the metal pads in the interconnect structure 64 to the metal pads in the interconnect structure 108.

The embodiments of the present disclosure have some advantageous features. By adopting different channel materials, the PFET and NFET in the CFET may have optimized performance. For example, germanium is a good material for forming the channels of PFETs since it has high hole mobility, and also allows for very low contact resistance. Adopting Si to form the channels of NFETs may also maximize the performance of NFETs.

In accordance with some embodiments of the present disclosure, a method comprises forming a CFET comprising forming an n-type transistor comprising forming a first channel region comprising a first semiconductor material; and forming an n-type source/drain region on a side of, and connecting to, the first channel region; and forming a p-type transistor overlapping the n-type transistor, the forming the p-type transistor comprising forming a second channel region comprising a second semiconductor material different from the first semiconductor material; and forming a p-type source/drain region on a side of, and connecting to, the second channel region.

In an embodiment, the forming the first channel region comprises depositing a silicon layer and a first silicon germanium layer contacting the silicon layer; removing the first silicon germanium layer, with the silicon layer being left as the first channel region, wherein the forming the second channel region comprises depositing a germanium layer and a second silicon germanium layer contacting the germanium layer; and removing the second silicon germanium layer, with the germanium layer being left as the second channel region. In an embodiment, the forming the second channel region is performed after both of the first channel region and the n-type source/drain region are formed. In an embodiment, the forming the second channel region is performed before both of the first channel region and the n-type source/drain region are formed.

In an embodiment, the method further comprises forming a first interconnect structure connecting to the n-type transistor; and forming a second interconnect structure connecting to the p-type transistor, wherein the first interconnect structure and the second interconnect structure are on opposite sides of the CFET. In an embodiment, the n-type transistor is formed on a dielectric layer, and wherein the p-type transistor is formed on an opposite side of the dielectric layer than the n-type transistor. In an embodiment, the n-type source/drain region and the p-type source/drain region are in contact with the dielectric layer.

In an embodiment, the method further comprises a source/drain via in the dielectric layer, wherein the source/drain via electrically connects the n-type source/drain region to the p-type source/drain region. In an embodiment, the n-type transistor comprises a first gate electrode contacting the dielectric layer, and the p-type transistor comprises a second gate electrode contacting the dielectric layer. In an embodiment, the method further comprises forming a gate via in the dielectric layer, wherein the gate via electrically connects the first gate electrode to the second gate electrode.

In accordance with some embodiments of the present disclosure, a device comprises a dielectric layer; an n-type transistor under the dielectric layer, the n-type transistor comprising a first channel region comprising a first semiconductor material; and an n-type source/drain region on a side of and connecting to the first channel region; and a p-type transistor over the dielectric layer, the p-type transistor comprising a second channel region comprising a second semiconductor material different from the first semiconductor material; and a p-type source/drain region on a side of and connecting to the second channel region. In an embodiment, the second channel region has a higher germanium atomic percentage than the first channel region. In an embodiment, the first channel region comprises silicon and is free from germanium, and the second channel region comprises germanium and is free from silicon.

In an embodiment, both of the n-type source/drain region and the p-type source/drain region are in contact with the dielectric layer. In an embodiment, the device further comprises a source/drain via in the dielectric layer, wherein the source/drain via electrically connects the n-type source/drain region to the p-type source/drain region. In an embodiment, the n-type transistor comprises a first gate electrode contacting the dielectric layer, and the p-type transistor comprises a second gate electrode contacting the dielectric layer. In an embodiment, the device further comprises a gate via in the dielectric layer, wherein the gate via electrically connects the first gate electrode to the second gate electrode.

In accordance with some embodiments of the present disclosure, a device comprises a first transistor comprising a silicon channel; a first gate stack encircling the silicon channel; a dielectric layer over and physically contacting the first gate stack; and a second transistor overlapping both of the dielectric layer and the first transistor, the second transistor comprising a germanium channel; and a second gate stack encircling the germanium channel, wherein the second gate stack further contacts the dielectric layer. In an embodiment, the device further comprises a gate via comprising a top surface contacting the first gate stack, and a bottom surface contacting the second gate stack. In an embodiment, the first transistor is an n-type transistor, and the second transistor is a p-type transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a Complimentary Field-Effect Transistor (CFET) comprising:

forming an n-type transistor comprising:

forming a first channel region comprising a first semiconductor material, wherein the forming the first channel region comprises:

depositing a silicon layer and a first silicon germanium layer contacting the silicon layer;

removing the first silicon germanium layer, with the silicon layer being left as the first channel region; and forming an n-type source/drain region on a side of, and connecting to, the first channel region; and forming a p-type transistor overlapping the n-type transistor, the forming the p-type transistor comprising:

forming a second channel region comprising a second semiconductor material different from the first semiconductor material, wherein the forming the second channel region comprises:

depositing a germanium layer and a second silicon germanium layer contacting the germanium layer; and removing the second silicon germanium layer, with the germanium layer being left as the second channel region; and forming a p-type source/drain region on a side of, and connecting to, the second channel region.

2. The method of claim 1, wherein the forming the second channel region is performed after both of the first channel region and the n-type source/drain region are formed.

3. The method of claim 1, wherein the forming the second channel region is performed before both of the first channel region and the n-type source/drain region are formed.

4. The method of claim 1 further comprising:

forming a first interconnect structure connecting to the n-type transistor; and forming a second interconnect structure connecting to the p-type transistor, wherein the first interconnect structure and the second interconnect structure are on opposite sides of the CFET.

5. The method of claim 1, wherein the n-type transistor is formed on a dielectric layer, and wherein the p-type transistor is formed on an opposite side of the dielectric layer than the n-type transistor.

6. The method of claim 5, wherein the n-type source/drain region and the p-type source/drain region are in contact with the dielectric layer.

7. The method of claim 6 further comprising a source/drain via in the dielectric layer, wherein the source/drain via electrically connects the n-type source/drain region to the p-type source/drain region.

8. The method of claim 5, wherein the n-type transistor comprises a first gate electrode contacting the dielectric layer, and the p-type transistor comprises a second gate electrode contacting the dielectric layer.

9. The method of claim 8 further comprising forming a gate via in the dielectric layer, wherein the gate via electrically connects the first gate electrode to the second gate electrode.

10. A device comprising:

a dielectric layer;

an n-type transistor under the dielectric layer, the n-type transistor comprising:

a first channel region comprising a first semiconductor material; and an n-type source/drain region on a side of and connecting to the first channel region; and a p-type transistor over the dielectric layer, the p-type transistor comprising:

a second channel region comprising a second semiconductor material different from the first semiconductor material; and a p-type source/drain region on a side of and connecting to the second channel region, wherein at least one of the n-type source/drain region and the p-type source/drain region are in contact with the dielectric layer.

11. The device of claim 10, wherein the second channel region has a higher germanium atomic percentage than the first channel region.

12. The device of claim 11, wherein the first channel region comprises silicon and is free from germanium, and the second channel region comprises germanium and is free from silicon.

13. The device of claim 10, wherein both of the n-type source/drain region and the p-type source/drain region are in contact with the dielectric layer.

14. The device of claim 13 further comprising a source/drain via in the dielectric layer, wherein the source/drain via electrically connects the n-type source/drain region to the p-type source/drain region.

15. The device of claim 10, wherein the n-type transistor comprises a first gate electrode contacting the dielectric layer, and the p-type transistor comprises a second gate electrode contacting the dielectric layer.

16. The device of claim 15 further comprising a gate via in the dielectric layer, wherein the gate via electrically connects the first gate electrode to the second gate electrode.

17. A device comprising:

a first transistor comprising:

a silicon channel;

a first gate stack encircling the silicon channel; and a first source/drain region on a side of and joined to the silicon channel;

a dielectric layer over and physically contacting the first gate stack; and a second transistor overlapping both of the dielectric layer and the first transistor, the second transistor comprising:

a germanium channel;

a second gate stack encircling the germanium channel, wherein the second gate stack further contacts the dielectric layer; and a second source/drain region on a side of and joined to the germanium channel, wherein one of the first source/drain region and the second source/drain region forms a first interface with the dielectric layer.

18. The device of claim 17 further comprising a gate via comprising a top surface contacting the first gate stack, and a bottom surface contacting the second gate stack.

19. The device of claim 17, wherein the first source/drain region forms the first interface with the dielectric layer, and the second source/drain region forms a second interface with the dielectric layer, and wherein the first interface is parallel to the second interface.

20. The device of claim 17 further comprising a source/drain via electrically coupling the first source/drain region to the second source/drain region, wherein the source/drain via comprises:

a first surface coplanar with a second surface of the dielectric layer; and a third surface coplanar with a fourth surface of the dielectric layer, wherein the first surface and the third surface are opposing surfaces of the source/drain via.

* * * * *